(12) United States Patent  (10) Patent No.: US 8,980,691 B2
Lin  (45) Date of Patent: Mar. 17, 2015

(54) SEMICONDUCTOR DEVICE AND METHOD OF FORMING LOW PROFILE 3D FAN-OUT PACKAGE

(71) Applicant: STATS ChipPAC, Ltd., Singapore (SG)

(72) Inventor: Yaojian Lin, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 13/931,397

(22) Filed: Jun. 28, 2013

(65) Prior Publication Data

US 2015/0001708 A1  Jan. 1, 2015

(51) Int. Cl.
  H01L 21/50 (2006.01)
  H01L 21/48 (2006.01)
  H01L 21/44 (2006.01)
  H01L 23/24 (2006.01)
  H01L 23/02 (2006.01)
  H01L 23/52 (2006.01)
  H01L 23/00 (2006.01)
  H01L 23/498 (2006.01)

(52) U.S. Cl.
  CPC .......... H01L 24/81 (2013.01); H01L 23/49811 (2013.01)
  USPC ........... 438/107; 438/666; 257/723; 257/686; 257/774

(58) Field of Classification Search
  USPC ............... 438/107, 666; 257/723, 686, 774
  See application file for complete search history.

(56) References Cited

U.S. PATENT DOCUMENTS

| | | | |
|---|---|---|---|
| 6,790,710 B2 * | 9/2004 | McLellan et al. | 438/122 |
| 6,798,049 B1 * | 9/2004 | Shin et al. | 257/678 |
| 7,274,095 B2 * | 9/2007 | Fee et al. | 257/680 |
| 7,653,991 B2 * | 2/2010 | Mok et al. | 29/847 |
| 7,838,337 B2 * | 11/2010 | Marimuthu et al. | 438/110 |
| 7,888,785 B2 * | 2/2011 | Ahn et al. | 257/686 |
| 8,116,066 B2 * | 2/2012 | Inoue | 361/321.4 |
| 8,158,888 B2 * | 4/2012 | Shen et al. | 174/260 |
| 8,304,878 B2 * | 11/2012 | Appelt | 257/686 |
| 8,320,134 B2 | 11/2012 | Su et al. | |
| 2004/0106229 A1 * | 6/2004 | Jiang et al. | 438/106 |
| 2008/0006942 A1 * | 1/2008 | Park et al. | 257/738 |
| 2011/0024899 A1 * | 2/2011 | Masumoto et al. | 257/737 |
| 2011/0156250 A1 | 6/2011 | Goh et al. | |
| 2011/0241193 A1 | 10/2011 | Ding et al. | |
| 2012/0126401 A1 * | 5/2012 | Lin et al. | 257/737 |
| 2013/0003319 A1 * | 1/2013 | Malatkar et al. | 361/746 |

* cited by examiner

Primary Examiner — Luan C Thai
(74) Attorney, Agent, or Firm — Robert D. Atkins; Atkins and Associates, P.C.

(57) ABSTRACT

A semiconductor device includes a substrate having an insulating layer and a conductive layer embedded in the insulating layer. The conductive layer is patterned to form conductive pads or conductive pillars. The substrate includes a first encapsulant formed over the conductive layer. A first opening is formed through insulating layer and first encapsulant using a stamping process or laser direct ablation. The substrate is separated into individual units, which are mounted to a carrier. A semiconductor die is disposed in the first opening in the substrate. A second encapsulant is deposited over the semiconductor die and substrate. An interconnect structure is formed over the semiconductor die and substrate. An opening is formed through the second encapsulant and through the insulating layer to expose the conductive layer. A bump is formed in the second opening over the conductive layer outside a footprint of the semiconductor die.

35 Claims, 41 Drawing Sheets

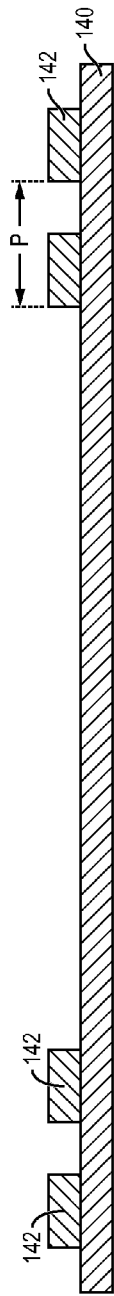
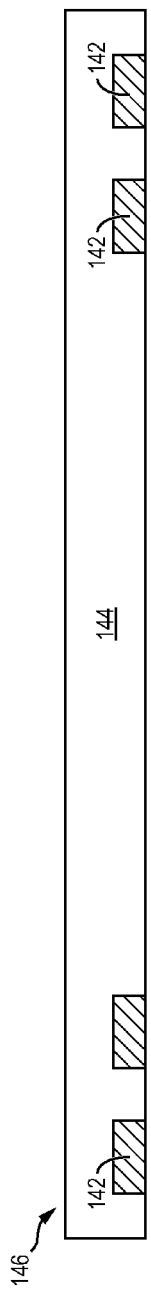
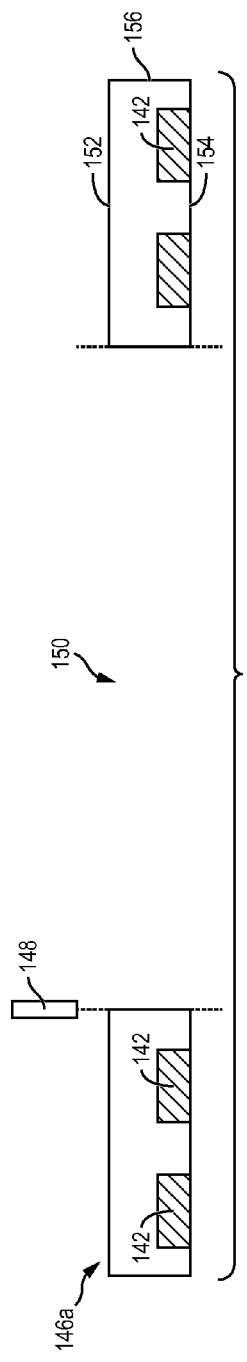

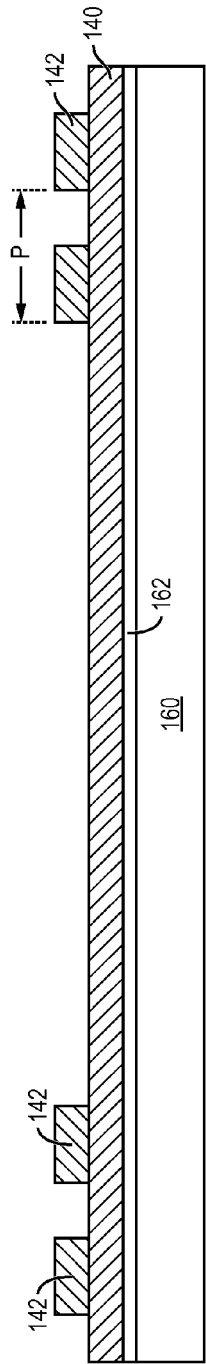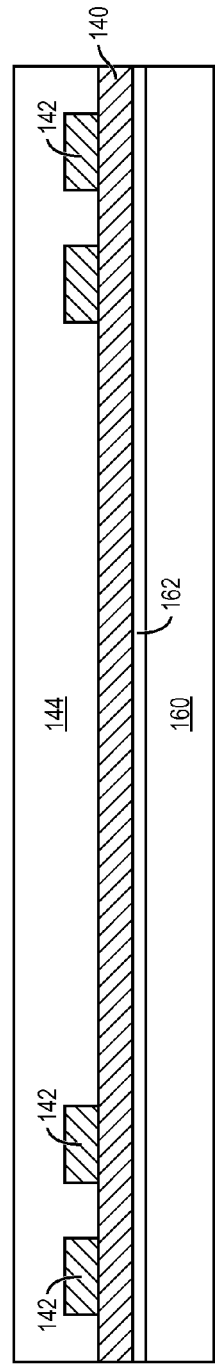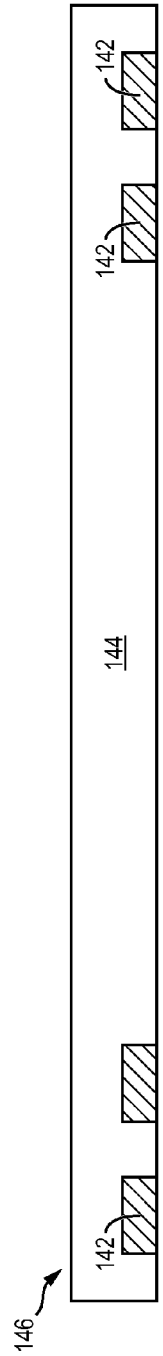

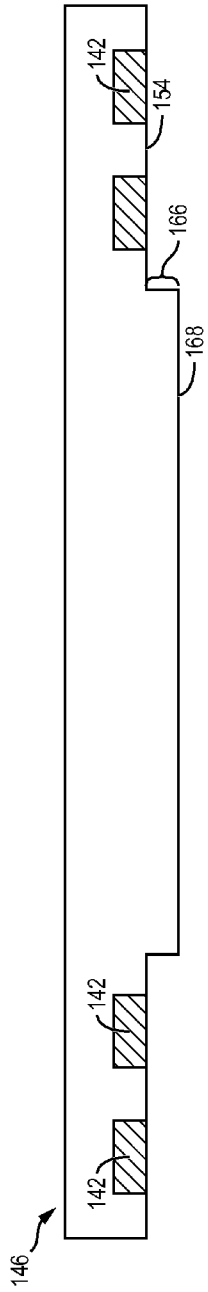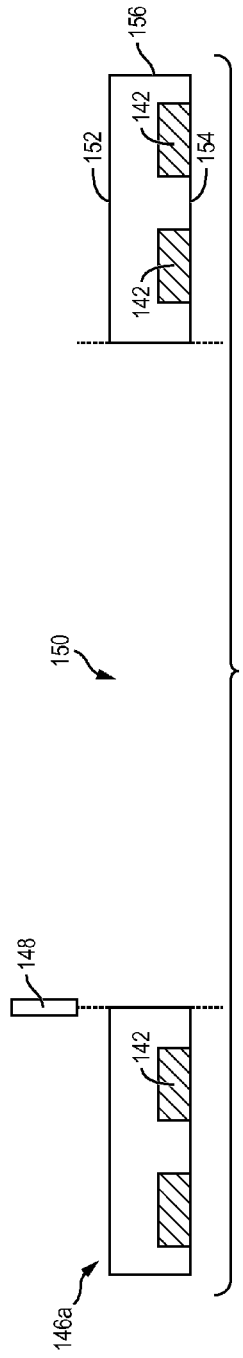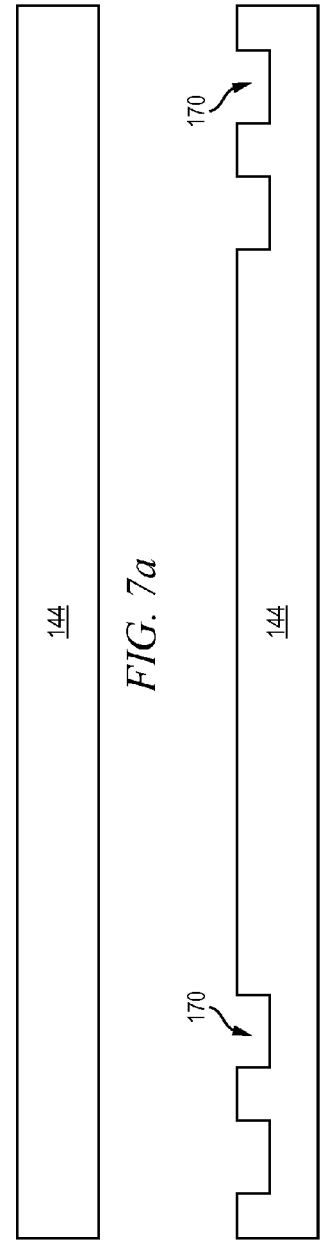

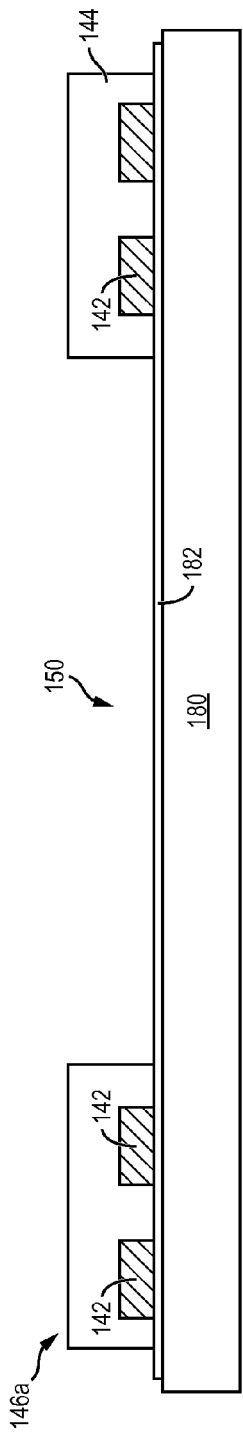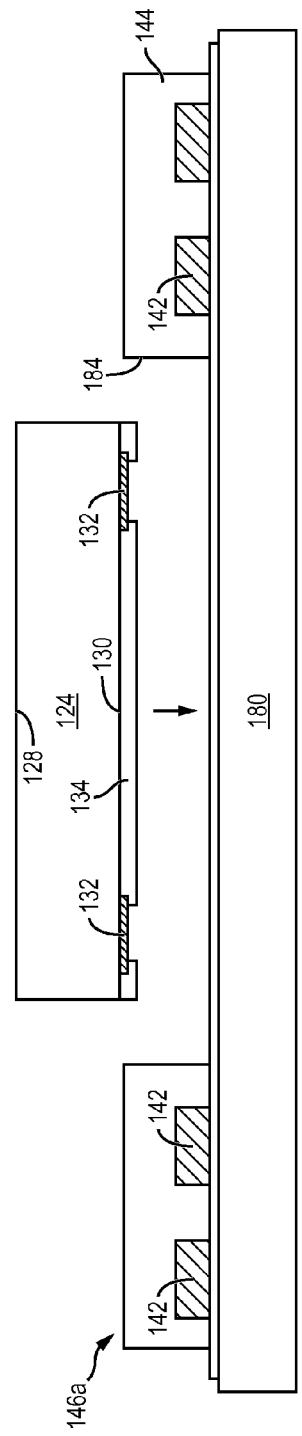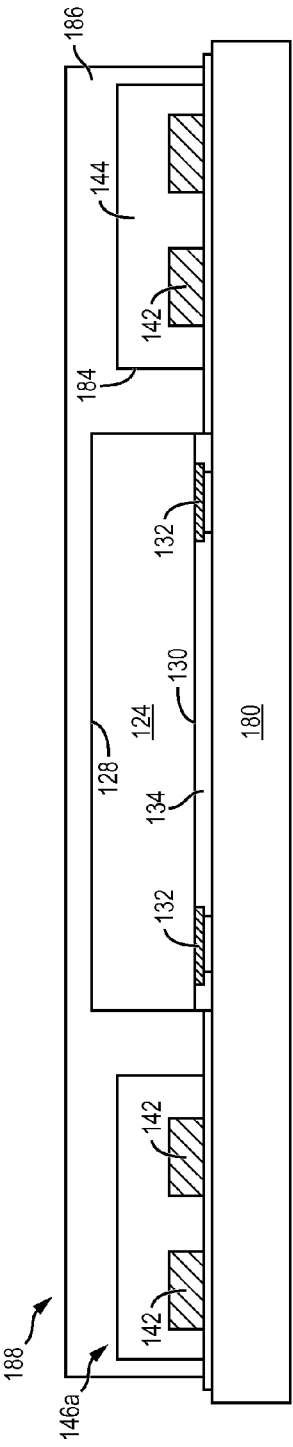

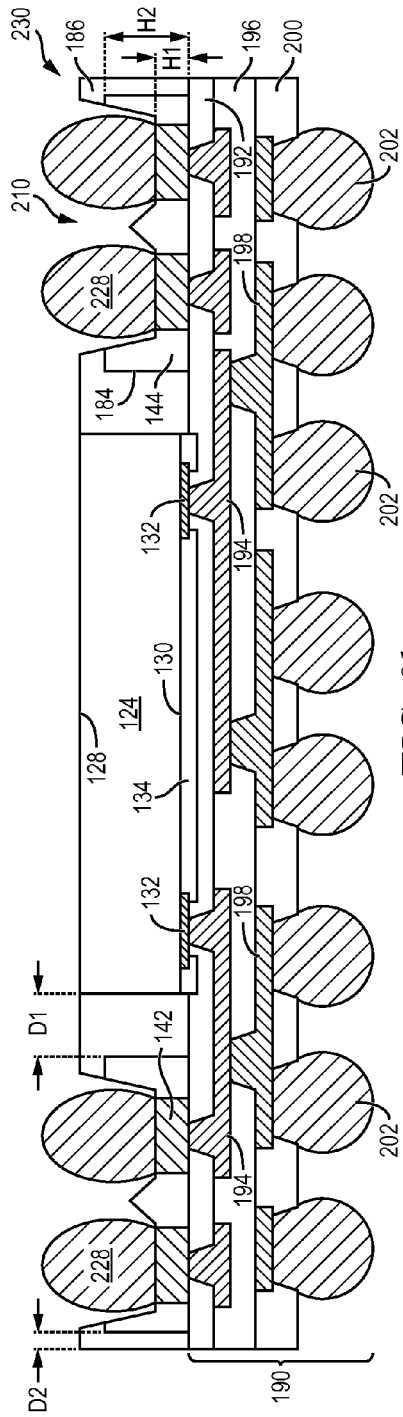
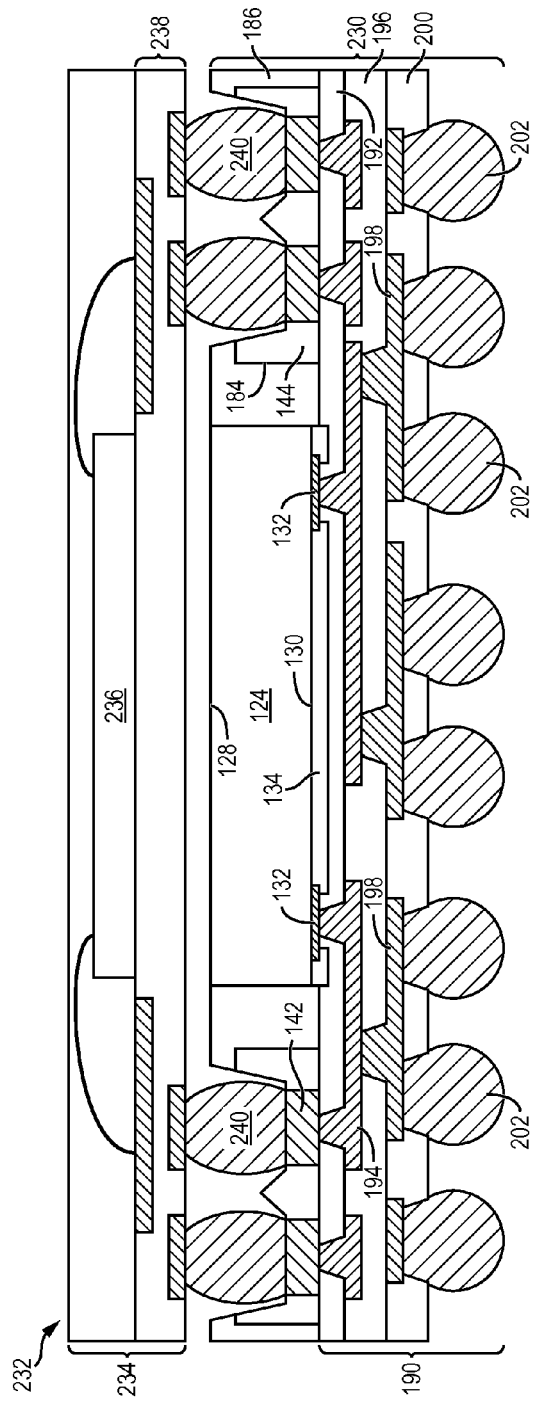

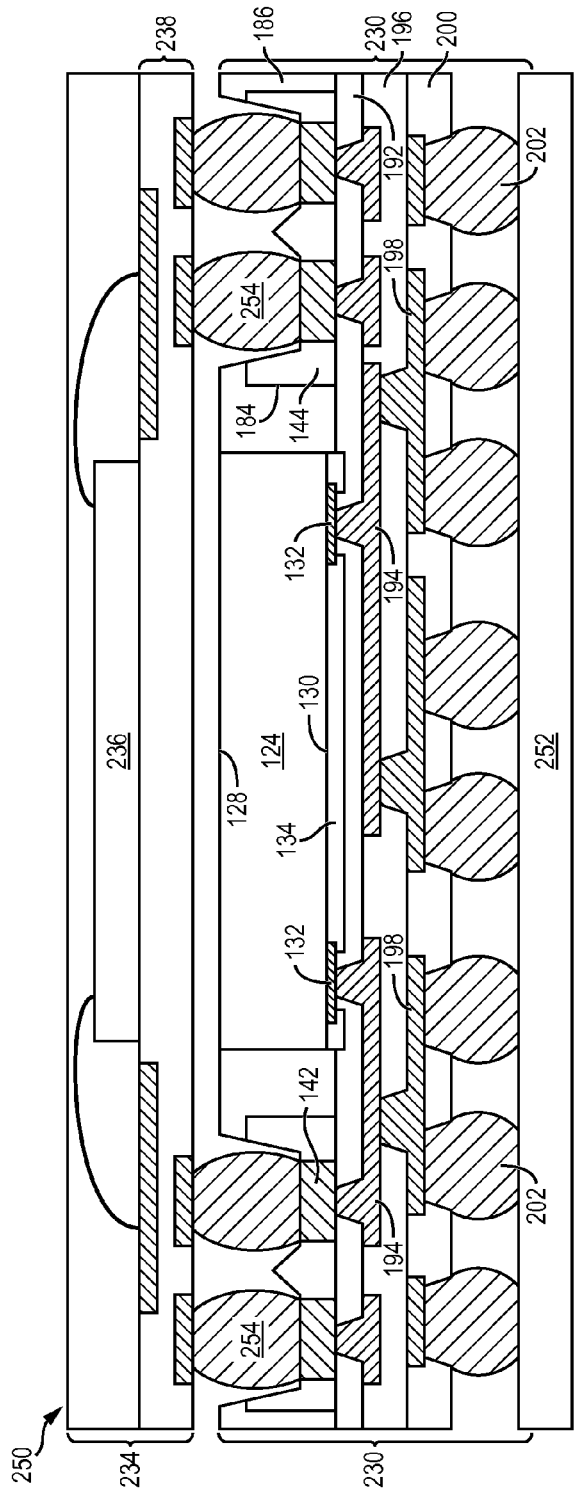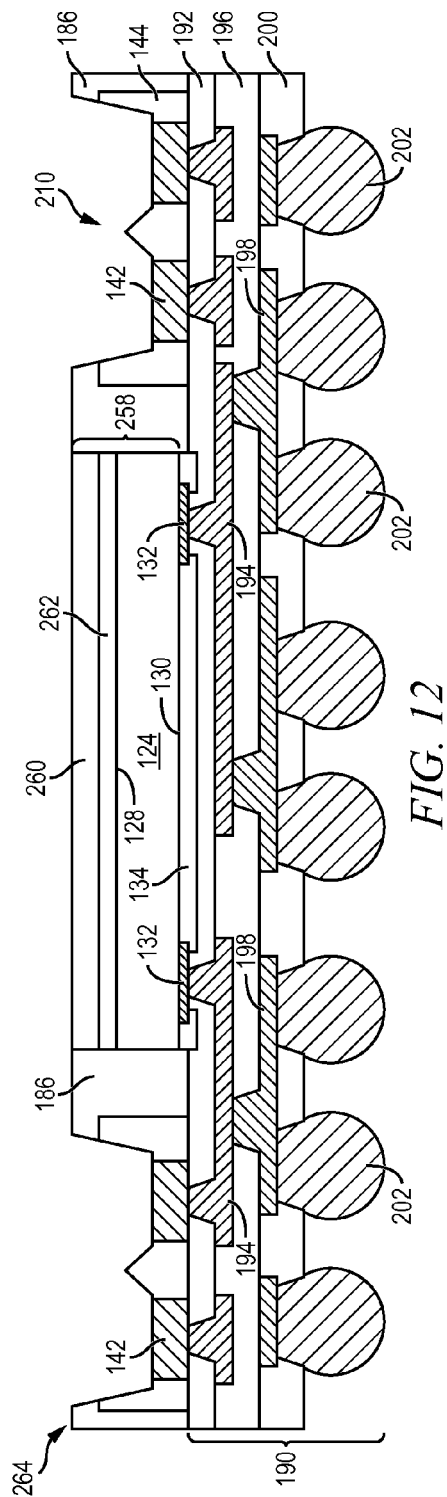
FIG. 11
FIG. 12

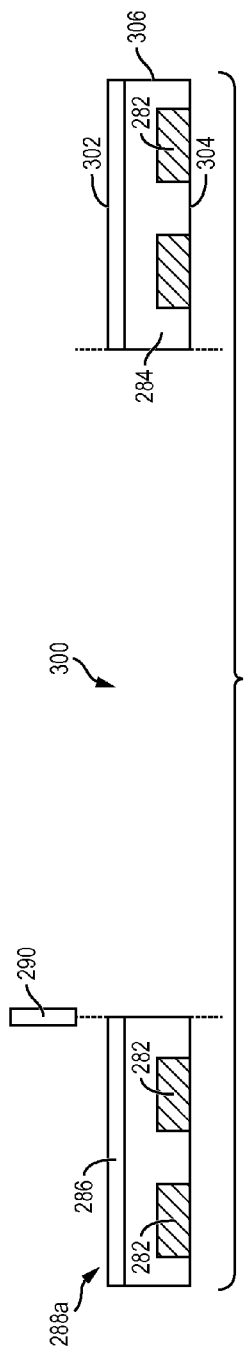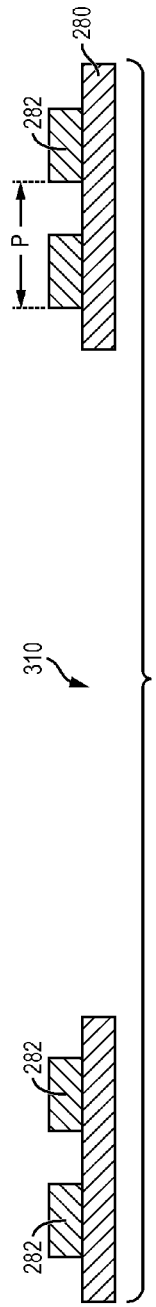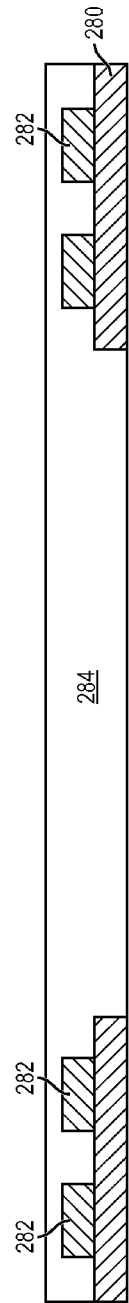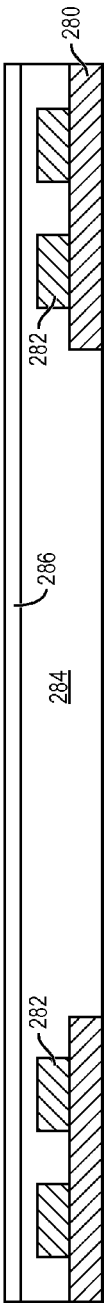
FIG. 15e
FIG. 16a
FIG. 16b
FIG. 16c

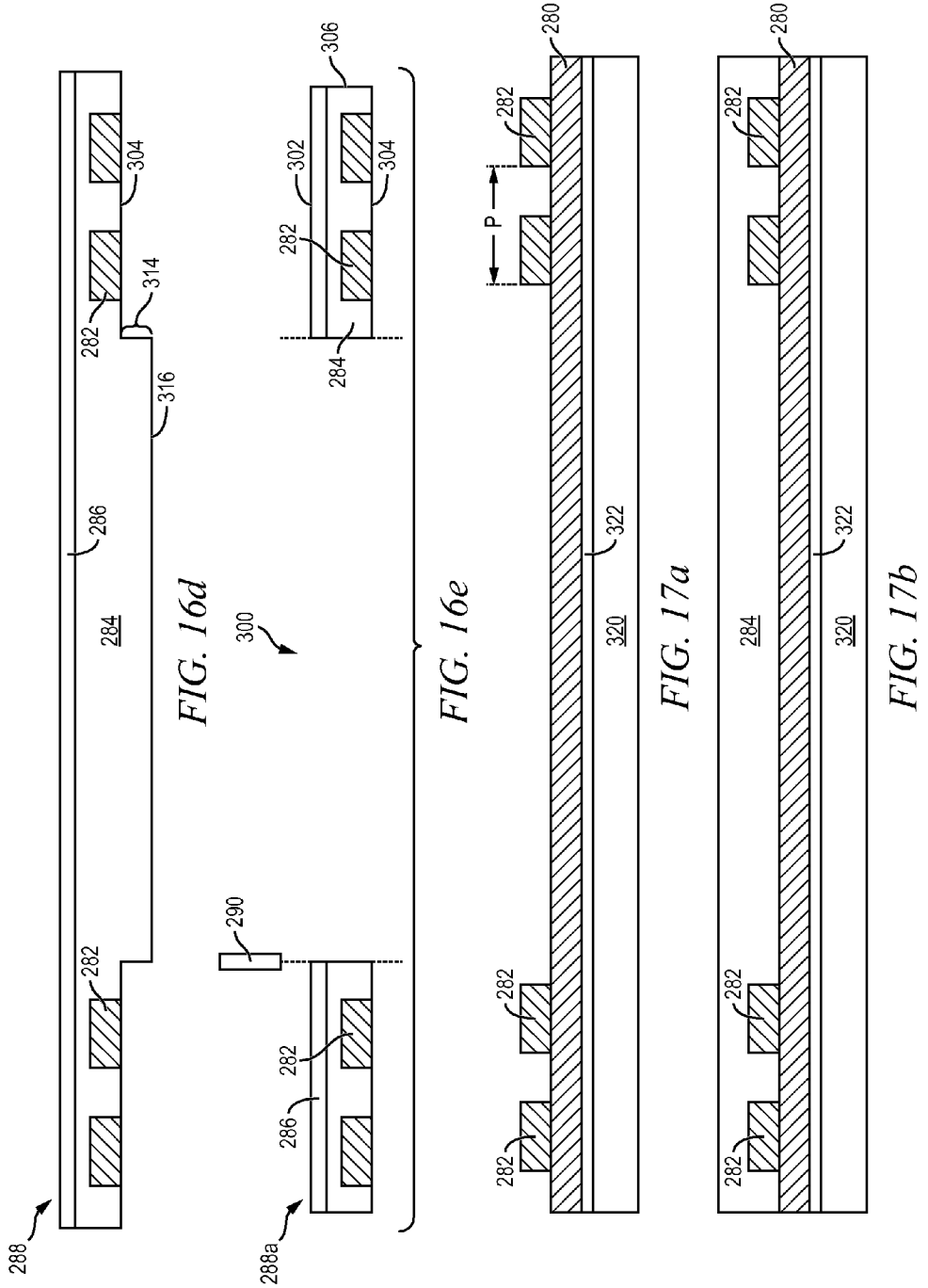

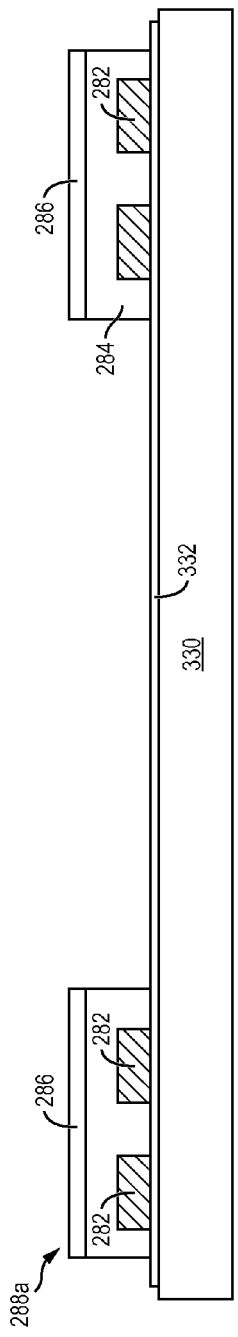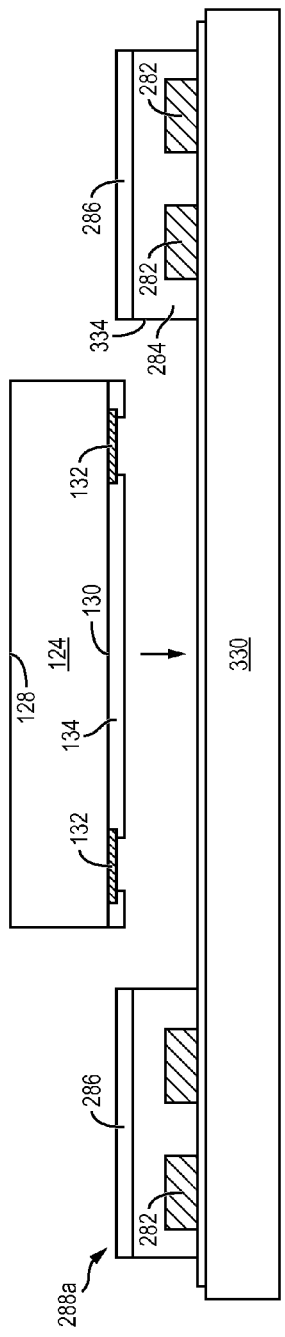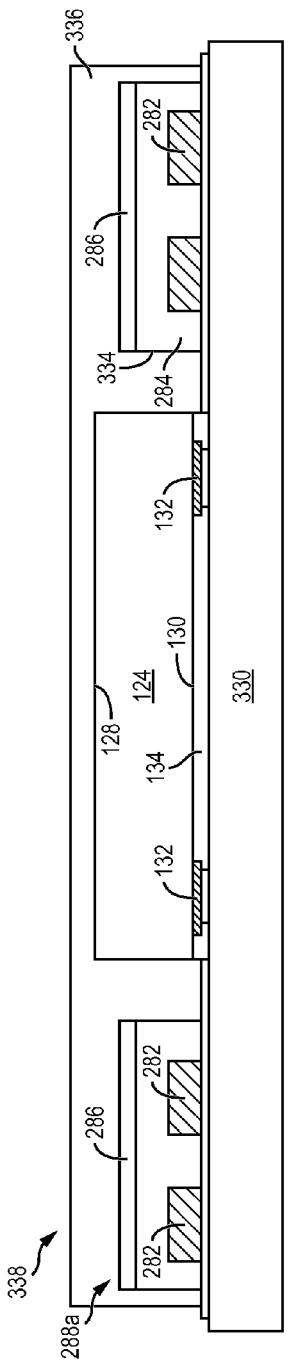

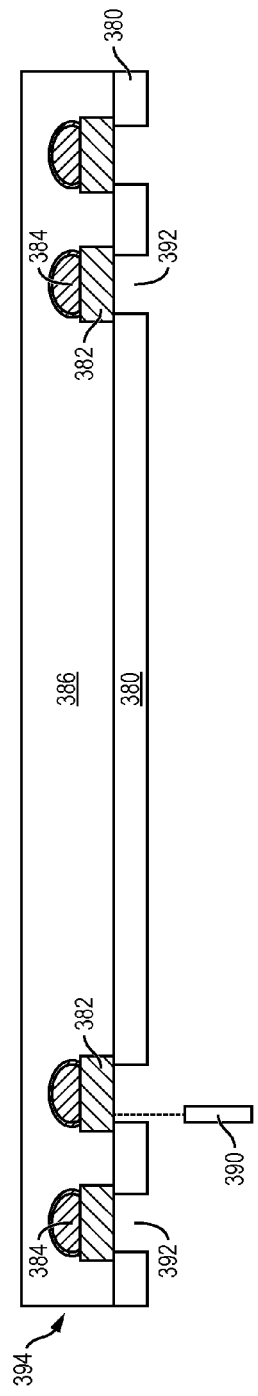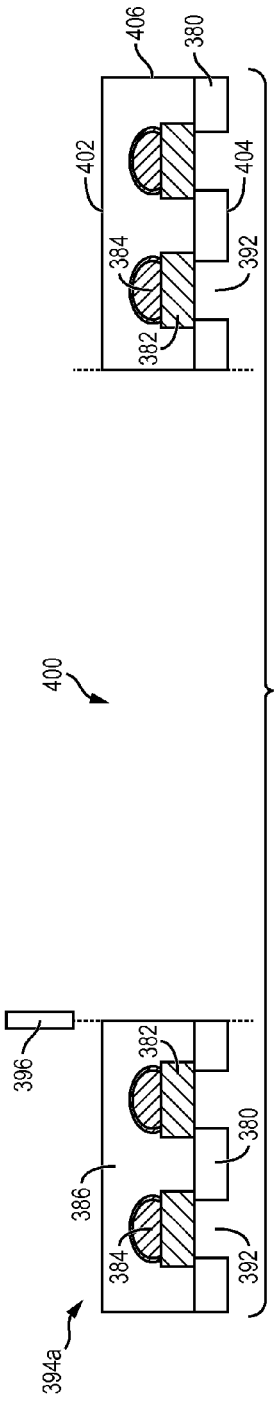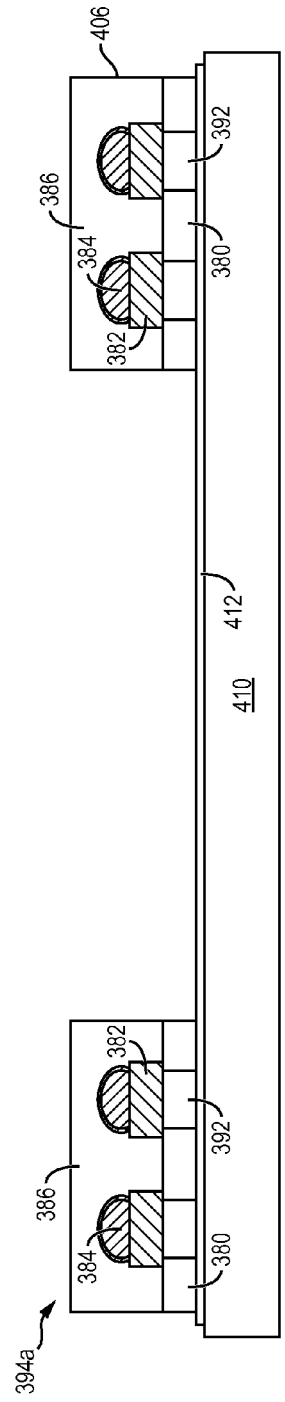

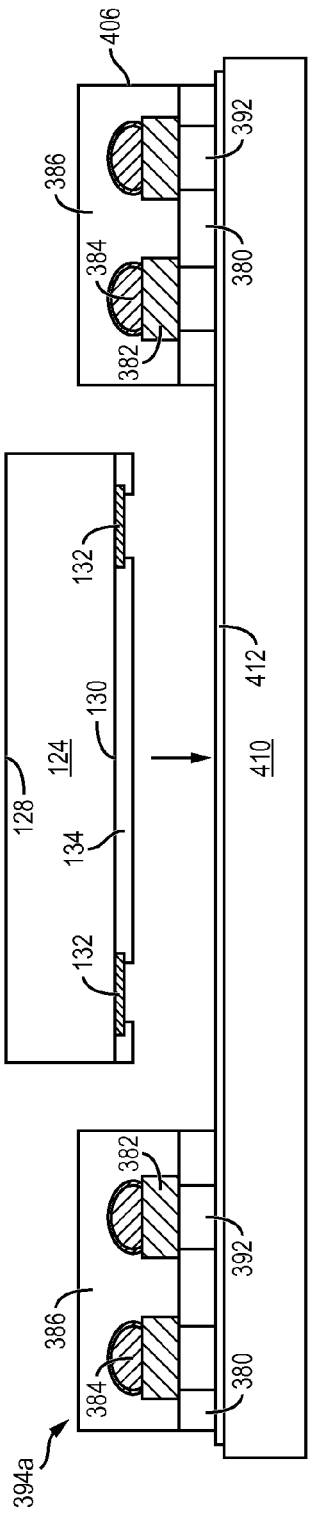
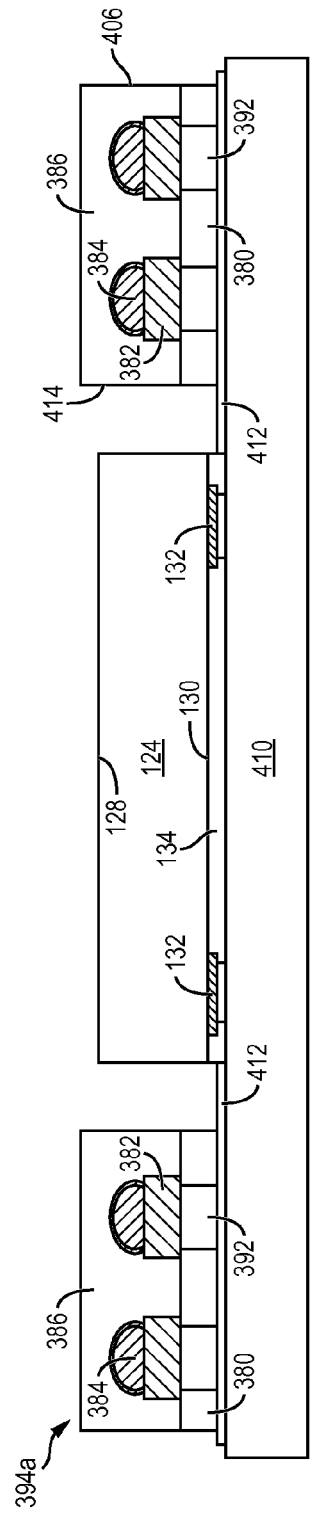
FIG. 21h
FIG. 21i

SEMICONDUCTOR DEVICE AND METHOD OF FORMING LOW PROFILE 3D FAN-OUT PACKAGE

FIELD OF THE INVENTION

The present invention relates in general to semiconductor devices and, more particularly, to a semiconductor device and method of forming a three dimensional (3D) fan-out package.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

Another goal of semiconductor manufacturing is to produce semiconductor devices with adequate heat dissipation. High frequency semiconductor devices generally generate more heat. Without effective heat dissipation, the generated heat can reduce performance, decrease reliability, and reduce the useful lifetime of the semiconductor device.

One approach to achieving the objectives of greater integration and smaller semiconductor devices is to focus on 3D packaging technologies including package-on-package (PoP). 3D device integration can be accomplished with conductive through silicon vias (TSV) or through hole vias (THV). However, PoP often require laser drilling through an entire package thickness to form interconnect structures, which increases cost. Further, stacked PoP devices require fine pitch vertical interconnections. Vertical interconnections formed exclusively by a laser drilling process can result in reduced control and a limited achievable pitch for vertical interconnections. Additionally, the vertical interconnections of conventional substrates consume space, increase the overall height of the package, and impose higher manufacturing costs. Conventional printed circuit board (PCB) substrates have a thickness of about 100 micrometers ($\mu$m) or more. The thickness of a conventional substrate leads to warpage and reduced thermal performance. Further, substrates having a thickness of 130 $\mu$m or less cause problems during handling, particularly during a pick and place operation. Thin package substrates are susceptible to damage and result in high cost processing.

SUMMARY OF THE INVENTION

A need exists for a fan-out package-on-package (Fo-PoP) having a reduced package height and fine-pitch vertical interconnections. Accordingly, in one embodiment, the present invention is a method of making a semiconductor device comprising the steps of providing a substrate including an insulating layer and a conductive layer, forming a first opening in the substrate, disposing a semiconductor die within the first opening, depositing a first encapsulant over the semiconductor die and substrate, and forming a second opening through the first encapsulant and insulating layer to expose the conductive layer.

In another embodiment, the present invention is a method of making a semiconductor device comprising the steps of providing a substrate including an insulating layer and a conductive layer, forming a first opening in the substrate, disposing a semiconductor die within the first opening, and forming a second opening in the insulating layer to expose the conductive layer.

In another embodiment, the present invention is a semiconductor device comprising a substrate including a first opening. A semiconductor die is disposed in the first opening. A first encapsulant is deposited over the semiconductor die and substrate. A second opening is formed through the first encapsulant and partially through the substrate.

In another embodiment, the present invention is a semiconductor device comprising a substrate including an insulating layer and a conductive layer. A first opening is formed in the substrate. A semiconductor die is disposed in the first opening. A second opening is formed in the insulating layer.

BRIEF DESCRIPTION OF THE DRAWINGS

FIGS. 4a-4d illustrate a process of forming a substrate with vertical interconnects for a 3D Fo-PoP;

FIGS. 5a-5d illustrate an alternative process of forming a substrate with vertical interconnects for a 3D Fo-PoP;

FIGS. 6a-6d illustrate an alternative process of forming a substrate with vertical interconnects for a 3D Fo-PoP;

FIGS. 7a-7e illustrate an alternative process of forming a substrate with vertical interconnects for a 3D Fo-PoP;

FIGS. 9a-9l illustrate a process of forming a 3D Fo-PoP with an embedded substrate and vertical interconnections;

FIG. 10 illustrates a stacked 3D Fo-PoP with an embedded substrate and vertical interconnections;

FIG. 11 illustrates a stacked 3D Fo-PoP mounted to a substrate;

FIG. 12 illustrates another 3D Fo-PoP including a backside support layer;

FIGS. 15a-15e illustrate another process of forming a substrate with vertical interconnects for a 3D Fo-PoP;

FIGS. 16a-16e illustrate another process of forming a substrate with vertical interconnects for a 3D Fo-PoP;

FIGS. 17a-17e illustrate another process of forming a substrate with vertical interconnects for a 3D Fo-PoP;

FIGS. 19a-19h illustrate another process of forming a 3D Fo-PoP with an embedded substrate and vertical interconnections;

DETAILED DESCRIPTION OF THE DRAWINGS

Figure 1:
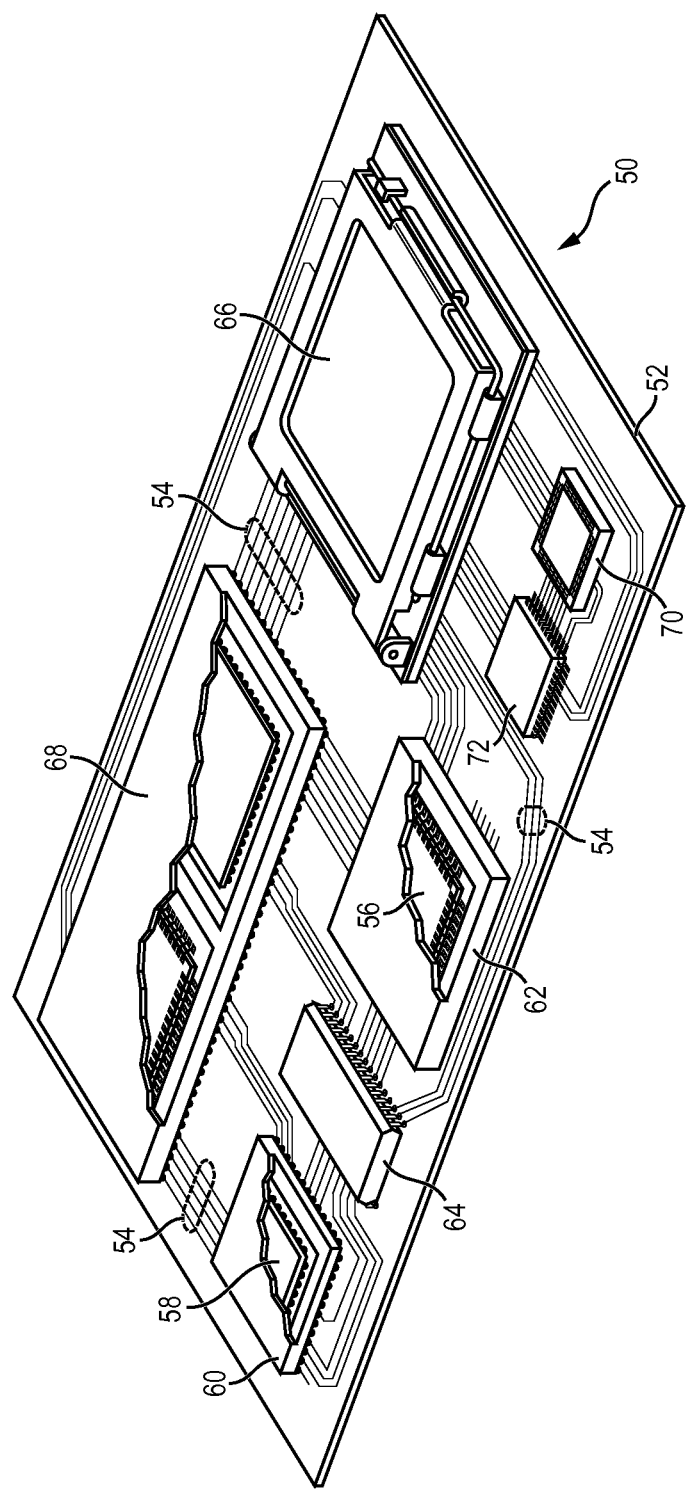
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for the products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
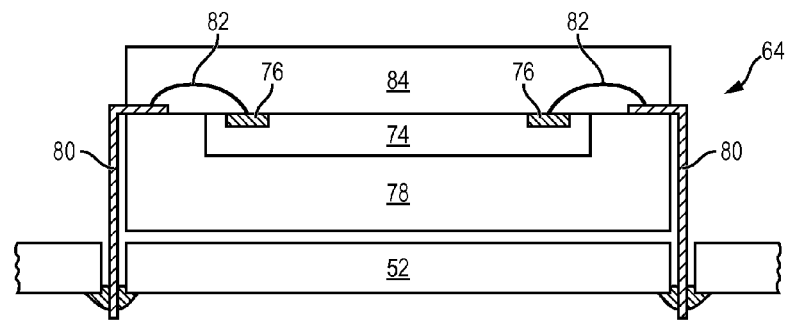
FIGS. 2a-2c illustrate further detail of the representative semiconductor packages mounted to the PCB.
Figure 2B:
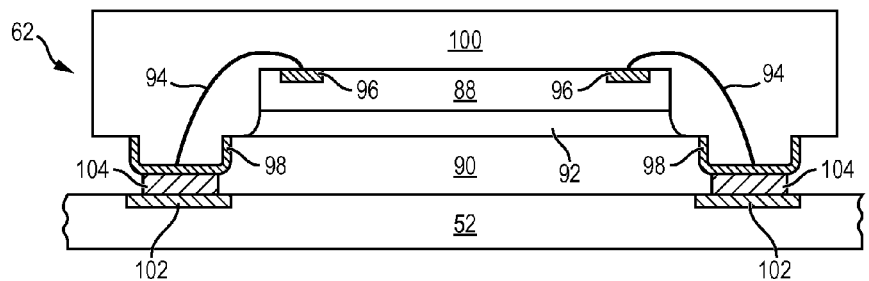
Figure 2C:
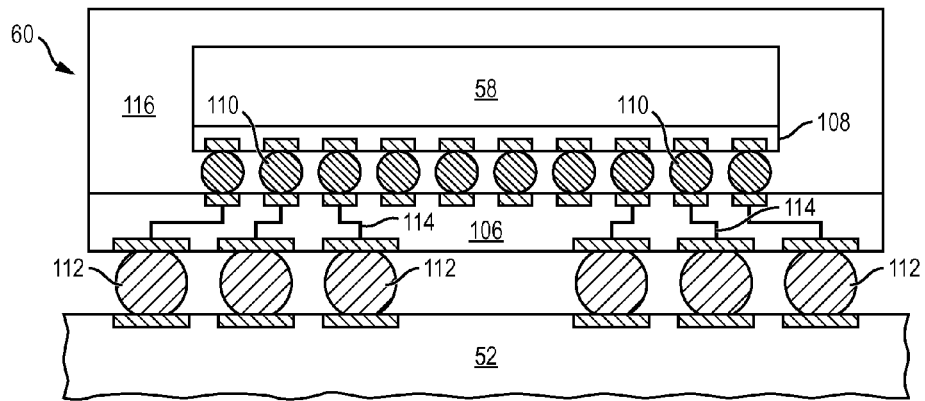

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
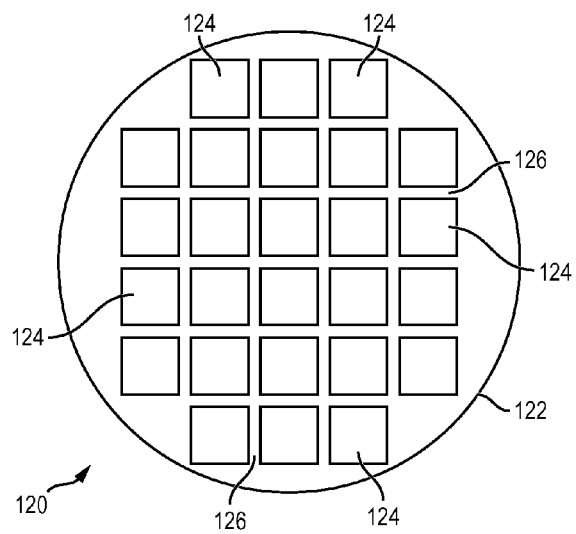
FIGS. 3a-3c illustrate a semiconductor wafer with a plurality of semiconductor die separated by a saw street.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

Figure 3B:
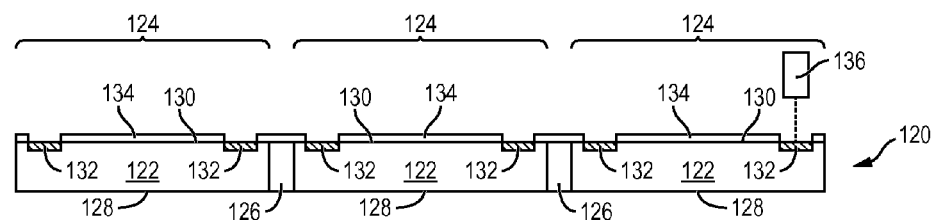

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type device.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Conductive layer 132 can be formed as contact pads disposed side-by-side a first distance from the edge of semiconductor die 124, as shown in FIG. 3b. Alternatively, conductive layer 132 can be formed as contact pads that are offset in multiple rows such that a first row of contact pads is disposed a first distance from the edge of the die, and a second row of contact pads alternating with the first row is disposed a second distance from the edge of the die.

An insulating or passivation layer 134 is conformally applied over active surface 130 using PVD, CVD, screen printing, spin coating, injection coating, or spray coating. The insulating layer 134 contains one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), low temperature curable polymer dielectric (i.e., cures at less than 400 degrees Celsius (° C.)), or other material having similar insulating and structural properties. The insulating layer 134 covers and provides protection for active surface 130. A portion of insulating layer 134 is removed by laser direct ablation (LDA) using laser 136 or other suitable process to expose conductive layer 132 and provide for subsequent electrical interconnect.

Figure 3C:
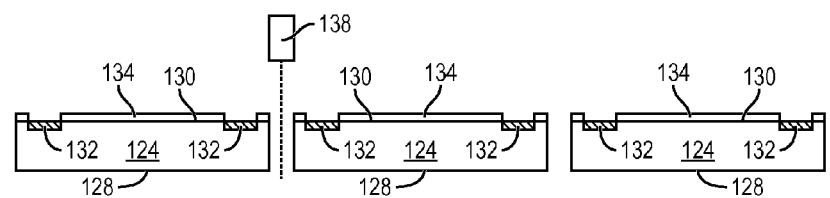

In FIG. 3c, semiconductor wafer 120 is singulated through saw street 126 using a saw blade or laser cutting tool 138 into individual semiconductor die 124.

FIGS. 4a-4d illustrate, in relation to FIGS. 1 and 2a-2c, a process of forming a substrate with vertical interconnects for a 3D Fo-PoP. In FIG. 4a, an electrically conductive layer 140 is formed using a metal deposition process such as Cu foil lamination, printing, PVD, CVD, sputtering, electrolytic plating, and electroless plating. Conductive layer 140 can be one or more layers of Cu, Sn, Ni, Au, Ag, titanium (Ti), tungsten (W), or other suitable electrically conductive material. In one embodiment, conductive layer 140 is Cu foil or Cu film. Conductive layer, conductive pads, or conductive pillars 142 are formed over conductive layer 140. Conductive pads 142 are Cu, Sn, Ni, Au, Ag, Ti, W, or other suitable electrically conductive material. Conductive pads 142 are deposited or patterned over conductive layer 140 using Cu foil lamination, printing, PVD, CVD, sputtering, electrolytic plating, electroless plating, etch-back, or combination of processes. Conductive layer 140 acts as a supporting layer for conductive pads 142. In one embodiment, conductive pads 142 are Cu and are formed using an etch-back process. Conductive pads 142 have a height of at least 20 micrometers (μm). In one embodiment, conductive pads 142 have a height of 100 μm or less. A pitch P of conductive pads 142 is 0.50 millimeters (mm) or less. Conductive layer 142 may include an optional Cu pattern or circuit components formed over conductive layer 140.

In FIG. 4b, an insulating or passivation layer 144 is formed over conductive layers 140 and 142. Insulating layer 144 includes one or more laminated layers of polytetrafluoroethylene pre-impregnated (prepreg), FR-4, FR-1, CEM-1, or CEM-3, or other material having similar insulating and structural properties. Insulating layer 144 further includes an epoxy, resin, or polymer with a reinforcement fiber or fabric, such as phenolic cotton paper, epoxy, resin, woven glass, matte glass, polyester, and other reinforcement fibers or fabrics. In an alternative embodiment, insulating layer 144 contains a molding compound, polymer dielectric with or without fillers, one or more layers of $SiO_2$, $Si_3N_4$, SiON, $Ta_2O_5$, $Al_2O_3$, or other material having similar insulating and structural properties. Insulating layer 144 is deposited using vacuum or pressure lamination with or without heat, PVD, CVD, screen printing, spin coating, spray coating, injection coating, sintering, thermal oxidation, or other suitable process. In one embodiment, insulating layer 144 is a prepreg sheet, roll, or tape including a polymer matrix enhanced with woven glass fiber and deposited using vacuum or pressure lamination with or without heat. In an alternative embodiment, insulating layer 144 includes a material selected to have a coefficient of thermal expansion (CTE) similar to a CTE of Cu, i.e., within 10 ppm/° C. of the CTE of Cu. The material selected for insulating layer 144, such as prepreg, enhances the overall strength of the semiconductor package and improves package warpage, particularly at temperatures of 150° C. to 260° C.

In FIG. 4c, conductive layer 140 is completely removed by etching or other suitable process. Conductive pads 142 remain embedded in insulating layer 144. Insulating layer 144 and embedded conductive pads 142 together constitute a substrate or PCB panel 146.

In FIG. 4d, a portion of PCB panel 146 is removed by punching, stamping, water jet cutting, mechanical drilling or cutting, LDA using laser 148, etching, or other suitable process to form openings 150. PCB panel 146 forms a pre-prepared fiber enhanced composite sheet that includes openings 150. Openings 150 are formed centrally with respect to conductive pads 142. Openings 150 are formed completely through insulating layer 144 of PCB panel 146 and extend from a first surface 152 of the PCB panel 146 to a second surface 154 of PCB panel 146 opposite the first surface. Openings 150 are square, rectangular, circular, oval, polygon, or any other shape. A size of openings 150 provides a space for subsequently mounting semiconductor die. In one embodiment, openings 150 have a generally square footprint and are formed large enough to accommodate semiconductor die 124 from FIG. 3c. Additionally, PCB panel 146 is separated into individual PCB units 146a along edge 156 by a similar process used to form openings 150, such as punching, stamping, water jet cutting, mechanical drilling or cutting, LDA using laser 148, etching, or other suitable process. PCB panel 146 may be separated into individual PCB units 146a in the same process step as forming openings 150. For example, in a punching or stamping process, PCB panel 146 is separated into individual PCB units 146a, while simultaneously, openings 150 are formed. In an alternative embodiment, PCB panel 146 is separated into individual PCB units without opening 150 and having a square, rectangular, cross-shaped (+), angled or "L-shaped," circular, oval, hexagonal, octagonal, star shaped, or any geometrically shaped footprint.

Figure 5D:
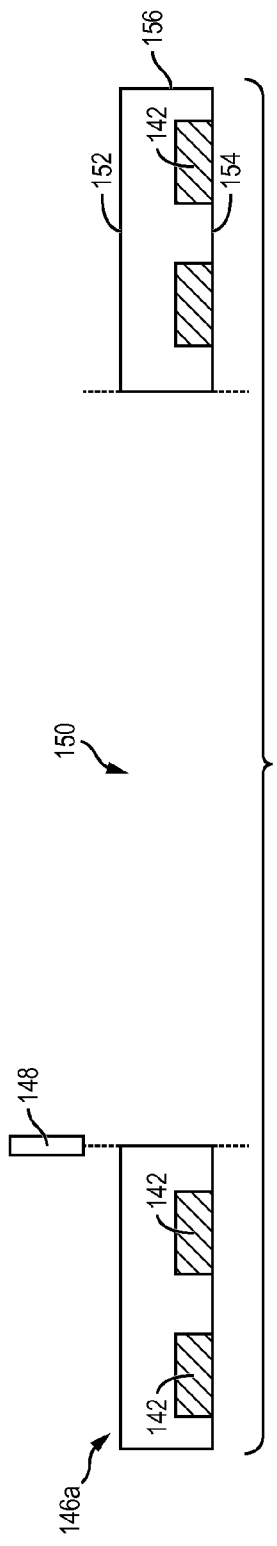

FIGS. 5a-5d illustrate, in relation to FIGS. 1 and 2a-2c, an alternative process of forming a substrate with vertical interconnects for a 3D Fo-PoP. FIG. 5a shows a portion of substrate or carrier 160 containing temporary or sacrificial base material such as silicon, steel, germanium, gallium arsenide, indium phosphide, silicon carbide, resin, beryllium oxide, glass, or other suitable low-cost, rigid material for structural support. An interface layer or double-sided tape 162 is formed over carrier 160 as a temporary adhesive bonding film, etch-stop layer, or release layer.

Conductive layer 140 is formed over interface layer 162 and carrier 160 using a metal deposition process such as Cu foil lamination, printing, PVD, CVD, sputtering, electrolytic plating, and electroless plating. Conductive layer 140 can be one or more layers of Cu, Sn, Ni, Au, Ag, Ti, W, or other suitable electrically conductive material. In one embodiment, conductive layer 140 is Cu foil or Cu film. Conductive layer, conductive pads, or conductive pillars 142 are formed over conductive layer 140. Conductive pads 142 are Cu, Sn, Ni, Au, Ag, Ti, W, or other suitable electrically conductive material. Conductive pads 142 are deposited or patterned over conductive layer 140 using Cu foil lamination, printing, PVD, CVD, sputtering, electrolytic plating, electroless plating, etch-back, or combination of processes. Conductive layer 140 acts as an additional supporting layer for conductive pads 142. In one embodiment, conductive pads 142 are Cu and are formed using an etch-back process. In one embodiment, conductive pads 142 have a height of 100 μm or less. A pitch P of conductive pads 142 is 0.50 mm or less. Conductive layer 142 may include an optional Cu pattern or circuit components formed over conductive layer 140.

In FIG. 5b, an insulating or passivation layer 144 is formed over conductive layers 140 and 142. Insulating layer 144 includes one or more laminated layers of prepreg, FR-4, FR-1, CEM-1, or CEM-3, or other material having similar insulating and structural properties. Insulating layer 144 further includes an epoxy, resin, or polymer with a reinforcement fiber or fabric, such as phenolic cotton paper, epoxy, resin, woven glass, matte glass, polyester, and other reinforcement fibers or fabrics. In an alternative embodiment, insulating layer 144 contains a molding compound, polymer dielectric with or without fillers, one or more layers of SiO2, Si3N4, SiON, Ta2O5, Al2O3, or other material having similar insulating and structural properties. Insulating layer 144 is deposited using vacuum or pressure lamination with or without heat, PVD, CVD, screen printing, spin coating, spray coating, injection coating, sintering, thermal oxidation, or other suitable process. In one embodiment, insulating layer 144 is a prepreg sheet, roll, or tape including a polymer matrix enhanced with woven glass fiber and deposited using vacuum or pressure lamination with or without heat. In an alternative embodiment, insulating layer 144 includes a material selected to have a CTE similar to a CTE of Cu, i.e., within 10 ppm/° C. of the CTE of Cu. The material selected for insulating layer 144, such as prepreg, enhances the overall strength of the semiconductor package and improves package warpage, particularly at temperatures of 150° C. to 260° C.

In FIG. 5c, carrier 160 and interface layer 162 are removed from PCB panel 146 by chemical etching, mechanical peeling, chemical mechanical planarization (CMP), mechanical grinding, thermal bake, UV light, laser scanning, or wet stripping. Additionally, conductive layer 140 is completely removed by etching or other suitable process to leave PCB panel 146 including conductive pads 142 embedded within insulating layer 144.

In FIG. 5d, a portion of PCB panel 146 is removed by punching, stamping, water jet cutting, mechanical drilling or cutting, LDA using laser 148, etching, or other suitable process to form openings 150. PCB panel 146 forms a pre-prepared fiber enhanced composite sheet that includes openings 150. Openings 150 are formed centrally with respect to conductive pads 142. Openings 150 are formed completely through insulating layer 144 of PCB panel 146 and extend from a first surface 152 of the PCB panel 146 to a second surface 154 of PCB panel 146 opposite the first surface. Openings 150 are square, rectangular, circular, oval, polygon, or any other shape. A size of openings 150 provides a space for subsequently mounting semiconductor die. In one embodiment, openings 150 have a generally square footprint and are formed large enough to accommodate semiconductor die or components 124 from FIG. 3c. Additionally, PCB panel 146 is separated into individual PCB units 146a along edge 156 by a similar process used to form openings 150, such as punching, stamping, water jet cutting, mechanical sawing or cutting, LDA using laser 148, etching, or other suitable process. PCB panel 146 may be separated into individual PCB units 146a in the same process step as forming openings 150. For example, in a punching or stamping process, PCB panel 146 is separated into individual PCB units 146a, while simultaneously, openings 150 are formed. In an alternative embodiment, PCB panel 146 is separated into individual PCB units without opening 150 and having a square, rectangular, cross-shaped (+), angled or "L-shaped," circular, oval, hexagonal, octagonal, star shaped, or any geometrically shaped footprint.

Figure 6A:
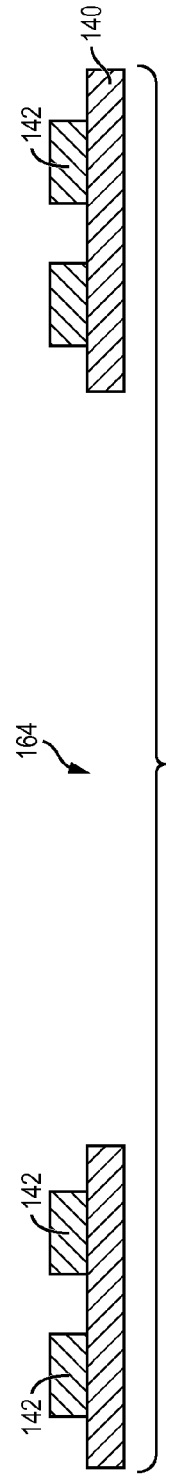

FIGS. 6a-6d illustrate, in relation to FIGS. 1 and 2a-2c, an alternative process of forming a substrate with vertical interconnects for a 3D Fo-PoP. In FIG. 6a, conductive layer 140 is formed using a metal deposition process such as Cu foil lamination, printing, PVD, CVD, sputtering, electrolytic plating, and electroless plating. Conductive layer 140 can be one or more layers of Cu, Sn, Ni, Au, Ag, Ti, W, or other suitable electrically conductive material. In one embodiment, conductive layer 140 is Cu foil or Cu film. Conductive layer 140 may be formed over a carrier for structural support, such as carrier 160 and interface layer 162. Conductive layer, conductive pads, or conductive pillars 142 are formed over conductive layer 140. Conductive pads 142 are Cu, Sn, Ni, Au, Ag, Ti, W, or other suitable electrically conductive material. Conductive pads 142 are deposited or patterned over conductive layer 140 using Cu foil lamination, printing, PVD, CVD, sputtering, electrolytic plating, electroless plating, etch-back, or combination of processes. Conductive layer 140 acts as a supporting layer for conductive pads 142. In one embodiment, conductive pads 142 are Cu and are formed using stamping or punching process. Openings 164 are formed in conductive layer 140 using a stamping process, punching process, or other suitable process. Openings 164 are formed adjacent to conductive pads 142 in an area for subsequently mounted semiconductor die. In one embodiment, conductive pads 142 have a height of 100 μm or less. A pitch of conductive pads 142 is 0.50 mm or less. Conductive layer 142 may include an optional Cu pattern or circuit components formed over conductive layer 140.

Figure 6B:
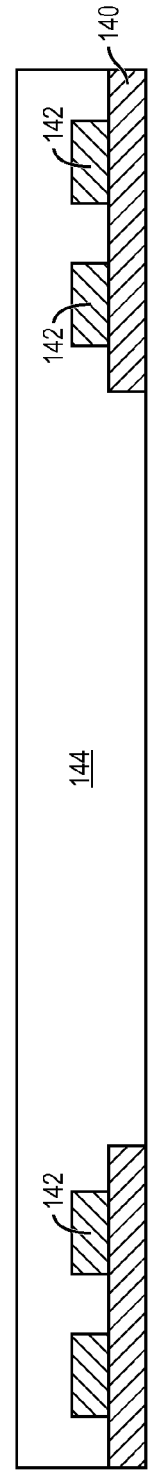

In FIG. 6b, an insulating or passivation layer 144 is formed over conductive layers 140 and 142. Insulating layer 144 includes one or more laminated layers of prepreg, FR-4, FR-1, CEM-1, or CEM-3, or other material having similar insulating and structural properties. Insulating layer 144 further includes an epoxy, resin, or polymer with a reinforcement fiber or fabric, such as phenolic cotton paper, epoxy, resin, woven glass, matte glass, polyester, and other reinforcement fibers or fabrics. In an alternative embodiment, insulating layer 144 contains a molding compound, polymer dielectric with or without fillers, one or more layers of SiO2, Si3N4, SiON, Ta2O5, Al2O3, or other material having similar insulating and structural properties. Insulating layer 144 is deposited using vacuum or pressure lamination with or without heat, PVD, CVD, screen printing, spin coating, spray coating, injection coating, sintering, thermal oxidation, or other suitable process. In one embodiment, insulating layer 144 is a prepreg sheet, roll, or tape including a polymer matrix enhanced with woven glass fiber and deposited using vacuum or pressure lamination with or without heat. In an alternative embodiment, insulating layer 144 includes a material selected to have a CTE similar to a CTE of Cu, i.e., within 10 ppm/° C. of the CTE of Cu. The material selected for insulating layer 144, such as prepreg, enhances the overall strength of the semiconductor package and improves package warpage, particularly at temperatures of 150° C. to 260° C.

In FIG. 6c, conductive layer 140 is completely removed by etching or other suitable process to leave PCB panel 146 including conductive pads 142 embedded within insulating layer 144. A portion 166 of insulating layer 144 protrudes from PCB panel 146 after conductive layer 140 is removed. Surface 168 of insulating layer 144 is non-coplanar with surface 154 of insulating layer 144.

In FIG. 6d, a portion of PCB panel 146 is removed by punching, stamping, water jet cutting, mechanical drilling or cutting, LDA using laser 148, etching, or other suitable process to form openings 150. PCB panel 146 forms a pre-prepared fiber enhanced composite sheet that includes openings 150. Openings 150 are formed centrally with respect to conductive pads 142. Openings 150 are formed completely through insulating layer 144 of PCB panel 146 and extend from a first surface 152 of the PCB panel 146 to a second surface 154 of PCB panel 146 opposite the first surface. Openings 150 are square, rectangular, circular, oval, polygon, or any other shape. A size of openings 150 provides a space for subsequently mounting semiconductor die. In one embodiment, openings 150 have a generally square footprint and are formed large enough to accommodate semiconductor die or components 124 from FIG. 3c. Additionally, PCB panel 146 is separated into individual PCB units 146a along edge 156 by a similar process used to form openings 150, such as punching, water jet cutting, mechanical sawing or cutting, LDA using laser 148, etching, or other suitable process. PCB panel 146 may be separated into individual PCB units 146a in the same process step as forming openings 150. For example, in a punching or stamping process, PCB panel 146 is separated into individual PCB units 146a, while simultaneously, openings 150 are formed. In an alternative embodiment, PCB panel 146 is separated into individual PCB units without opening 150 and having a square, rectangular, cross-shaped (+), angled or "L-shaped," circular, oval, hexagonal, octagonal, star shaped, or any geometrically shaped footprint.

Figure 7C:
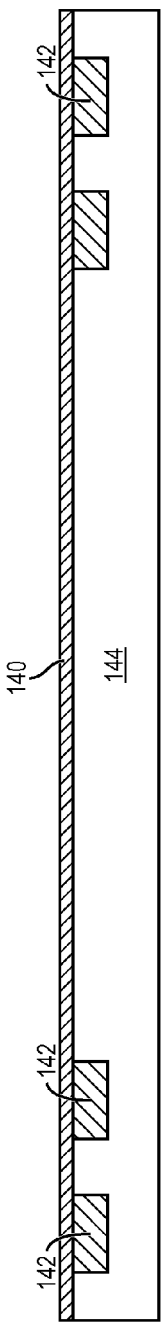

FIGS. 7a-7e illustrate, in relation to FIGS. 1 and 2a-2c, an alternative process of forming a substrate with vertical interconnects for a 3D Fo-PoP. In FIG. 7a, an insulating or passivation layer 144 is provided. Insulating layer 144 includes one or more laminated layers of prepreg, FR-4, FR-1, CEM-1, or CEM-3, or other material having similar insulating and structural properties. Insulating layer 144 further includes an epoxy, resin, or polymer with a reinforcement fiber or fabric, such as phenolic cotton paper, epoxy, resin, woven glass, matte glass, polyester, and other reinforcement fibers or fabrics. In an alternative embodiment, insulating layer 144 contains a molding compound, polymer dielectric with or without fillers, one or more layers of $SiO_2$, $Si_3N_4$, SiON, $Ta_2O_5$, $Al_2O_3$, or other material having similar insulating and structural properties. Insulating layer 144 is deposited using vacuum or pressure lamination with or without heat, PVD, CVD, screen printing, spin coating, spray coating, injection coating, sintering, thermal oxidation, or other suitable process. In one embodiment, insulating layer 144 is a prepreg sheet, roll, or tape including a polymer matrix enhanced with woven glass fiber and deposited using vacuum or pressure lamination with or without heat. In an alternative embodiment, insulating layer 144 includes a material selected to have a CTE similar to a CTE of Cu, i.e., within 10 ppm/° C. of the CTE of Cu. The material selected for insulating layer 144, such as prepreg, enhances the overall strength of the semiconductor package and improves package warpage, particularly at temperatures of 150° C. to 260° C.

In FIG. 7b, a portion of insulating layer 144 is removed to form openings 170. Openings 170 are formed by drilling, LDA, high energy water jetting, etching, or other suitable process. Openings 170 extend partially through insulating layer 144. After forming openings 170, openings 170 undergo a desmearing or cleaning process.

In FIG. 7c, an electrically conductive layer 140 is formed over insulating layer 144 using a metal deposition process such as Cu foil lamination, printing, PVD, CVD, sputtering, electrolytic plating, and electroless plating. Conductive layer 140 can be one or more layers of Cu, Sn, Ni, Au, Ag, titanium (Ti), tungsten (W), or other suitable electrically conductive material. In one embodiment, conductive layer 140 is Cu foil or Cu film. Conductive layer 140 fills openings 170 in insulating layer 144 to form conductive layer, conductive pads, or conductive pillars 142. In one embodiment, conductive layer 140 and conductive pads 142 are formed during a single deposition process. In another embodiment, conductive layer 140 and conductive pads 142 are formed in multiple deposition processes. For example, conductive layer 140 and conductive pads 142 are formed by electroless Cu plating and a two-step electrolytic Cu plating process. Conductive pads 142 have a height of at least 20 micrometers (μm). In one embodiment, conductive pads 142 have a height of 100 μm or less. A pitch of conductive pads 142 is 0.50 millimeters (mm) or less. Conductive layer 142 may include an optional Cu pattern or circuit components formed over insulating layer 144.

Figure 7D:
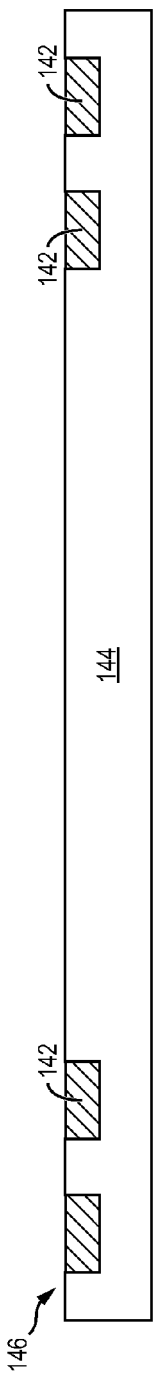

In FIG. 7d, conductive layer 140 is completely removed by etching or other suitable process. Conductive pads 142 remain embedded in insulating layer 144. Insulating layer 144 and embedded conductive pads 142 together constitute a substrate or PCB panel 146.

Figure 7E:
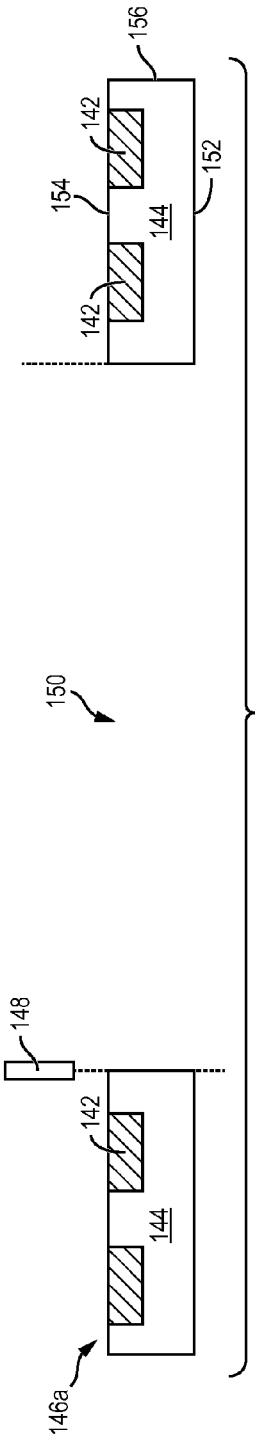

In FIG. 7e, a portion of PCB panel 146 is removed by punching, stamping, water jet cutting, mechanical drilling or cutting, LDA using laser 148, etching, or other suitable process to form openings 150. PCB panel 146 forms a pre-prepared fiber enhanced composite sheet that includes openings 150. Openings 150 are formed centrally with respect to conductive pads 142. Openings 150 are formed completely through insulating layer 144 of PCB panel 146 and extend from a first surface 152 of the PCB panel 146 to a second surface 154 of PCB panel 146 opposite the first surface. Openings 150 are square, rectangular, circular, oval, polygon, or any other shape. A size of openings 150 provides a space for subsequently mounting semiconductor die. In one embodiment, openings 150 have a generally square footprint and are formed large enough to accommodate semiconductor die or components 124 from FIG. 3c. Additionally, PCB panel 146 is separated into individual PCB units 146a along edge 156 by a similar process used to form openings 150, such as punching, stamping, water jet cutting, mechanical drilling or cutting, LDA using laser 148, etching, or other suitable process. PCB panel 146 may be separated into individual PCB units 146a in the same process step as forming openings 150. For example, in a punching or stamping process, PCB panel 146 is separated into individual PCB units 146a, while simultaneously, openings 150 are formed. In an alternative embodiment, PCB panel 146 is separated into individual PCB units without opening 150 and having a square, rectangular, cross-shaped (+), angled or "L-shaped," circular, oval, hexagonal, octagonal, star shaped, or any geometrically shaped footprint.

Figure 8A:
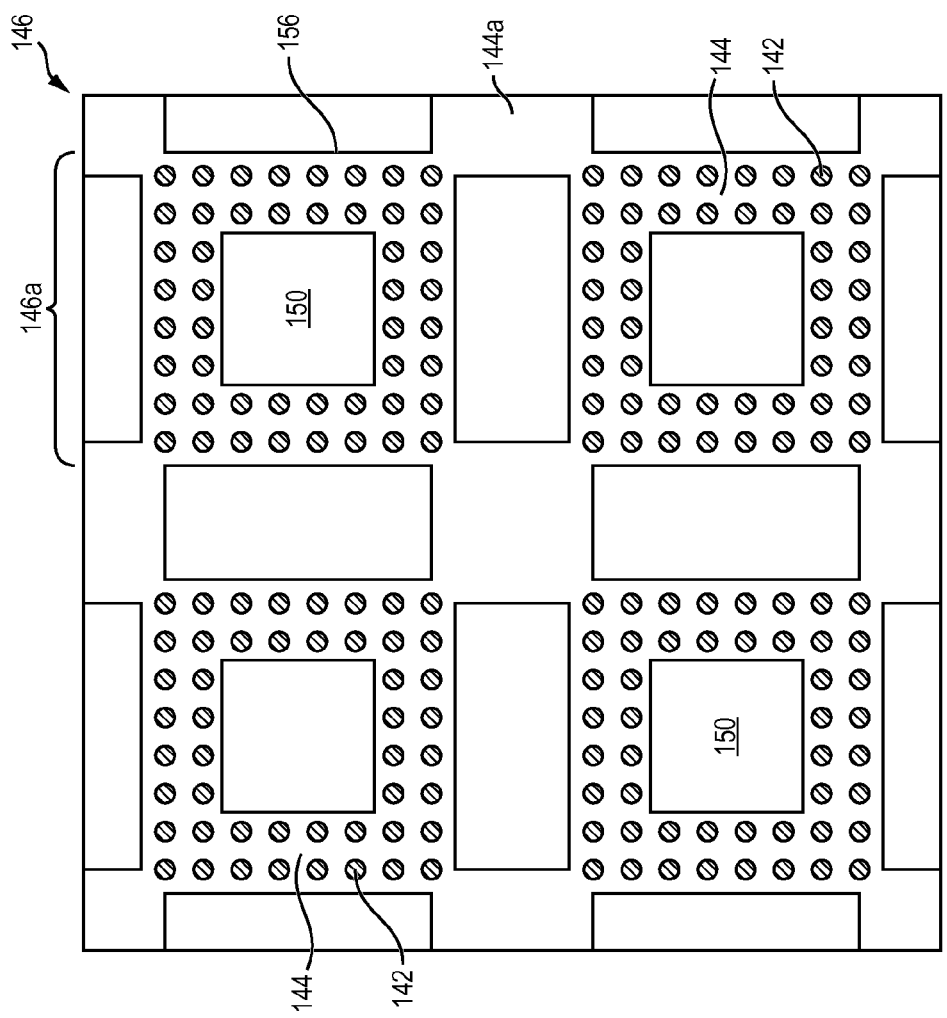
FIGS. 8a-8c illustrate a plan view of a substrate with openings and vertical interconnects for a 3D Fo-PoP.
Figure 8B:
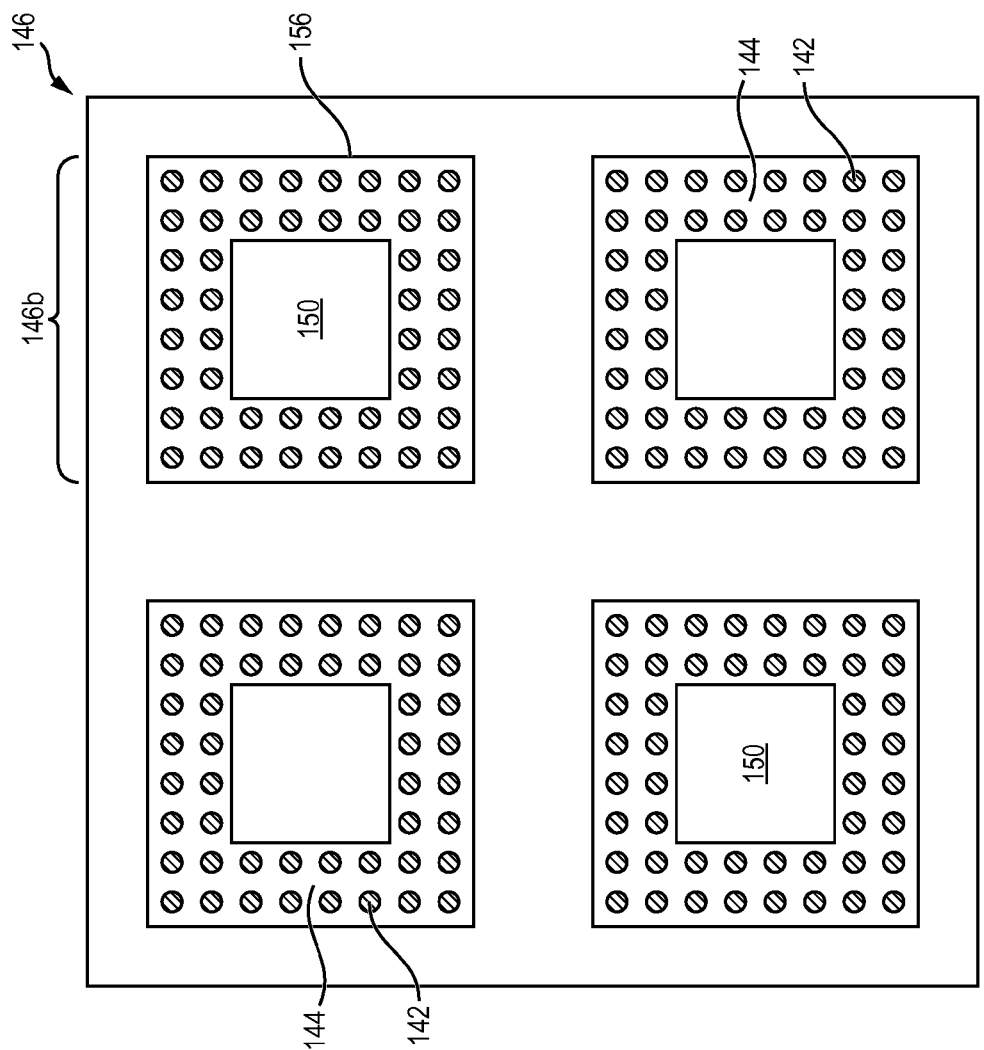
Figure 8C:
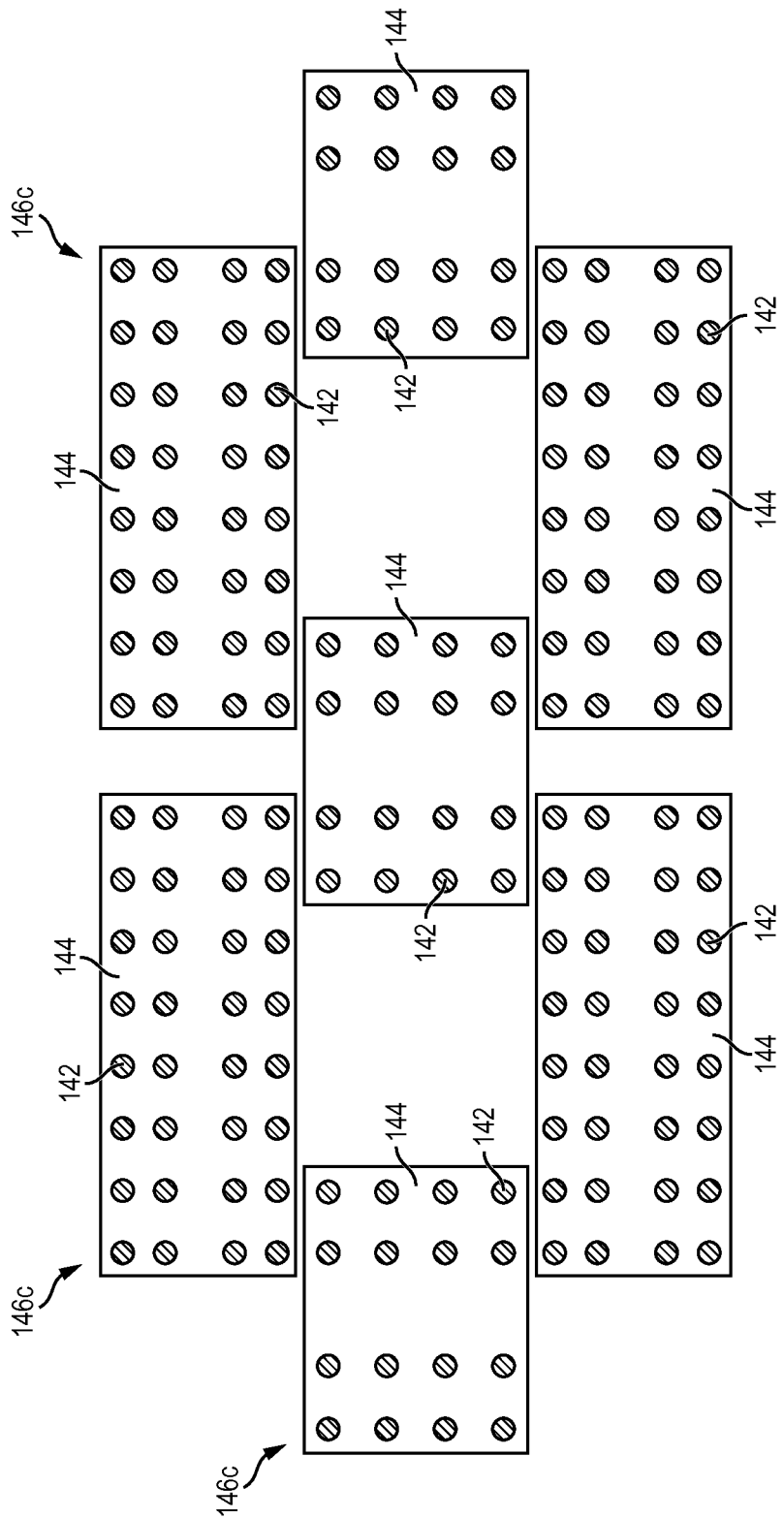

FIGS. 8a-8c show a plan view of the substrate with openings and vertical interconnects for a 3D Fo-PoP. FIG. 8a continues from FIG. 4d, 5d, 6d, or 7e and shows PCB panel 146 formed into individual PCB units 146a with openings 150. Individual PCB units 146a may be connected by portion 144a of insulating layer 144. Portion 144a of insulating layer 144 provides stress relief for the PCB panel 146. Alternatively, PCB panel 146 may be completely separated into individual PCB units 146b unconnected by a portion of PCB panel 146, as shown in FIG. 8b. In another embodiment, PCB panel 146 is formed into individual PCB units 146c, as shown in FIG. 8c. PCB units 146c do not include opening 150. Rather, PCB units 146c are configured in a shape appropriate for placement around the sides of semiconductor die 124 from FIG. 3c or to provide an area for placement of semiconductor die 124. PCB units 146c may including an include interlocking footprints having square and rectangular shapes, a cross-shape (+), an angled or "L-shape," a circular or oval shape, a hexagonal shape, an octagonal shape, a star shape, or any other geometric shape. PCB units 146a-146c contain multiple rows of conductive pads 142. Conductive pads 142 can be disposed side-by-side a first distance from the edge of insulating layer 144. Alternatively, conductive pads 142 can be offset in multiple rows such that a first row of conductive pads 142 is disposed a first distance from openings 150, and a second row of conductive pads 142 alternating with the first row is disposed a second distance from openings 150.

Figure 9D:
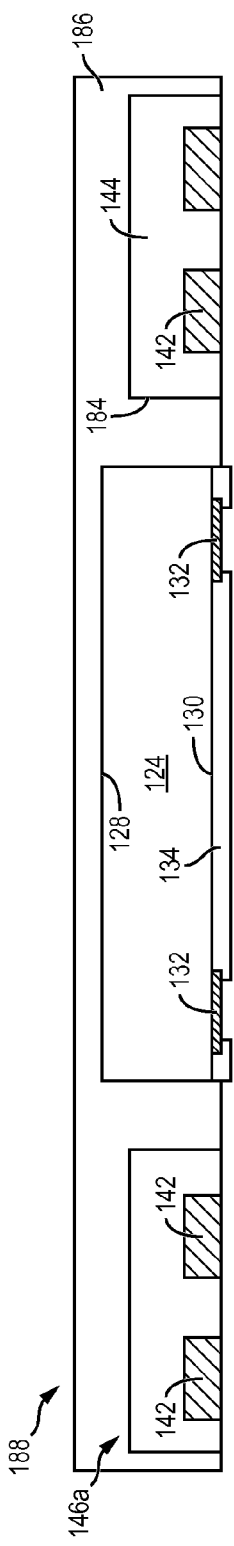

FIGS. 9a-9l illustrate, in relation to FIGS. 1 and 2a-2c, a process of forming a 3D Fo-PoP with an embedded substrate and vertical interconnections. In FIG. 9a, PCB panel 146 having individual PCB units 146a is aligned with and laminated on temporary carrier 180 and interface layer 182. Temporary carrier or substrate 180 contains temporary or sacrificial base material such as silicon, steel, germanium, gallium arsenide, indium phosphide, silicon carbide, resin, beryllium oxide, glass, or other suitable low-cost, rigid material for structural support. An interface layer or double-sided tape 182 is formed over carrier 180 as a temporary adhesive bonding film, etch-stop layer, or release layer. Alternatively, individual PCB units 146b or 146c are mounted and laminated temporary carrier 180 and interface layer 182 using a pick and place operation. Prior to laminating PCB units 146a-146c to carrier 180, alignment or dummy semiconductor die can be placed on the carrier 180 and interface layer 182. In one embodiment, PCB units 146a-146c are held by a transparent vacuum chuck for alignment before placing PCB units 146a-146c on carrier 180.

In FIG. 9b, semiconductor die 124 from FIG. 3c are mounted to interface layer 182 and carrier 180 using a pick and place operation with active surface 130 oriented toward the carrier. In one embodiment, semiconductor die 124 is a flipchip type device. In another embodiment, semiconductor die 124 may be a semiconductor package, such as a fan-out wafer level chip scale package (Fo-WLCSP) without bumps, bond wire package, flipchip LGA, flipchip BGA without bumps, or QFN package. Semiconductor die 124 are pressed into interface layer 182 such that insulating layer 134 is disposed into the interface layer. The clearance or distance between the inner edge 184 of insulating layer 144 of PCB units 146a-146c and semiconductor die 124 is at least 25 μm.

In FIG. 9c, an encapsulant or molding compound 186 is deposited over semiconductor die 124, PCB units 146a-146c, temporary carrier 180, and interface layer 182 using a paste printing, compressive molding, transfer molding, liquid encapsulant molding, vacuum lamination, spin coating, or other suitable applicator. Encapsulant 186 can be polymer composite material, such as epoxy resin with filler, epoxy acrylate with filler, or polymer with proper filler. Encapsulant 186 is non-conductive and environmentally protects the semiconductor device from external elements and contaminants. Prior to depositing encapsulant, the structure may undergo a high pressure annealing process. Encapsulant 186 and embedded semiconductor die 124 and PCB units 146a-146c form a fan-out composite substrate or reconstituted wafer 188.

In FIG. 9d, carrier 180 and interface layer 182 are removed by chemical etching, mechanical peeling, CMP, mechanical grinding, thermal bake, UV light, laser scanning, or wet stripping to facilitate the formation of an interconnect structure over active surface 130 of semiconductor die 124, PCB units 146a-146c, and encapsulant 186.

Figure 9E:
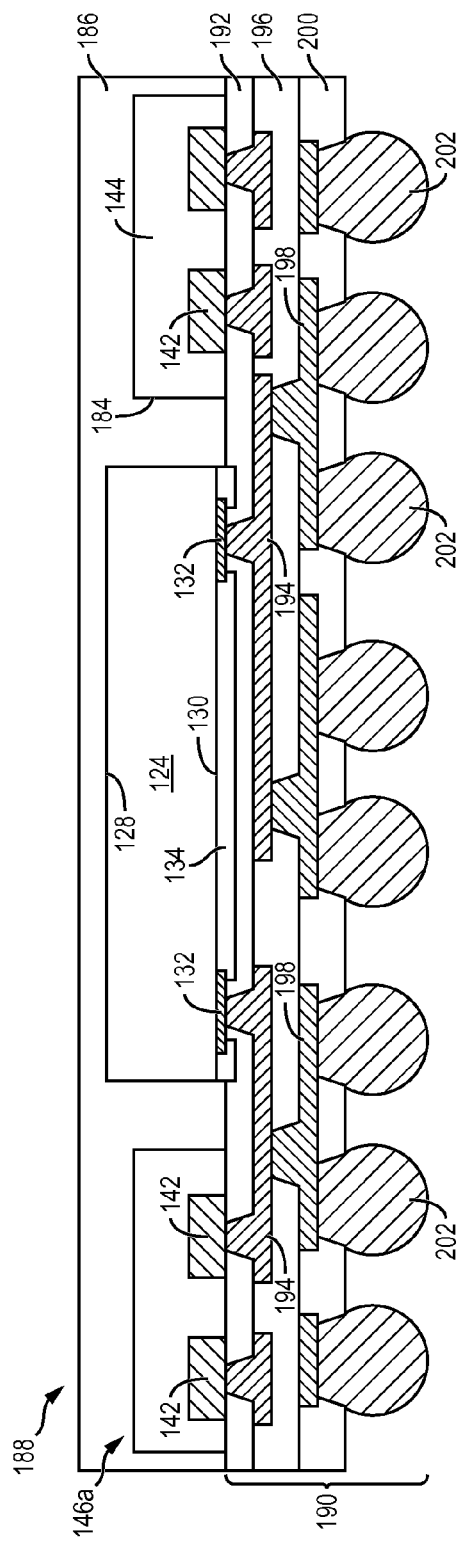

In FIG. 9e, a build-up interconnect structure 190 is formed over semiconductor die 124, PCB units 146a-146c, and encapsulant 186. An insulating or passivation layer 192 is formed over semiconductor die 124, PCB units 146a-146c, and encapsulant 186 using PVD, CVD, printing, slit coating, spin coating, spray coating, injection coating, lamination, sintering or thermal oxidation. The insulating layer 192 contains one or more layers of SiO2, Si3N4, SiON, Ta2O5, Al2O3, polymer dielectric resist with or without fillers or fibers, or other material having similar structural and insulating properties. A portion of insulating layer 192 is removed by an exposure or development process, LDA, etching, or other suitable process to form openings over conductive pads 142 of PCB units 146a-146c and over conductive layer 132 of semiconductor die 124.

An electrically conductive layer or RDL 194 formed over insulating layer 192 using a patterning and metal deposition process such as sputtering, electrolytic plating, and electroless plating. Conductive layer 194 can be one or more layers of Al, Ti, TiW, Cu, Sn, Ni, Au, Ag, or other suitable electrically conductive material. One portion of conductive layer 194 is electrically connected to contact pads 132 of semiconductor die 124. Another portion of conductive layer 194 is electrically connected to conductive pads 142 of PWB units 146a-146c. Other portions of conductive layer 194 can be electrically common or electrically isolated depending on the design and function of semiconductor die 124.

An insulating or passivation layer 196 is formed over insulating layer 192 and conductive layer 194 using PVD, CVD, printing, slit coating, spin coating, spray coating, injection coating, lamination, sintering, or thermal oxidation. The insulating layer 196 contains one or more layers of SiO2, Si3N4, SiON, Ta2O5, Al2O3, polymer dielectric resist with or without fillers or fibers, or other material having similar structural and insulating properties. A portion of insulating layer 196 can be removed by an exposure or development process, LDA, etching, or other suitable process to expose conductive layer 194.

An electrically conductive layer or RDL 198 formed over conductive layer 194 and insulating layer 196 using a patterning and metal deposition process such as sputtering, electrolytic plating, and electroless plating. Conductive layer 198 can be one or more layers of Al, Ti, TiW, Cu, Sn, Ni, Au, Ag, or other suitable electrically conductive material. One portion of conductive layer 198 is electrically connected to conductive layer 194. Other portions of conductive layer 198 can be electrically common or electrically isolated depending on the design and function of semiconductor die 124.

An insulating or passivation layer 200 is formed over insulating layer 196 and conductive layer 198 using PVD, CVD, printing, slit coating, spin coating, spray coating, injection coating, lamination, sintering, or thermal oxidation. The insulating layer 200 contains one or more layers of SiO2, Si3N4, SiON, Ta2O5, Al2O3, polymer dielectric resist with or without fillers or fibers, or other material having similar structural and insulating properties. A portion of insulating layer 200 can be removed by an exposure or development process, LDA, etching, or other suitable process to expose conductive layer 198.

The number of insulating and conductive layers included within build-up interconnect structure 190 depends on, and varies with, the complexity of the circuit routing design. Accordingly, build-up interconnect structure 190 can include any number of insulating and conductive layers to facilitate electrical interconnect with respect to semiconductor die 124.

An electrically conductive bump material is deposited over build-up interconnect structure 190 and electrically connected to the exposed portion of conductive layer 198 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 198 using a suitable attachment or bonding process. In one embodiment, the bump material is reflowed by heating the material above its melting point to form spherical balls or bumps 202. In some applications, bumps 202 are reflowed a second time to improve electrical contact to conductive layer 198. An under bump metallization (UBM) can be formed under bumps 202. Bumps 202 can also be compression bonded to conductive layer 198. Bumps 202 represent one type of interconnect structure that can be formed over conductive layer 198. The interconnect structure can also use stud bump, micro bump, or other electrical interconnect.

Figure 9F:
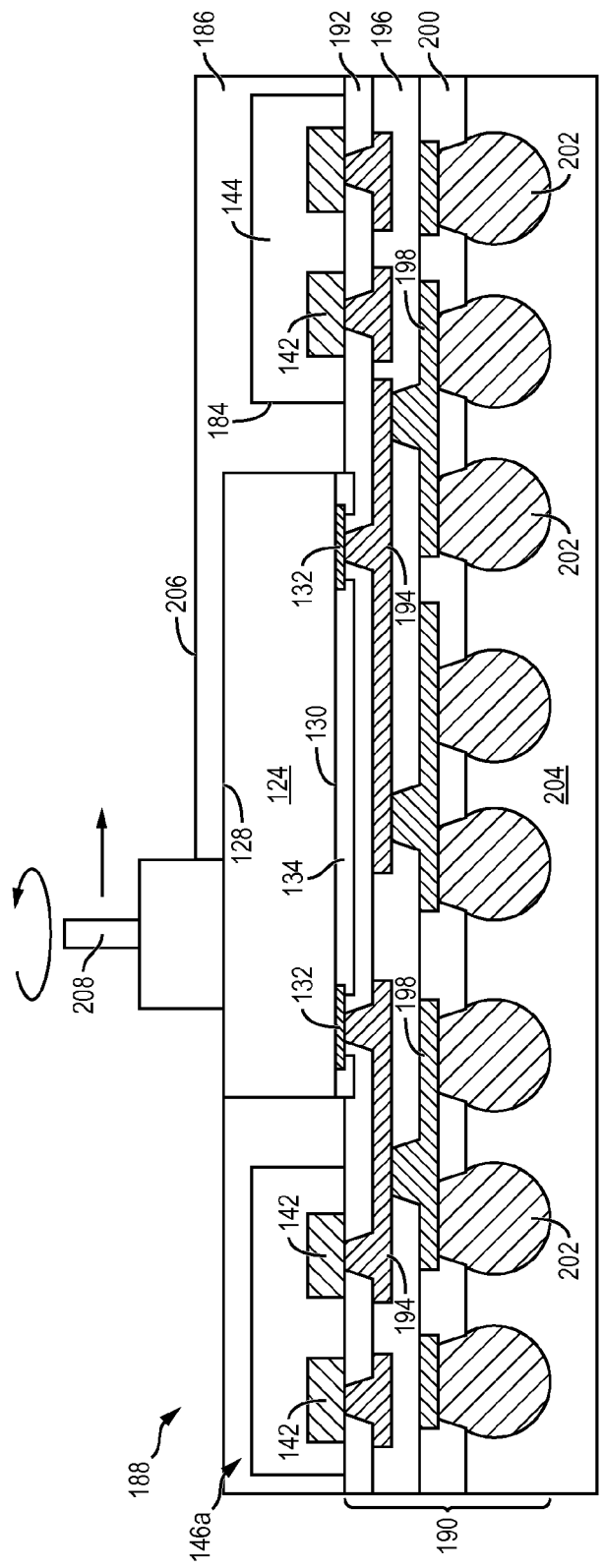

In FIG. 9f, back grinding tape 204 is applied over build-up interconnect structure 190 using lamination or other suitable application process. Back grinding tape 204 contacts insulating layer 200 and bumps 202 of build-up interconnect structure 190. Back grinding tape 204 follows the contours of a surface of bumps 202. Back grinding tape 204 includes tapes with thermal resistance up to 270° C. Back grinding tape 204 also includes tapes with a thermal release function. Examples of back grinding tape 204 include UV tape HT 440 and non-UV tape MY-595. Back grinding tape 204 provides structural support for subsequent back grinding and removal of a portion of encapsulant 186 from a backside surface 206 of encapsulant 186, opposite build-up interconnect structure 190.

Backside surface 206 of encapsulant 186 undergoes a grinding operation with grinder 208 to planarize and reduce a thickness of encapsulant 186 and semiconductor die 124. The grinding operation removes a portion of encapsulant material down to back surface 128 of semiconductor die 124. A chemical etch can also be used to planarize and remove a portion of encapsulant 186 and semiconductor die 124. A chemical etch, CMP, or plasma dry etch can also be used to remove back grinding damage and residue stress on semiconductor die 124 and encapsulant 186 to enhance the package strength. In one embodiment, insulating layer 144 is thinner than semiconductor die 124 and encapsulant 186 remains over insulating layer 144 after back grinding. In an alternative embodiment, insulating layer 144 is selected to be the same thickness as the thickness of semiconductor die 124 after back grinding.

Figure 9G:
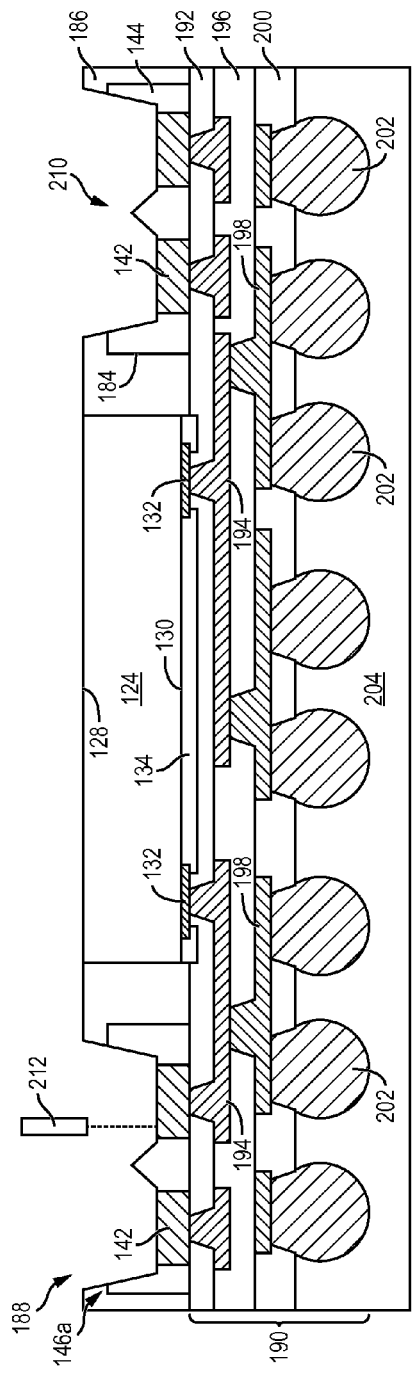

In FIG. 9g, a portion of encapsulant 186 is removed from over PCB units 146a-146c to form openings 210. A portion of insulating layer 144 of PCB units 146a-146c is removed to expose portions of conductive pads 142. Openings 210 include a vertical or sloped sidewall and extend from a back surface of encapsulant 186 completely through encapsulant 186 and partially through PCB units 146a-146c. Openings 210 are formed by drilling, LDA using laser 212, high energy water jetting, etching, or other suitable process. After forming openings 210, openings 210 undergo a desmearing or cleaning process. Openings 210 are formed and subsequently cleaned while back grinding or supporting tape 204 is attached over interconnect structure 190. By forming openings 210 through encapsulant 186 and PCB units 146a-146c in a peripheral region of semiconductor die 124, a portion of conductive pads 142 is exposed from a backside of encapsulant 186. Openings 210 are configured to provide subsequent 3D electrical interconnect for semiconductor die 124. In one embodiment, a finish such as Cu organic solderability preservative (OSP) is be applied to exposed conductive pads 142 to prevent Cu oxidation. In an alternative embodiment, solder paste is printed on a surface of conductive pads 142 and reflowed to form a solder cap and protect the surface of conductive pads 142.

Figure 9H:
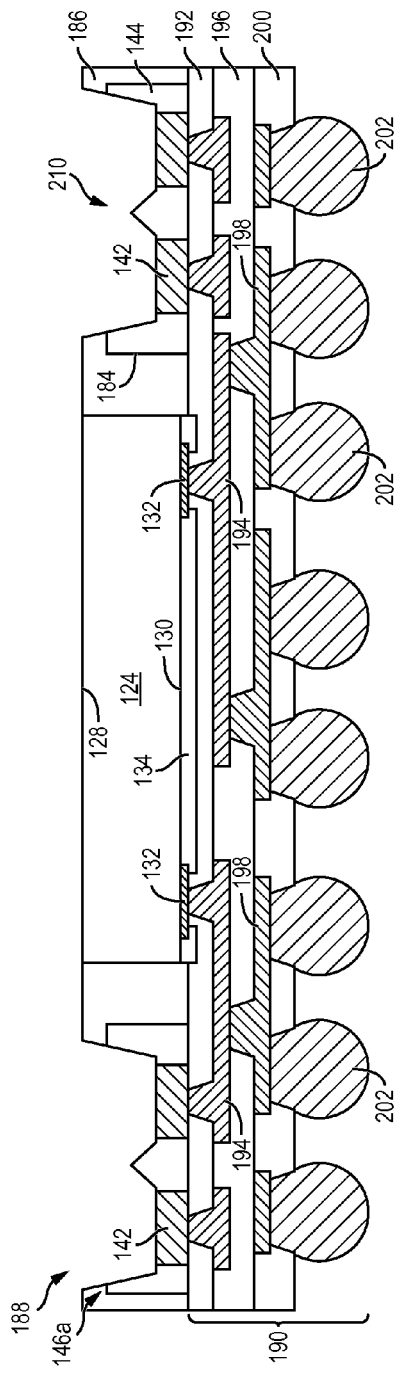

In FIG. 9h, backgrinding tape 204 is removed after openings 210 are formed. Reconstituted wafer 188 includes semiconductor die 124 and PCB units 146a-146c embedded in encapsulant 186. Conductive pads 142 are exposed through openings 210 formed through encapsulant 186 and through insulating layer 144 of PCB units 146a-146c. Interconnect structure 190 electrically connects semiconductor die 124 to conductive pads 142 outside a footprint of semiconductor die 124.

Figure 9I:
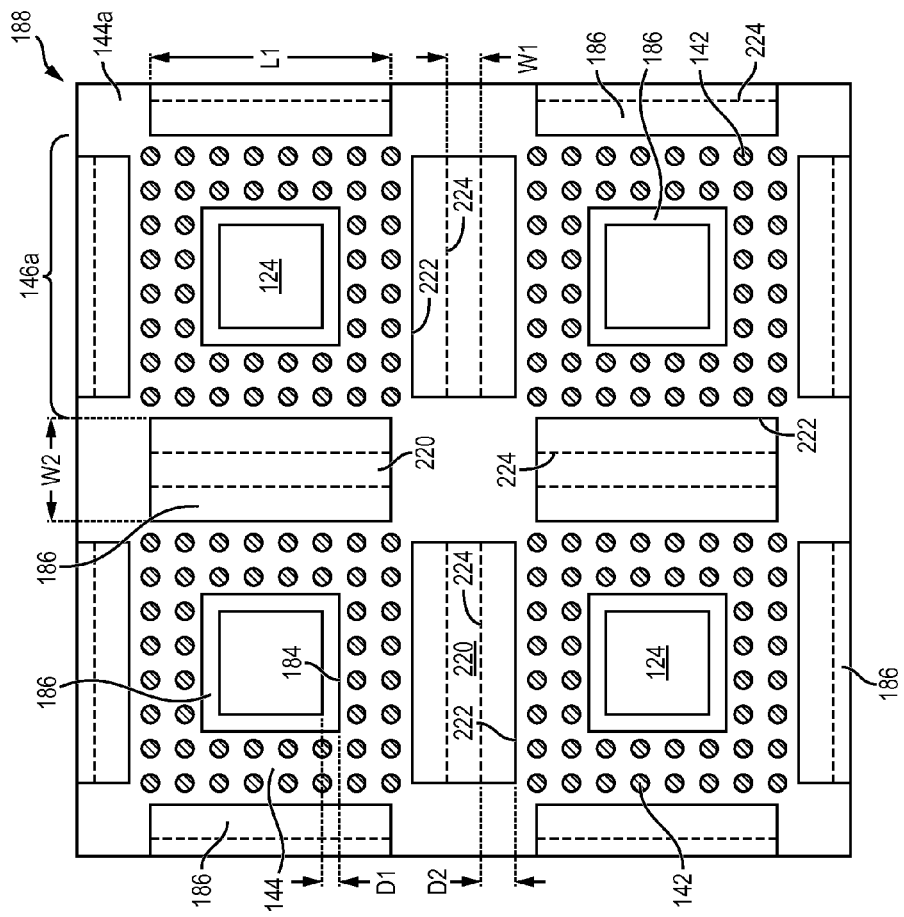

FIG. 9i shows a plan view of the 3D fan-out semiconductor package with an embedded substrate and vertical interconnections from FIG. 9h. PCB units 146a and semiconductor die 124 are embedded in encapsulant 186. Each semiconductor package at the reconstituted wafer level is separated by saw streets 220 having a width W1 of at least 25 µm. Semiconductor die 124 are mounted within the openings of each PCB unit 146a. The clearance or distance D1 between inner edge 184 of PCB units 146a and semiconductor die 124 is at least 25 µm. Encapsulant 186 is formed between an outer edge 222 of PCB units 146a and edge 224 of a semiconductor package defined by saw streets 220. The clearance or distance D2 between outer edge 222 of PCB units 146a and saw streets 220 is greater than 0 µm. Alternatively, outer edge 222 of PCB units 146a defines the edge of the semiconductor package and no encapsulant is formed between PCB units 146a and saw streets 220. PCB units 146a are separated by a gap having a width W2 and a length L1. Length L1 represents the distance between portions 144a of insulating layer 144. Width W2 represents the distance between PCB units 146a. Encapsulant 186 fills the gap between PCB units 146a at the reconstituted wafer level. Width W1 and length L1 can be any dimension suitable for providing stress relief to the semiconductor package. Alternatively, no gap is formed between PCB units 146a, and saw streets 220 remain filled with insulating layer 144 prior to singulation.

Figure 9J:
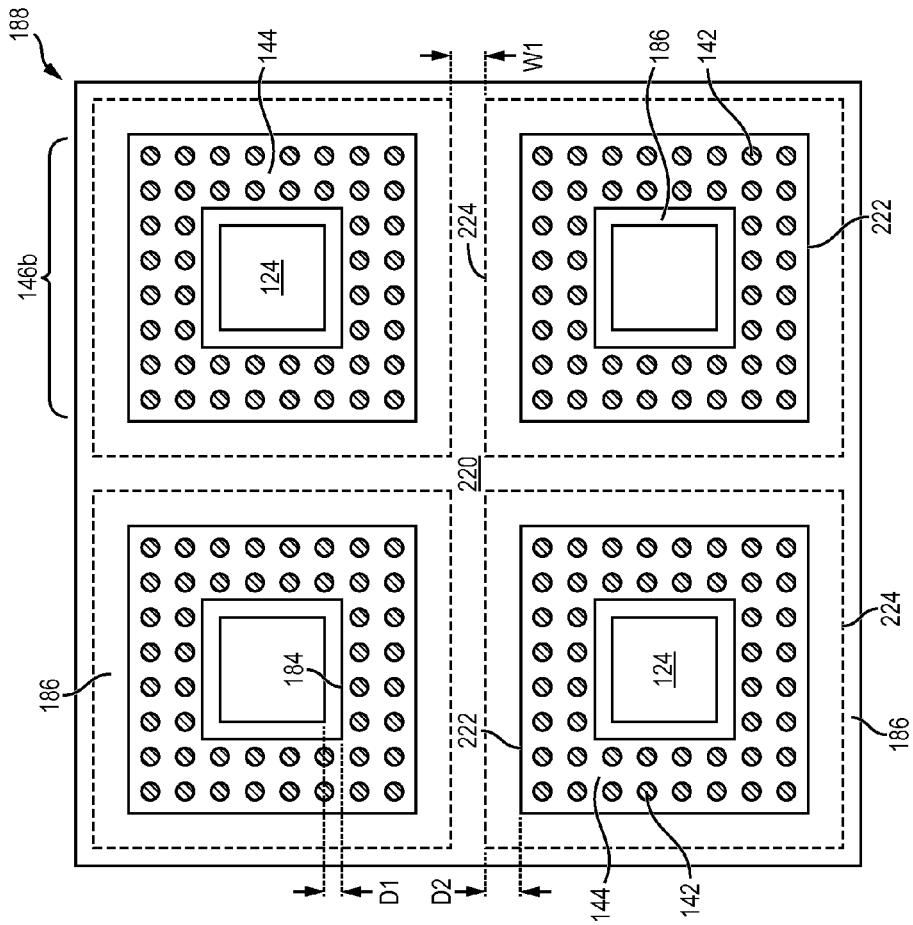

FIG. 9j shows a plan view of an alternative 3D fan-out semiconductor package with an embedded substrate and vertical interconnections. PCB units 146b and semiconductor die 124 are embedded in encapsulant 186. Each semiconductor package at the reconstituted wafer level is separated by saw streets 220 having a width W1 of at least 25 µm. Semiconductor die 124 are mounted within the openings of each PCB unit 146b. The clearance or distance D1 between inner edge 184 of PCB units 146a and semiconductor die 124 is at least 25 µm. Encapsulant 186 is formed between an outer edge 222 of PCB units 146b and edge 224 of a semiconductor package defined by saw streets 220. The clearance or distance D2 between outer edge 222 of PCB units 146b and saw streets 220 is greater than 0 µm. Alternatively, outer edge 222 of PCB units 146a defines the edge of the semiconductor package and no encapsulant is formed between PCB units 146a and saw streets 220.

Figure 9K:
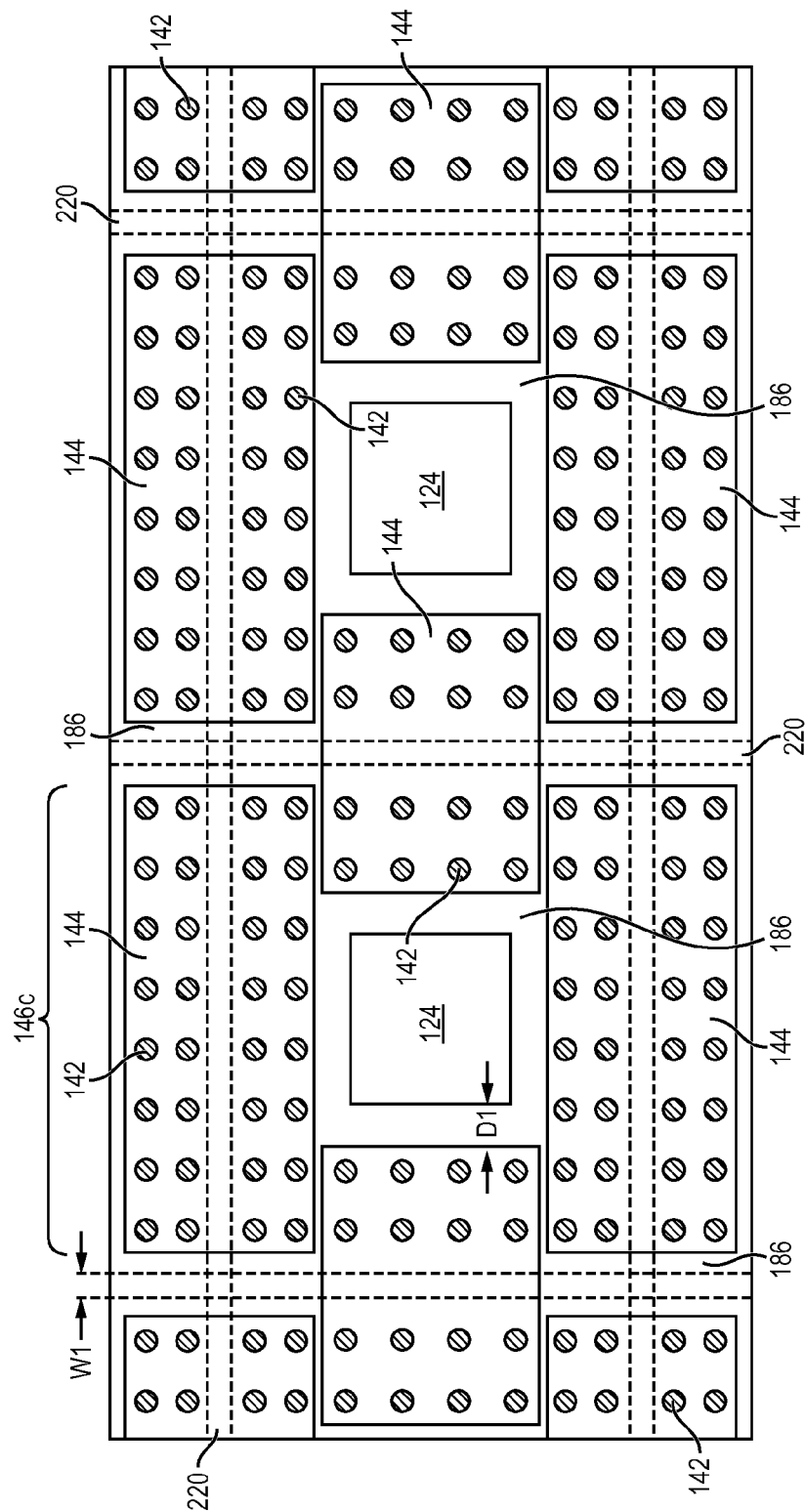

FIG. 9k shows a plan view of an alternative 3D fan-out semiconductor package with an embedded substrate and vertical interconnections. PCB units 146c are placed around each side of semiconductor die 124. PCB units 146c are separate from adjacent PCB units 146c, and PCB units 146c are positioned with spaces or gaps for semiconductor die 124. PCB units 146c and semiconductor die 124 are embedded in encapsulant 186. Each semiconductor package at the reconstituted wafer level is separated by saw streets 220 having a width W1 of at least 25 µm. Each of the plurality of PCB units 146c are shared by two adjacent semiconductor die 124. For example, a PCB unit 146c is separated by saw streets 220 such that the PCB unit 146c is divided between two semiconductor packages.

FIG. 9l shows a low profile 3D Fo-PoP semiconductor device. Bumps 228 are formed by depositing an electrically conductive bump material over conductive pads 142 and within openings 210 using an evaporation, electrolytic plating, electroless plating, ball drop, screen printing compression bonding, or other suitable process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive pads 142 using a suitable attachment or bonding process. In one embodiment, the bump material is reflowed by heating the material above its melting point to form spherical balls or bumps 228. In some applications, bumps 228 are reflowed a second time to improve electrical contact to conductive pads 142. Bumps 228 represent one type of interconnect structure that can be formed over conductive pads 142. The interconnect structure can also use bond wires, conductive paste, stud bump, micro bump, or other electrical interconnect. In one embodiment, bumps 228 have a height that is less than a height of openings 210. In another embodiment, bumps 228 have a height that is greater than a height of openings 210.

After the formation of bumps 228, reconstituted wafer 188 is singulated using a saw blade or laser cutting tool to form Fo-PoP 230. Fo-PoP 230 provides 3D electrical interconnection with a fan-out, embedded PCB with vertical interconnects formed outside a footprint of semiconductor die 124. Conductive pads or pillars 142 form vertical interconnects and electrically connect to interconnect structure 190 and to bumps 228. Accordingly, a 3D interconnection for next level interconnection is formed through bumps 228, conductive pads 142, build-up interconnect structure 190, and semiconductor die 124. The 3D interconnection provides horizontal and vertical electrical interconnection for semiconductor die 124 without a backside interconnect or RDL over a footprint of semiconductor die 124. Fo-PoP 230 includes fine pitch interconnections, where a pitch between bumps 228 is 0.50 mm or less. In one embodiment, conductive pads 142 have a height H1 of at least 20 µm and less than 100 µm. In another embodiment, the height H1 of conductive pads 142 is at least one half the height of semiconductor die 124. In one embodiment, insulating layer 144 has a height H2 of at least 30 µm. In another embodiment, insulating layer 144 has a height H2 of at least one and a half times height H1 of conductive pads 142. In yet another embodiment, insulating layer 144 has a height H2 which is equal to the height of semiconductor die 124. The smaller package profile of Fo-PoP 230 improves the thermal performance, electrical performance, and warpage behavior of the semiconductor device by creating a thin, 3D PoP device.

FIG. 10 shows a stacked 3D Fo-PoP with an embedded substrate and vertical interconnections. Stacked semiconductor device 232 includes semiconductor device 234 stacked over Fo-PoP 230. Semiconductor device 234 includes semiconductor die 236 mounted over interposer 238. In one embodiment, bumps of semiconductor device 234 are mounted over bumps 228 of Fo-PoP 230 and are reflowed to merge and form bumps 240 and to electrically connect semiconductor device 234 to Fo-PoP 230.

FIG. 11 shows a stacked 3D Fo-PoP mounted to a substrate. Stacked semiconductor device 250 includes Fo-PoP 230 mounted to circuit board or substrate 252 and semiconductor device 234 stacked over Fo-PoP 230. In one embodiment, Fo-PoP 230 is mounted to circuit board or substrate 252 using surface mount technology (SMT), and semiconductor device 234 is disposed over Fo-PoP 230. Bumps 202 and 254 are reflowed at the same time to electrically connect Fo-PoP 230 to semiconductor device 234 and to substrate 252.

FIG. 12 shows an alternative embodiment of the 3D Fo-PoP including a backside support layer. Prior to mounting semiconductor die 124 within the openings of PCB units 146a-146b or between PCB units 146c, a die stack 258 is formed. Die stack 258 is formed by mounting semiconductor wafer 120 from FIG. 3c to a supporting substrate, supporting layer, or silicon dummy wafer 260 with a back surface of semiconductor wafer 120 oriented toward supporting substrate 260. Supporting substrate 260 contains base material such as metal, silicon, polymer, polymer composite, ceramic, glass, glass epoxy, beryllium oxide, or other suitable low-cost, rigid material or bulk semiconductor material for structural support. A CTE of supporting substrate 260 is selected according to the configuration and design of a final package structure and application such that a CTE of the substrate produces a tuning effect with respect to the final semiconductor package. In one embodiment, supporting substrate 260 includes a material selected to have a CTE very close to a CTE of silicon, e.g., low CTE glass. Properties of supporting substrate 260 including thickness, mechanical strength, thermal properties, and insulation are selected according to the configuration and design of a final package structure and application. Supporting substrate 260 provides additional support for thinned semiconductor wafer 120 and protects back surface 128 of semiconductor die 124. Supporting substrate 260 prevents breakage of thinned base substrate material 122 during handling and processing of the subsequently formed semiconductor packages. Supporting substrate 260 also assists with warpage control for base substrate material 122 of the semiconductor wafer and semiconductor die 124.

An adhesive, bonding layer, interface layer, or composite protection layer 262 is formed over supporting substrate 260. Protection layer 262 is a die attach adhesive, epoxy, or other adhesive material. The material for protection layer 262 is selected to have good thermal conductivity and mechanical strength. In one embodiment, protection layer is fiber or filler enhanced polymer matrix composite material. In one embodiment, protection layer 262 has a thickness greater than 5 µm and is laminated to supporting substrate 260. Back surface 128 of semiconductor wafer 120 is mounted to protection layer 262 over supporting substrate 260. Alternatively, back surface 128 of semiconductor wafer 120 is mounted directly to supporting substrate 260 rather than to protection layer 262.

Thinned semiconductor wafer 120, supporting substrate 260, and protection layer 262 are singulated through saw street 126 using a saw blade or laser cutting tool into individual die stack 258. Supporting substrate 260 is coextensive with semiconductor die 124 such that an area of a footprint of supporting substrate 260 is equal to an area of a footprint of semiconductor die 124. Thinned semiconductor die 124 with supporting substrate 260 provide a reduced height for packages requiring reduced package heights and further provide additional structural support, reduce package warpage, and facilitate subsequent processing and handling.

Die stacks 258 are mounted to interface layer 182 and carrier 180, similar to the process shown in FIG. 9b, using a pick and place operation with active surface 130 oriented toward carrier 180. Die stacks 258 are processed according to the process shown in FIGS. 9c-9l. After encapsulation, supporting substrate 260 provides additional protection for semiconductor die 124 to prevent mechanical damage resulting from the grinding operation. Alternatively, supporting substrate 260 can be completely removed during the grinding operation, leaving part of protection layer 262 over semiconductor die 124. Fo-PoP 264 in FIG. 12 includes supporting substrate 260 over protection layer 262, which is formed over semiconductor die 124. Fo-PoP 264 provides 3D electrical interconnection with a fan-out, embedded PCB with vertical interconnects formed outside a footprint of semiconductor die 124. Fo-PoP 264 includes fine pitch interconnections, where a pitch between conductive pads 142 is 0.50 mm or less. In one embodiment, conductive pads 142 have a height of at least 20 μm and less than 100 μm. In another embodiment, the height of conductive pads 142 is at least one half the height of semiconductor die 124 or die stack 258. In one embodiment, insulating layer 144 has a height of at least 30 μm. In another embodiment, insulating layer 144 has a height of at least one and a half times height of conductive pads 142. In yet another embodiment, insulating layer 144 has a height which is equal to the height of semiconductor die 124 or die stack 258. The smaller package profile of Fo-PoP 264 improves the thermal performance, electrical performance, and warpage behavior of the semiconductor device by creating a thin, 3D PoP device.

Figure 13:
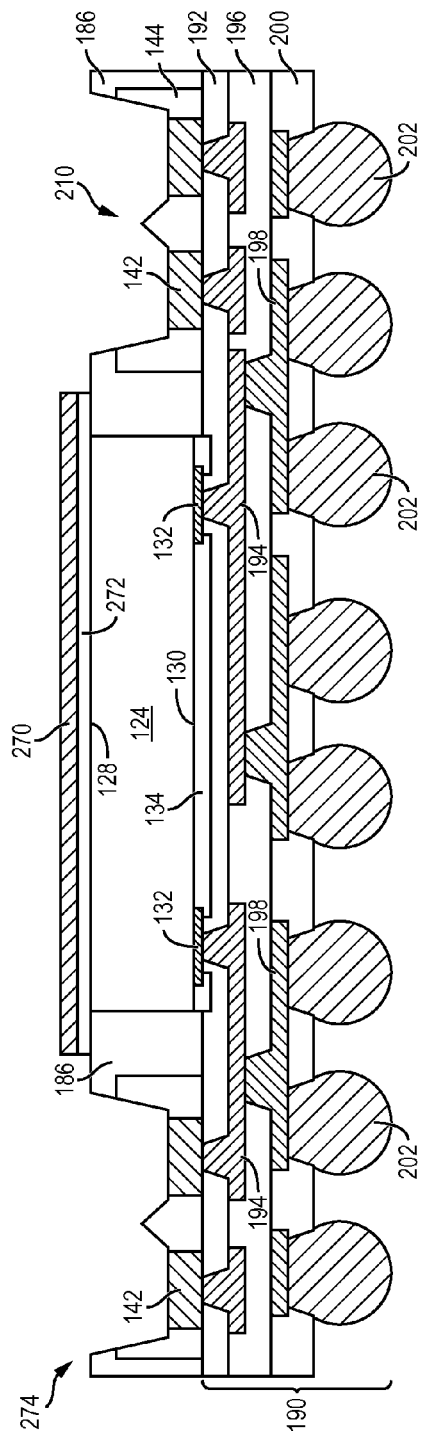
FIG. 13 illustrates another 3D Fo-PoP including a heat sink.

FIG. 13 an alternative embodiment of the 3D Fo-PoP including a heat sink layer. Continuing from FIG. 9h, an electrically conductive layer 270 and adhesive, bonding, or insulation layer 272 is formed on the backside of encapsulant 186 and semiconductor die 124 before or after the formation of openings 210. In one embodiment, conductive layer 270 acts as a heat sink to enhance thermal dissipation from semiconductor die 124 and to improve thermal performance of 3D Fo-PoP 274. In another embodiment, conductive layer 270 acts as a shielding layer for blocking or absorbing EMI, RFI, harmonic distortion, and other interference. Fo-PoP 274 provides 3D electrical interconnection with a fan-out, embedded PCB with vertical interconnects formed outside a footprint of semiconductor die 124.

Figure 14:
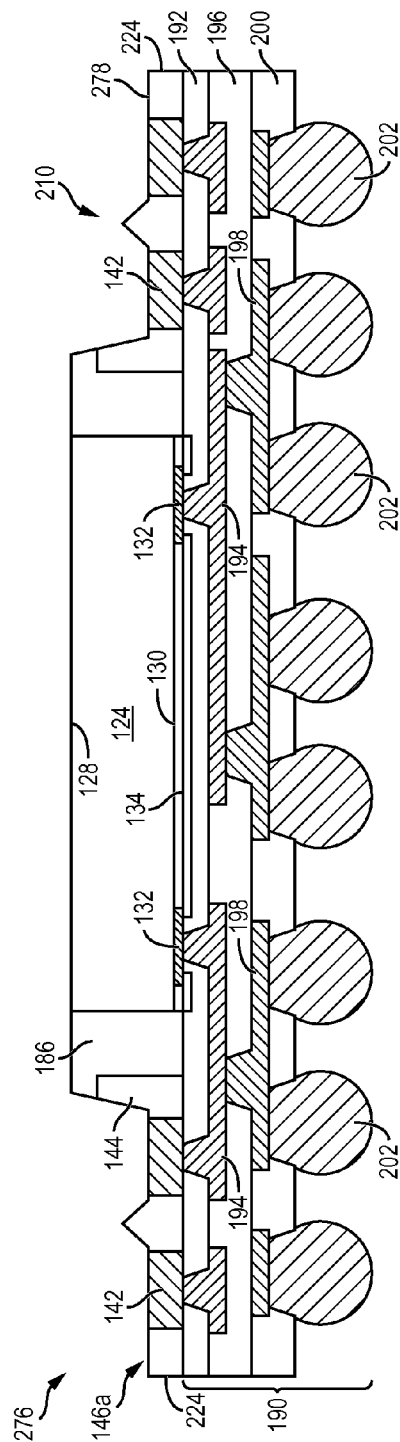
FIG. 14 illustrates another 3D Fo-PoP including an embedded substrate and vertical interconnections.

FIG. 14 shows an alternative embodiment of the 3D Fo-PoP with additional encapsulant removed. Fo-PoP 276 is formed by a process similar to the process shown in FIGS. 9a-9l. When openings 210 are formed by removing a portion of encapsulant 186 and insulating layer 144 in PCB units 146a-146b, additional encapsulant 186 and insulating layer 144 is removed in a region peripheral to semiconductor die 124 and conductive pads 142. A portion of encapsulant 186 and insulating layer 144 is removed at edge 224 of Fo-PoP 276 by drilling, LDA, high energy water jetting, etching, or other suitable process. A height of insulating layer 144 is the same as a height of conductive pads 142, such that a portion of insulating layer 144 and conductive pads 142 are coplanar at surface 278. If encapsulant 186 is formed around PCB units 146a-146b, a portion of encapsulant 186 around PCB units 146a-146b is also removed such that encapsulant is co-planar to surface 278.

Figure 15A:
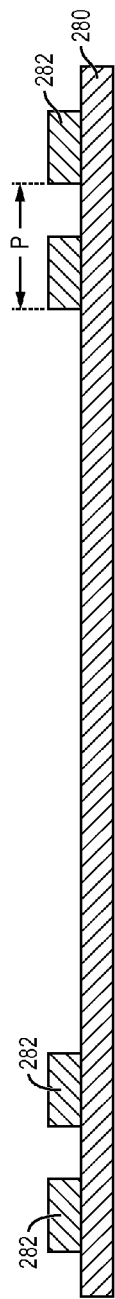

FIGS. 15a-15e illustrate, in relation to FIGS. 1 and 2a-2c, another process of forming a substrate with vertical interconnects for a 3D Fo-PoP having a dual encapsulant and support layer. In FIG. 15a, an electrically conductive layer 280 is formed using a metal deposition process such as Cu foil lamination, printing, PVD, CVD, sputtering, electrolytic plating, and electroless plating. Conductive layer 280 can be one or more layers of Cu, Sn, Ni, Au, Ag, Ti, W, or other suitable electrically conductive material. In one embodiment, conductive layer 280 is Cu foil or Cu film. Conductive layer, conductive pads, or conductive pillars 282 are formed over conductive layer 280. Conductive pads 282 are Cu, Sn, Ni, Au, Ag, Ti, W, or other suitable electrically conductive material. Conductive pads 282 are deposited or patterned over conductive layer 280 using Cu foil lamination, printing, PVD, CVD, sputtering, electrolytic plating, electroless plating, etch-back, or combination of processes. Conductive layer 280 acts as a supporting layer for conductive pads 282. In one embodiment, conductive pads 282 are Cu and are formed using an etch-back process. Conductive pads 282 have a height of at least 20 μm. In one embodiment, conductive pads 282 have a height of 100 μm or less. A pitch P of conductive pads 282 is 0.50 mm or less. Conductive layer 282 may include an optional Cu pattern or circuit components formed over conductive layer 280.

Figure 15B:

In FIG. 15b, an encapsulant or molding compound 284 is deposited over conductive layers 280 and 282 using a paste printing, compressive molding, transfer molding, liquid encapsulant molding, vacuum lamination, spin coating, or other suitable applicator. Encapsulant 284 can be polymer composite material, such as epoxy resin with filler, epoxy acrylate with filler, or polymer with proper filler. Encapsulant 284 is non-conductive and acts as a support layer. In one embodiment, encapsulant 284 includes a material selected to have a CTE similar to a CTE of Cu, i.e., within 10 ppm/° C. of the CTE of Cu.

Figure 15C:
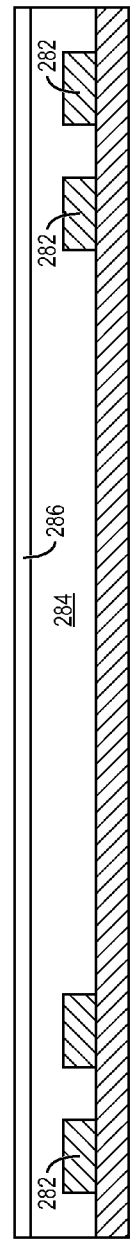

In FIG. 15c, an insulating or passivation layer 286 is formed over encapsulant 284. Insulating layer 286 includes one or more laminated layers of prepreg, FR-4, FR-1, CEM-1, or CEM-3, or other material having similar insulating and structural properties. Insulating layer 286 further includes an epoxy, resin, or polymer with a reinforcement fiber or fabric, such as phenolic cotton paper, epoxy, resin, woven glass, matte glass, polyester, and other reinforcement fibers or fabrics. In an alternative embodiment, insulating layer 286 contains a molding compound, polymer dielectric with or without fillers, one or more layers of SiO2, Si3N4, SiON, Ta2O5, Al2O3, or other material having similar insulating and structural properties. Insulating layer 286 is deposited using vacuum or pressure lamination with or without heat, PVD, CVD, screen printing, spin coating, spray coating, injection coating, sintering, thermal oxidation, or other suitable process. In one embodiment, insulating layer 286 is a prepreg sheet, roll, or tape including a polymer matrix enhanced with woven glass fiber and deposited using vacuum or pressure lamination with or without heat. In an alternative embodiment, insulating layer 286 includes a material selected to have a CTE similar to a CTE of Cu, i.e., within 10 ppm/° C. of the CTE of Cu. The material selected for insulating layer 286, such as prepreg, enhances the overall strength of the semiconductor package and improves package warpage, particularly at temperatures of 150° C. to 260° C.

Figure 15D:
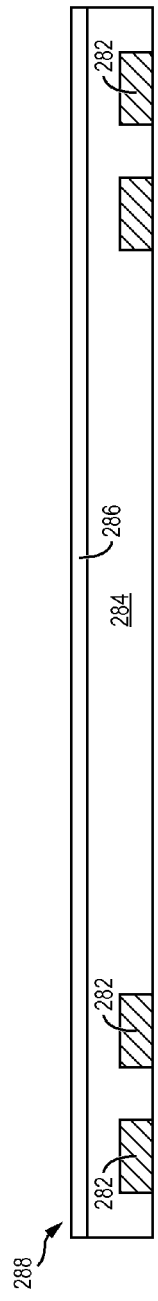

In FIG. 15d, conductive layer 280 is completely removed by etching or other suitable process. Conductive pads 282 remain embedded in insulating layer 286. Insulating layer 286 and embedded conductive pads 282 together constitute a substrate or PCB panel 288.

In FIG. 15e, a portion of PCB panel 288 is removed by punching, stamping, water jet cutting, mechanical drilling or cutting, LDA using laser 290, etching, or other suitable process to form openings 300. PCB panel 288 forms a preprepared fiber enhanced composite sheet that includes openings 300. Openings 300 are formed centrally with respect to conductive pads 282. Openings 300 are formed completely through insulating layer 286 of PCB panel 288 and extend from a first surface 302 of the PCB panel 288 to a second surface 304 of PCB panel 288 opposite the first surface. Openings 300 are square, rectangular, circular, oval, polygon, or any other shape. A size of openings 300 provides a space for subsequently mounting semiconductor die. In one embodiment, openings 300 have a generally square footprint and are formed large enough to accommodate semiconductor die or components 124 from FIG. 3c. Additionally, PCB panel 288 is separated into individual PCB units 288a along edge 306 by a similar process used to form openings 300, such as punching, stamping, water jet cutting, mechanical sawing or cutting, LDA using laser 290, etching, or other suitable process. PCB panel 288 may be separated into individual PCB units 288a in the same process step as forming openings 300. For example, in a punching or stamping process, PCB panel 288 is separated into individual PCB units 288a, while simultaneously, openings 300 are formed. In an alternative embodiment, PCB panel 288 is separated into individual PCB units without opening 300 and having a square, rectangular, cross-shaped (+), angled or "L-shaped," circular, oval, hexagonal, octagonal, star shaped, or any geometrically shaped footprint.

FIGS. 16a-16e illustrate, in relation to FIGS. 1 and 2a-2c, another process of forming a substrate with vertical interconnects for a 3D Fo-PoP having a dual encapsulant and support layer. In FIG. 16a, conductive layer 280 is formed using a metal deposition process such as Cu foil lamination, printing, PVD, CVD, sputtering, electrolytic plating, and electroless plating. Conductive layer 280 can be one or more layers of Cu, Sn, Ni, Au, Ag, Ti, W, or other suitable electrically conductive material. In one embodiment, conductive layer 280 is Cu foil or Cu film. Conductive layer 280 may be formed over a carrier for structural support. Conductive layer, conductive pads, or conductive pillars 282 are formed over conductive layer 280. Conductive pads 282 are Cu, Sn, Ni, Au, Ag, Ti, W, or other suitable electrically conductive material. Conductive pads 282 are deposited or patterned over conductive layer 280 using Cu foil lamination, printing, PVD, CVD, sputtering, electrolytic plating, electroless plating, etch-back, or combination of processes. Conductive layer 280 acts as a supporting layer for conductive pads 282. In one embodiment, conductive pads 282 are Cu and are formed using stamping or punching process. Openings 310 are formed in conductive layer 280 using a stamping process, punching process, or other suitable process. Openings 310 are formed adjacent to conductive pads 282 in an area for subsequently mounted semiconductor die. In one embodiment, conductive pads 282 have a height of 100 μm or less. A pitch P of conductive pads 282 is 0.50 mm or less. Conductive layer 282 may include an optional Cu pattern or circuit components formed over conductive layer 280.

In FIG. 16b, an encapsulant or molding compound 284 is deposited over conductive layers 280 and 282 using a paste printing, compressive molding, transfer molding, liquid encapsulant molding, vacuum lamination, spin coating, or other suitable applicator. Encapsulant 284 can be polymer composite material, such as epoxy resin with filler, epoxy acrylate with filler, or polymer with proper filler. Encapsulant 284 is non-conductive and acts as a support layer. In one embodiment, encapsulant 284 includes a material selected to have a CTE similar to a CTE of Cu, i.e., within 10 ppm/° C. of the CTE of Cu.

In FIG. 16c, an insulating or passivation layer 286 is formed over encapsulant 284. Insulating layer 286 includes one or more laminated layers of prepreg, FR-4, FR-1, CEM-1, or CEM-3, or other material having similar insulating and structural properties. Insulating layer 286 further includes an epoxy, resin, or polymer with a reinforcement fiber or fabric, such as phenolic cotton paper, epoxy, resin, woven glass, matte glass, polyester, and other reinforcement fibers or fabrics. In an alternative embodiment, insulating layer 286 contains a molding compound, polymer dielectric with or without fillers, one or more layers of $SiO_2$, $Si_3N_4$, SiON, $Ta_2O_5$, $Al_2O_3$, or other material having similar insulating and structural properties. Insulating layer 286 is deposited using vacuum or pressure lamination with or without heat, PVD, CVD, screen printing, spin coating, spray coating, injection coating, sintering, thermal oxidation, or other suitable process. In one embodiment, insulating layer 286 is a prepreg sheet, roll, or tape including a polymer matrix enhanced with woven glass fiber and deposited using vacuum or pressure lamination with or without heat. In an alternative embodiment, insulating layer 286 includes a material selected to have a CTE similar to a CTE of Cu, i.e., within 10 ppm/° C. of the CTE of Cu. The material selected for insulating layer 286, such as prepreg, enhances the overall strength of the semiconductor package and improves package warpage, particularly at temperatures of 150° C. to 260° C.

In FIG. 16d, conductive layer 280 is completely removed by etching or other suitable process to leave PCB panel 288 including conductive pads 282 embedded within insulating layer 286. A portion 314 of insulating layer 286 protrudes from PCB panel 288 after conductive layer 280 is removed. Surface 316 of insulating layer 286 is non-coplanar with surface 304 of insulating layer 286.

In FIG. 16e, a portion of PCB panel 288 is removed by punching, stamping, water jet cutting, mechanical drilling or cutting, LDA using laser 290, etching, or other suitable process to form openings 300. PCB panel 288 forms a preprepared fiber enhanced composite sheet that includes openings 300. Openings 300 are formed centrally with respect to conductive pads 282. Openings 300 are formed completely through insulating layer 286 of PCB panel 288 and extend from a first surface 302 of PCB panel 288 to a second surface 304 of PCB panel 288 opposite the first surface. Openings 300 are square, rectangular, circular, oval, polygon, or any other shape. A size of openings 300 provides a space for subsequently mounting semiconductor die. In one embodiment, openings 300 have a generally square footprint and are formed large enough to accommodate semiconductor die or components 124 from FIG. 3c. Additionally, PCB panel 288 is separated into individual PCB units 288a along edge 306 by a similar process used to form openings 300, such as punching, stamping, water jet cutting, mechanical sawing or cutting, LDA using laser 290, etching, or other suitable process. PCB panel 288 may be separated into individual PCB units 288a in the same process step as forming openings 300. For example, in a punching or stamping process, PCB panel 288 is separated into individual PCB units 288a, while simultaneously, openings 300 are formed. In an alternative embodiment, PCB panel 288 is separated into individual PCB units without opening 300 and having a square, rectangular, cross-shaped (+), angled or "L-shaped," circular, oval, hexagonal, octagonal, star shaped, or any geometrically shaped footprint.

Figure 17C:
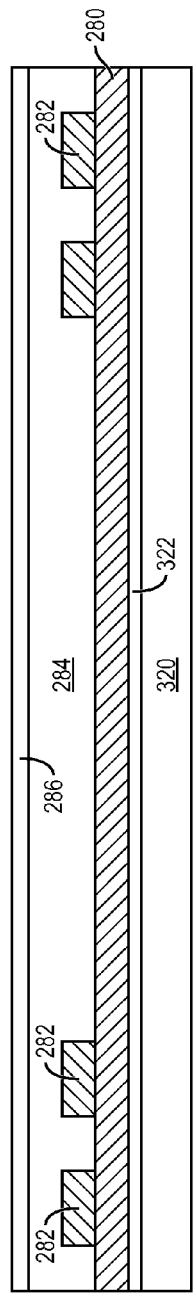

FIGS. 17a-17e illustrate, in relation to FIGS. 1 and 2a-2c, another process of forming a substrate with vertical interconnects for a 3D Fo-PoP having a dual encapsulant and support layer. FIG. 17a shows a portion of substrate or carrier 320 containing temporary or sacrificial base material such as silicon, steel, germanium, gallium arsenide, indium phosphide, silicon carbide, resin, beryllium oxide, glass, or other suitable low-cost, rigid material for structural support. An interface layer or double-sided tape 322 is formed over carrier 320 as a temporary adhesive bonding film, etch-stop layer, or release layer.

Conductive layer 280 is formed over interface layer 322 and carrier 320 using a metal deposition process such as Cu foil lamination, printing, PVD, CVD, sputtering, electrolytic plating, and electroless plating. Conductive layer 280 can be one or more layers of Cu, Sn, Ni, Au, Ag, Ti, W, or other suitable electrically conductive material. In one embodiment, conductive layer 280 is Cu foil or Cu film. Conductive layer, conductive pads, or conductive pillars 282 are formed over conductive layer 280. Conductive pads 282 are Cu, Sn, Ni, Au, Ag, Ti, W, or other suitable electrically conductive material. Conductive pads 282 are deposited or patterned over conductive layer 280 using Cu foil lamination, printing, PVD, CVD, sputtering, electrolytic plating, electroless plating, etch-back, or combination of processes. Conductive layer 280 acts as an additional supporting layer for conductive pads 282. In one embodiment, conductive pads 282 are Cu and are formed using an etch-back process. In one embodiment, conductive pads 282 have a height of 100 μm or less. A pitch P of conductive pads 282 is 0.50 mm or less. Conductive layer 282 may include an optional Cu pattern or circuit components formed over conductive layer 280.

In FIG. 17b, an encapsulant or molding compound 284 is deposited over conductive layers 280 and 282 using a paste printing, compressive molding, transfer molding, liquid encapsulant molding, vacuum lamination, spin coating, or other suitable applicator. Encapsulant 284 can be polymer composite material, such as epoxy resin with filler, epoxy acrylate with filler, or polymer with proper filler. Encapsulant 284 is non-conductive and acts as a support layer. In one embodiment, encapsulant 284 includes a material selected to have a CTE similar to a CTE of Cu, i.e., within 10 ppm/° C. of the CTE of Cu.

In FIG. 17c, an insulating or passivation layer 286 is formed over encapsulant 284. Insulating layer 286 includes one or more laminated layers of prepreg, FR-4, FR-1, CEM-1, or CEM-3, or other material having similar insulating and structural properties. Insulating layer 286 further includes an epoxy, resin, or polymer with a reinforcement fiber or fabric, such as phenolic cotton paper, epoxy, resin, woven glass, matte glass, polyester, and other reinforcement fibers or fabrics. In an alternative embodiment, insulating layer 286 contains a molding compound, polymer dielectric with or without fillers, one or more layers of SiO2, Si3N4, SiON, Ta2O5, Al2O3, or other material having similar insulating and structural properties. Insulating layer 286 is deposited using vacuum or pressure lamination with or without heat, PVD, CVD, screen printing, spin coating, spray coating, injection coating, sintering, thermal oxidation, or other suitable process. In one embodiment, insulating layer 286 is a prepreg sheet, roll, or tape including a polymer material enhanced with woven glass fiber and deposited using vacuum or pressure lamination with or without heat. In an alternative embodiment, insulating layer 286 includes a material selected to have a CTE similar to a CTE of Cu, i.e., within 10 ppm/° C. of the CTE of Cu. The material selected for insulating layer 286, such as prepreg, enhances the overall strength of the semiconductor package and improves package warpage, particularly at temperatures of 150° C. to 260° C.

Figure 17D:
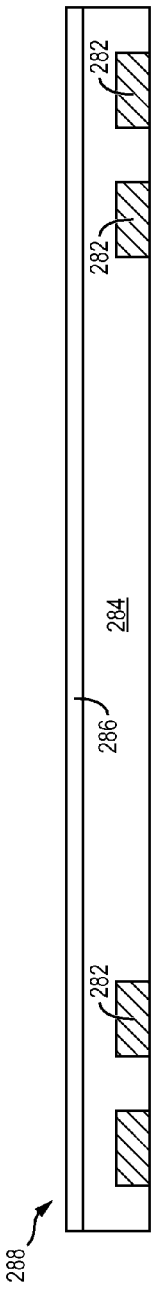

In FIG. 17d, carrier 320 and interface layer 322 are removed from PCB 288 by chemical etching, mechanical peeling, CMP, mechanical grinding, thermal bake, UV light, laser scanning, or wet stripping. Additionally, conductive layer 280 is completely removed by etching or other suitable process to leave PCB panel 288 including conductive pads 282 embedded in insulating layer 286.

Figure 17E:
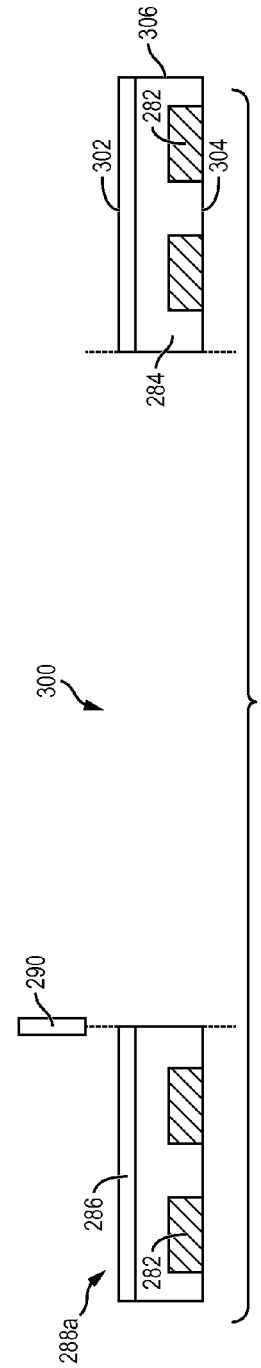

In FIG. 17e, a portion of PCB panel 288 is removed by punching, stamping, water jet cutting, mechanical drilling or cutting, LDA using laser 290, etching, or other suitable process to form openings 300. PCB panel 288 forms a pre-prepared fiber enhanced composite sheet that includes openings 300. Openings 300 are formed centrally with respect to conductive pads 282. Openings 300 are formed completely through insulating layer 286 of PCB panel 288 and extend from a first surface 302 of the PCB panel 288 to a second surface 304 of PCB panel 288 opposite the first surface. Openings 300 are square, rectangular, circular, oval, polygon, or any other shape. A size of openings 300 provides a space for subsequently mounting semiconductor die. In one embodiment, openings 300 have a generally square footprint and are formed large enough to accommodate semiconductor die or components 124 from FIG. 3c. Additionally, PCB panel 288 is separated into individual PCB units 288a along edge 306 by a similar process used to form openings 300, such as punching, stamping, water jet cutting, mechanical sawing or cutting, LDA using laser 290, etching, or other suitable process. PCB panel 288 may be separated into individual PCB units 288a in the same process step as forming openings 300. For example, in a punching or stamping process, PCB panel 288 is separated into individual PCB units 288a, while simultaneously, openings 300 are formed. In an alternative embodiment, PCB panel 288 is separated into individual PCB units without opening 300 and having a square, rectangular, cross-shaped (+), angled or "L-shaped," circular, oval, hexagonal, octagonal, star shaped, or any geometrically shaped footprint.

Figure 18A:
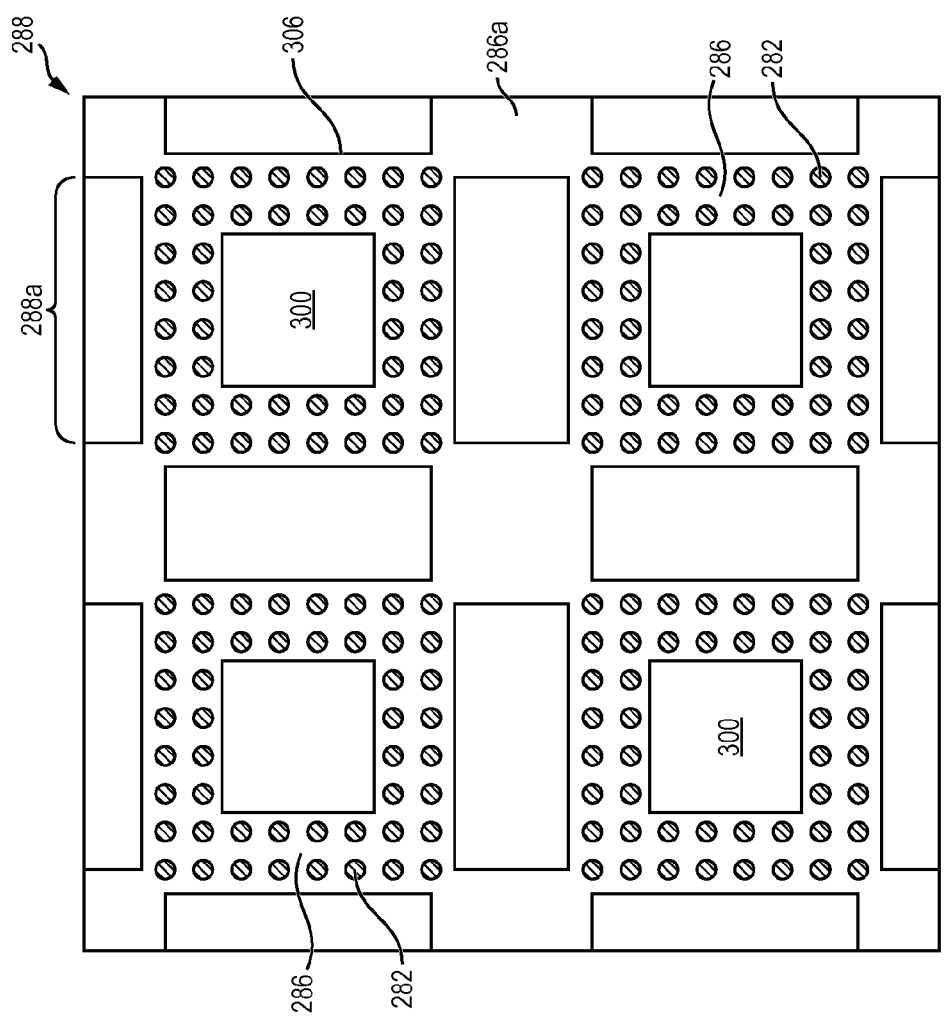
FIGS. 18a-18b illustrate a plan view of a substrate with vertical interconnects for a 3D Fo-PoP.
Figure 18B:
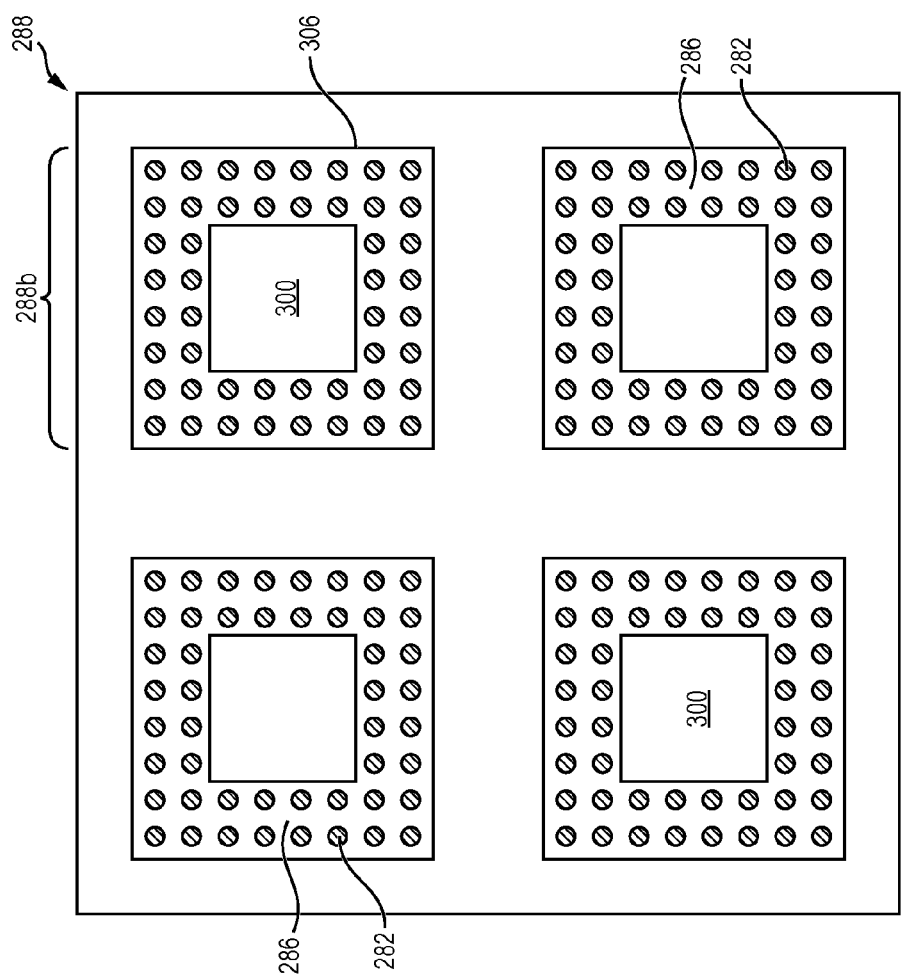

FIGS. 18a-18b show a plan view of a substrate with vertical interconnects for a 3D Fo-PoP having a dual encapsulant and support layer. FIG. 18a continues from FIG. 15e, 16e, or 17e and shows PCB panel 288 formed into individual PCB units 288a with openings 300. Individual PCB units 288a may be connected by portion 286a of insulating layer 286. Portion 286a of insulating layer 286 provides stress relief for the PCB panel 288. Alternatively, PCB panel 288 may be completely separated into individual PCB units 288b unconnected by a portion of PCB panel 288, as shown in FIG. 18b. PCB units 288a and 288b contain multiple rows of conductive pads 282. Conductive pads 282 can be disposed side-by-side a first distance from the edge of insulating layer 286. Alternatively, conductive pads 282 can be offset in multiple rows such that a first row of conductive pads 282 is disposed a first distance openings 300, and a second row of conductive pads 282 alternating with the first row is disposed a second distance from openings 300. In another embodiment, PCB units formed from PCB panel 288 do not include opening 300, rather, PCB units are configured in a shape appropriate for placement around the sides of semiconductor die 124 from FIG. 3c or to provide an area for placement of semiconductor die 124. PCB units may including an include interlocking footprints having square and rectangular shapes, a cross-shape (+), an angled or "L-shape," a circular or oval shape, a hexagonal shape, an octagonal shape, a star shape, or any other geometric shape.

Figure 19D:
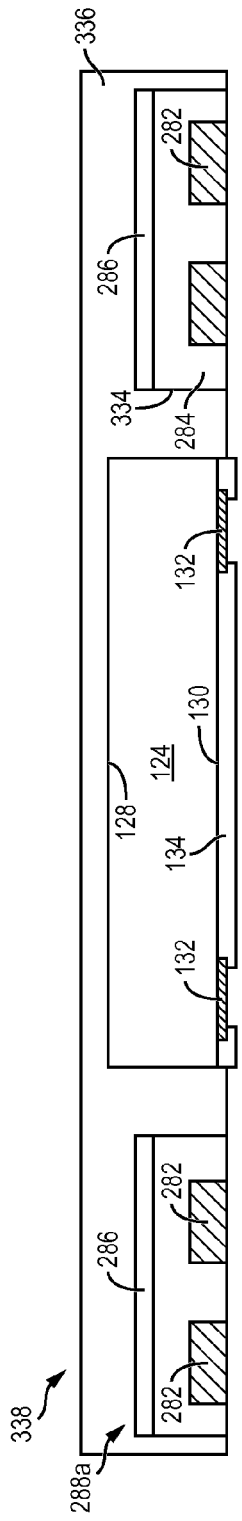

FIGS. 19a-19h illustrate, in relation to FIGS. 1 and 2a-2c, a process of forming a 3D Fo-PoP with an embedded substrate and vertical interconnections and with a dual encapsulant and support layer. In FIG. 19a, PCB panel 288 having individual PCB units 288a is aligned with and laminated on temporary carrier 330 and interface layer 332. Temporary carrier or substrate 330 contains temporary or sacrificial base material such as silicon, steel, germanium, gallium arsenide, indium phosphide, silicon carbide, resin, beryllium oxide, glass, or other suitable low-cost, rigid material for structural support. An interface layer or double-sided tape 332 is formed over carrier 330 as a temporary adhesive bonding film, etch-stop layer, or release layer. Alternatively, individual PCB units 288b are mounted and laminated temporary carrier 330 and interface layer 332 using a pick and place operation. Prior to laminating PCB units 288a-288b to carrier 330, alignment or dummy semiconductor die can be placed on the carrier 330 and interface layer 332. In one embodiment, PCB units 288a-288b are held by a transparent vacuum chuck for alignment before placing PCB units 288a-288b on carrier 330 and laminating.

In FIG. 19b, semiconductor die 124 from FIG. 3c are mounted to interface layer 332 and carrier 330 using a pick and place operation with active surface 130 oriented toward the carrier. In one embodiment, semiconductor die 124 is a flipchip type device. In another embodiment, semiconductor die 124 may be a semiconductor package, such as a Fo-WLCSP without bumps, bond wire package, flipchip LGA, flipchip BGA without bumps, or QFN package. Semiconductor die 124 are pressed into interface layer 332 such that insulating layer 134 is disposed into the interface layer. The clearance or distance between the inner edge 334 of insulating layer 286 of PCB units 288a-288b and semiconductor die 124 is at least 25 µm.

In FIG. 19c, an encapsulant or molding compound 336 is deposited over semiconductor die 124, PCB units 288a-288b, temporary carrier 330, and interface layer 332 using a paste printing, compressive molding, transfer molding, liquid encapsulant molding, vacuum lamination, spin coating, or other suitable applicator. Encapsulant 336 can be polymer composite material, such as epoxy resin with filler, epoxy acrylate with filler, or polymer with proper filler. In one embodiment, a material for encapsulant 336 is selected to be the same material as encapsulant 284. In another embodiment, a material for encapsulant 336 is selected to have a similar CTE as encapsulant 284. Encapsulant 336 is non-conductive and environmentally protects the semiconductor device from external elements and contaminants. Prior to depositing encapsulant, the structure may undergo a high pressure annealing process. Encapsulant 336 and embedded semiconductor die 124 and PCB units 288a-288b form a fan-out composite substrate or reconstituted wafer 338.

In FIG. 19d, carrier 330 and interface layer 332 are removed by chemical etching, mechanical peeling, CMP, mechanical grinding, thermal bake, UV light, laser scanning, or wet stripping to facilitate the formation of an interconnect structure over active surface 130 of semiconductor die 124, PCB units 288a-288b, and encapsulant 336.

Figure 19E:
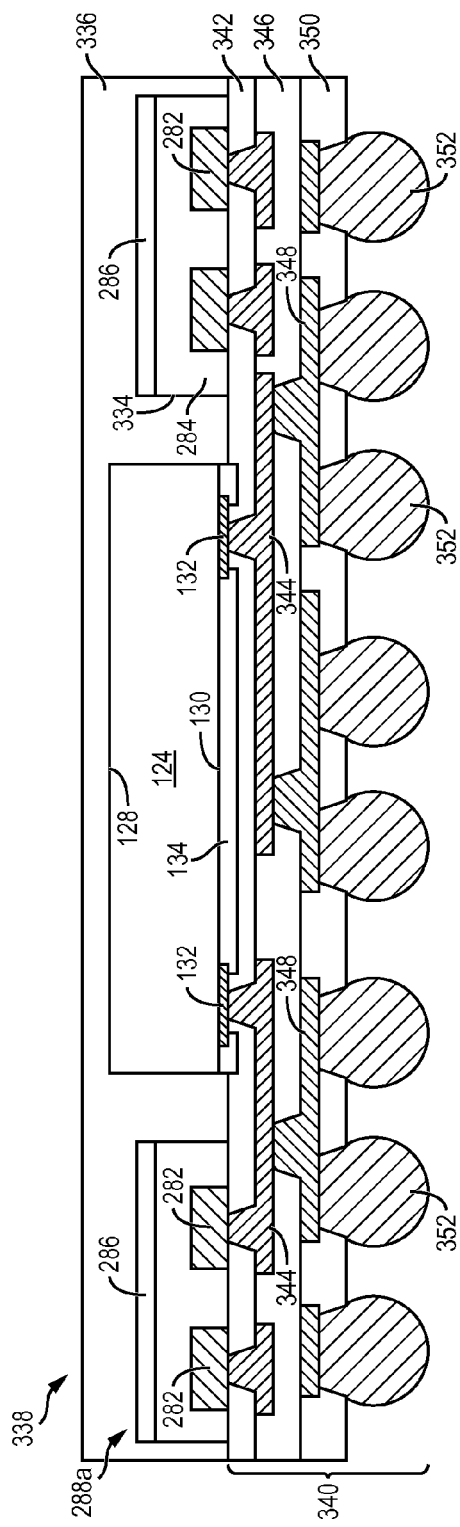

In FIG. 19e, a build-up interconnect structure 340 is formed over semiconductor die 124, PCB units 288a-288b, and encapsulant 336. An insulating or passivation layer 342 is formed over semiconductor die 124, PCB units 288a-288b, and encapsulant 336 using PVD, CVD, printing, slit coating, spin coating, spray coating, injection coating, lamination, sintering, or thermal oxidation. The insulating layer 342 contains one or more layers of SiO2, Si3N4, SiON, Ta2O5, Al2O3, polymer dielectric resist with or without fillers or fibers, or other material having similar structural and insulating properties. A portion of insulating layer 342 is removed by an exposure or development process, LDA, etching, or other suitable process to form openings over conductive pads 282 of PCB units 288a-288b and over conductive layer 132 of semiconductor die 124.

An electrically conductive layer or RDL 344 formed over insulating layer 342 using a patterning and metal deposition process such as sputtering, electrolytic plating, and electroless plating. Conductive layer 344 can be one or more layers of Al, Ti, TiW, Cu, Sn, Ni, Au, Ag, or other suitable electrically conductive material. One portion of conductive layer 344 is electrically connected to contact pads 132 of semiconductor die 124. Another portion of conductive layer 344 is electrically connected to conductive pads 282 of PWB units 288a-288b. Other portions of conductive layer 344 can be electrically common or electrically isolated depending on the design and function of semiconductor die 124.

An insulating or passivation layer 346 is formed over insulating layer 342 and conductive layer 344 using PVD, CVD, printing, slit coating, spin coating, spray coating, injection coating, lamination, sintering, or thermal oxidation. The insulating layer 346 contains one or more layers of SiO2, Si3N4, SiON, Ta2O5, Al2O3, polymer dielectric resist with or without fillers or fibers, or other material having similar structural and insulating properties. A portion of insulating layer 346 can be removed by an exposure or development process, LDA, etching, or other suitable process to expose conductive layer 344.

An electrically conductive layer or RDL 348 formed over conductive layer 344 and insulating layer 346 using a patterning and metal deposition process such as sputtering, electrolytic plating, and electroless plating. Conductive layer 348 can be one or more layers of Al, Ti, TiW, Cu, Sn, Ni, Au, Ag, or other suitable electrically conductive material. One portion of conductive layer 348 is electrically connected to conductive layer 344. Other portions of conductive layer 348 can be electrically common or electrically isolated depending on the design and function of semiconductor die 124.

An insulating or passivation layer 350 is formed over insulating layer 346 and conductive layer 348 using PVD, CVD, printing, slit coating, spin coating, spray coating, injection coating, lamination, sintering, or thermal oxidation. The insulating layer 350 contains one or more layers of SiO2, Si3N4, SiON, Ta2O5, Al2O3, polymer dielectric resist with or without fillers or fibers, or other material having similar structural and insulating properties. A portion of insulating layer 350 can be removed by an exposure or development process, LDA, etching, or other suitable process to expose conductive layer 348.

The number of insulating and conductive layers included within build-up interconnect structure 340 depends on, and varies with, the complexity of the circuit routing design. Accordingly, build-up interconnect structure 340 can include any number of insulating and conductive layers to facilitate electrical interconnect with respect to semiconductor die 124.

An electrically conductive bump material is deposited over build-up interconnect structure 340 and electrically connected to the exposed portion of conductive layer 348 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 348 using a suitable attachment or bonding process. In one embodiment, the bump material is reflowed by heating the material above its melting point to form spherical balls or bumps 352. In some applications, bumps 352 are reflowed a second time to improve electrical contact to conductive layer 348. A UBM can be formed under bumps 352. Bumps 352 can also be compression bonded to conductive layer 348. Bumps 352 represent one type of interconnect structure that can be formed over conductive layer 348. The interconnect structure can also use stud bump, micro bump, or other electrical interconnect.

Figure 19F:
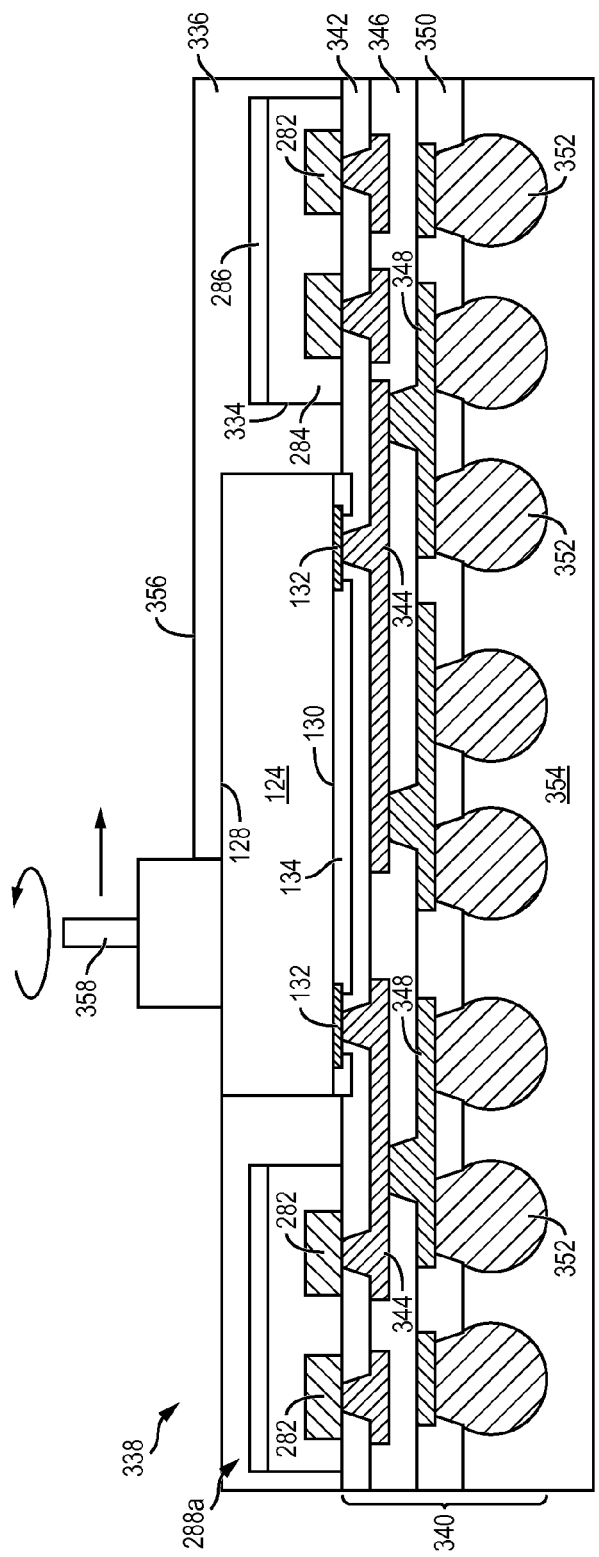

In FIG. 19f, back grinding tape 354 is applied over build-up interconnect structure 340 using lamination or other suitable application process. Back grinding tape 354 contacts insulating layer 350 and bumps 352 of build-up interconnect structure 340. Back grinding tape 354 follows the contours of a surface of bumps 352. Back grinding tape 354 includes tapes with thermal resistance up to 270° C. Back grinding tape 354 also includes tapes with a thermal release function. Examples of back grinding tape 354 include UV tape HT 440 and non-UV tape MY-595. Back grinding tape 354 provides structural support for subsequent back grinding and removal of a portion of encapsulant 336 from a backside surface 356 of encapsulant 336, opposite build-up interconnect structure 340.

Backside surface 356 of encapsulant 336 undergoes a grinding operation with grinder 358 to planarize and reduce a thickness of encapsulant 336 and semiconductor die 124. The grinding operation removes a portion of encapsulant material down to back surface 128 of semiconductor die 124. A chemical etch can also be used to planarize and remove a portion of encapsulant 336 and semiconductor die 124. A chemical etch, CMP, or plasma dry etch can also be used to remove back grinding damage and residue stress on semiconductor die 124 and encapsulant 336 to enhance the package strength. In one embodiment, insulating layer 286 and encapsulant 284 together are thinner than semiconductor die 124 and encapsulant 336 remains over insulating layer 286 after back grinding. In an alternative embodiment, insulating layer 286 and encapsulant 284 together are selected to be the same thickness as a thickness of semiconductor die 124 after back grinding.

Figure 19G:
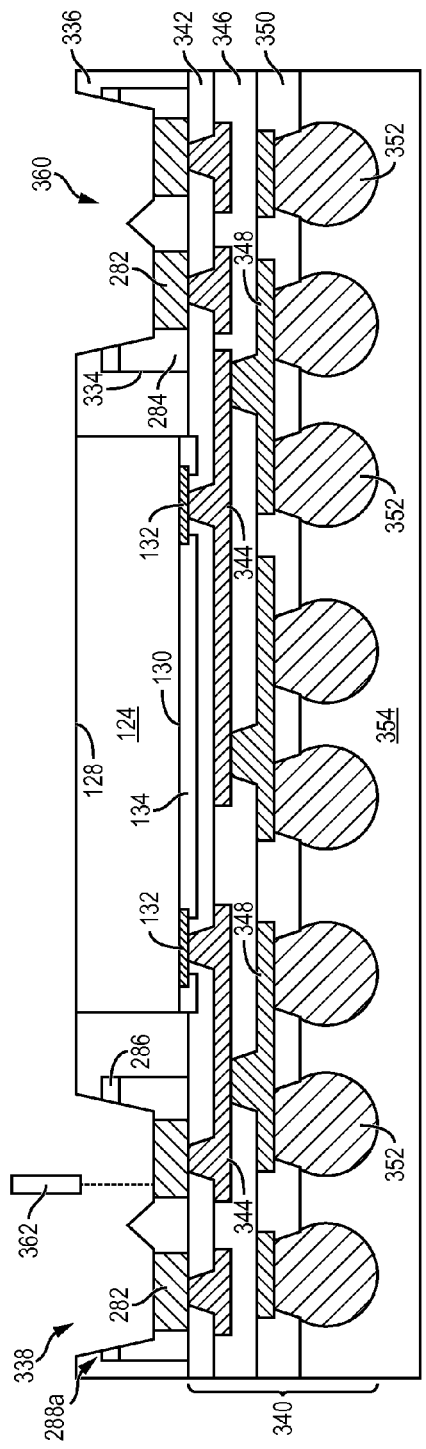

In FIG. 19g, a portion of encapsulant 336 is removed from over PCB units 288a-288b to form openings 360. A portion of insulating layer 286 and encapsulant 284 of PCB units 288a-288b is removed to expose portions of conductive pads 282. Openings 360 include a vertical or sloped sidewall and extend from a back surface of encapsulant 336 completely through encapsulant 336 and partially through PCB units 288a-288b. Openings 360 extend completely through insulating layer 286 and encapsulant 284 over conductive pads 282. Openings 360 are formed by drilling, LDA using laser 362, high energy water jetting, etching, or other suitable process. After forming openings 360, openings 360 undergo a desmearing or cleaning process. Openings 360 are formed and subsequently cleaned while back grinding or supporting tape 354 is attached over interconnect structure 340. By forming openings 360 through encapsulant 336 and PCB units 288a-288b in a peripheral region of semiconductor die 124, a portion of conductive pads 282 is exposed from a backside of encapsulant 336. Openings 360 are configured to provide subsequent 3D electrical interconnect for semiconductor die 124. In one embodiment, a finish such as Cu OSP can be applied to exposed conductive pads 282 to prevent Cu oxidation. In an alternative embodiment, solder paste is printed on the surface of conductive pads 282 and reflowed to form a solder cap and protect the surface of conductive pads 282.

Figure 19H:
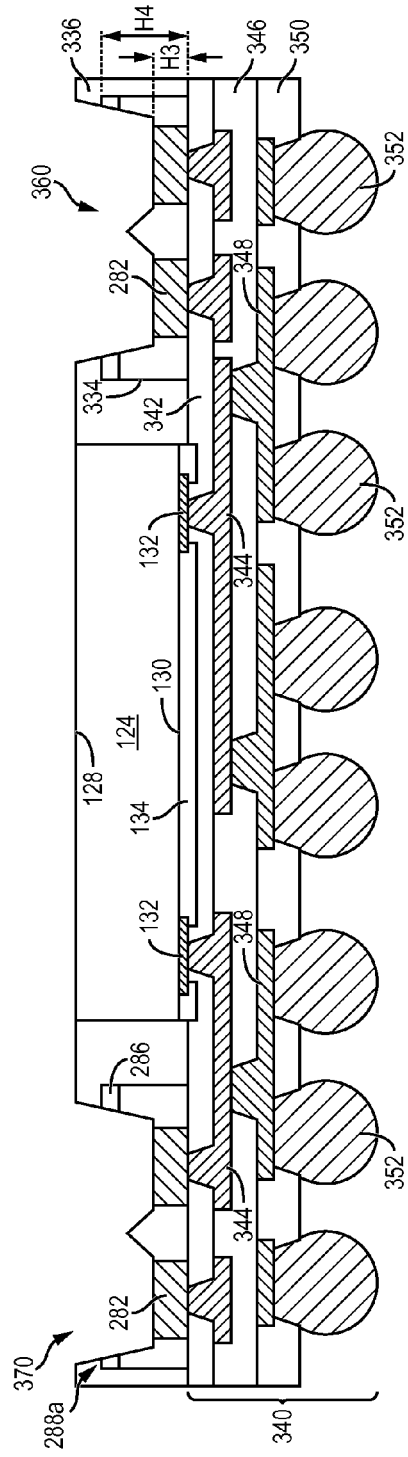

FIG. 19h shows a low profile 3D Fo-PoP semiconductor device including a dual encapsulant and support layer. Back-grinding tape 354 is removed after openings 360 are formed. Bumps may be formed over conductive pads 282. In one embodiment, a finish such as Cu OSP is be applied to exposed conductive pads 282 to prevent Cu oxidation. In an alternative embodiment, solder paste is printed on a surface of conductive pads 282 and reflowed to form a solder cap and protect the surface of conductive pads 282. Reconstituted wafer 338 is singulated using a saw blade or laser cutting tool to form Fo-PoP 370.

Fo-PoP 370 provides 3D electrical interconnection with a fan-out, embedded PCB with vertical interconnects formed outside a footprint of semiconductor die 124. Conductive pads or pillars 282 form vertical interconnects and electrically connect to interconnect structure 340. Accordingly, a 3D interconnection for next level interconnection is formed through conductive pads 282, build-up interconnect structure 340, and semiconductor die 124. The 3D interconnection provides horizontal and vertical electrical interconnection for semiconductor die 124 without a backside interconnect or RDL over a footprint of semiconductor die 124. Fo-PoP 370 includes fine pitch interconnections, where a pitch between conductive pads 282 is 0.50 mm or less. In one embodiment, conductive pads 282 have a height H3 of at least 20 μm and less than 100 μm. In another embodiment, the height H3 of conductive pads 282 is at least one half the height of semiconductor die 124. In one embodiment, insulating layer 286 and encapsulant 284 together have a height H4 of at least 30 μm. In another embodiment, insulating layer 286 and encapsulant 284 together have a height H4 of at least one and a half times height H3 of conductive pad 282. In yet another embodiment, insulating layer 286 and encapsulant 284 together have a height which is equal to the height of semiconductor die 124. The smaller package profile of Fo-PoP 370 improves the thermal performance, electrical performance, and warpage behavior of the semiconductor device by creating a thin, 3D PoP device.

Figure 20:
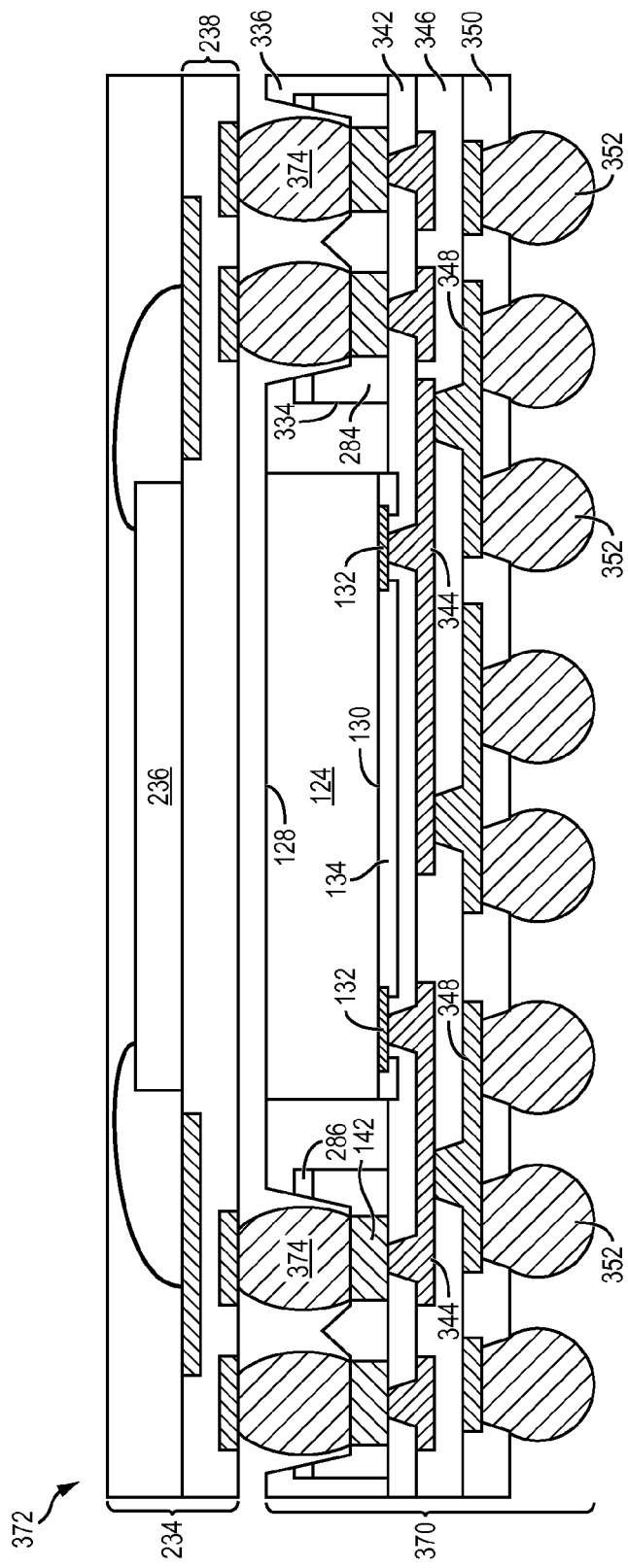
FIG. 20 illustrates another stacked 3D Fo-PoP with an embedded substrate and vertical interconnections.

FIG. 20 shows a stacked 3D Fo-PoP with an embedded substrate and vertical interconnections. Stacked semiconductor device 372 includes semiconductor device 234 stacked over Fo-PoP 370. Semiconductor device 234 includes semiconductor die 236 mounted over interposer 238. In one embodiment, bumps of semiconductor device 234 are mounted over bumps forming in openings 360 of Fo-PoP 370 and are reflowed to merge and form bump 374 and to electrically connect semiconductor device 234 to Fo-PoP 370.

Figure 21A:
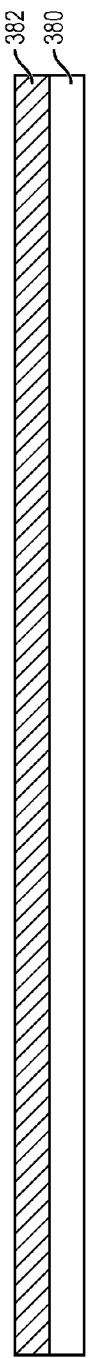
FIGS. 21a-21n illustrate another process of forming a 3D Fo-PoP with an embedded substrate and vertical interconnections.
Figure 21B:
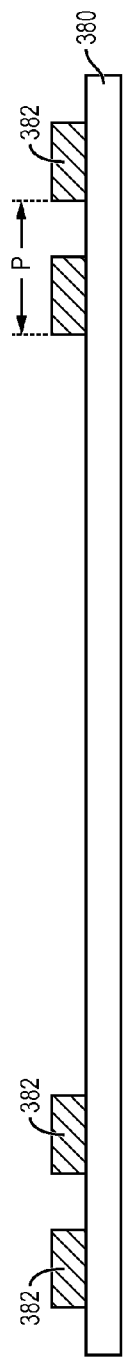
Figure 21C:
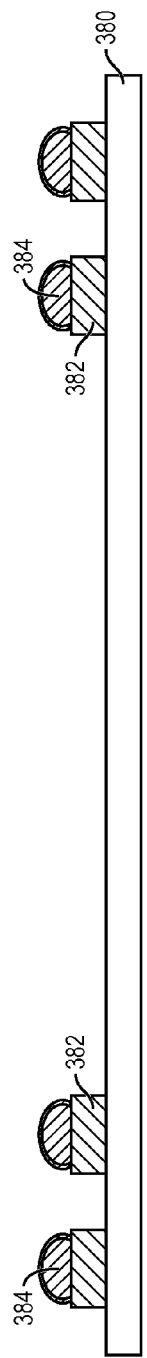
Figure 21D:
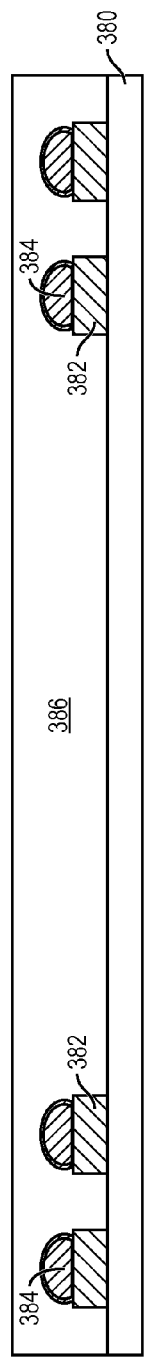
Figure 21J:
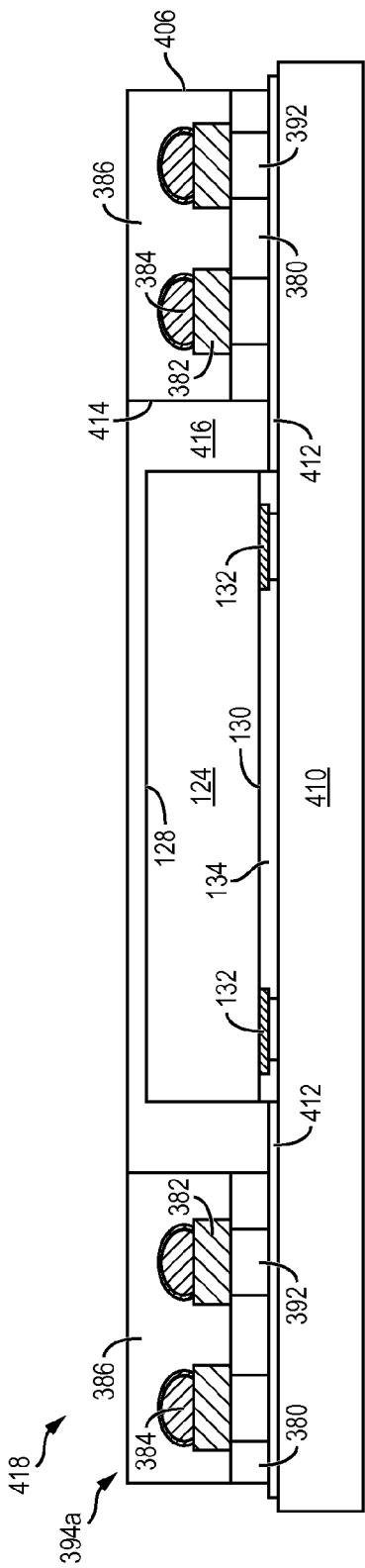
Figure 21K:
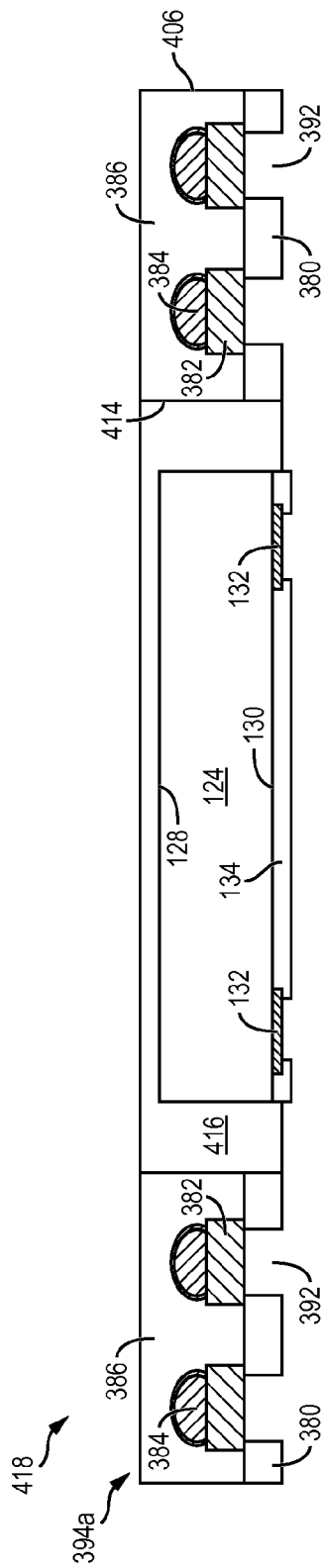
Figure 21L:
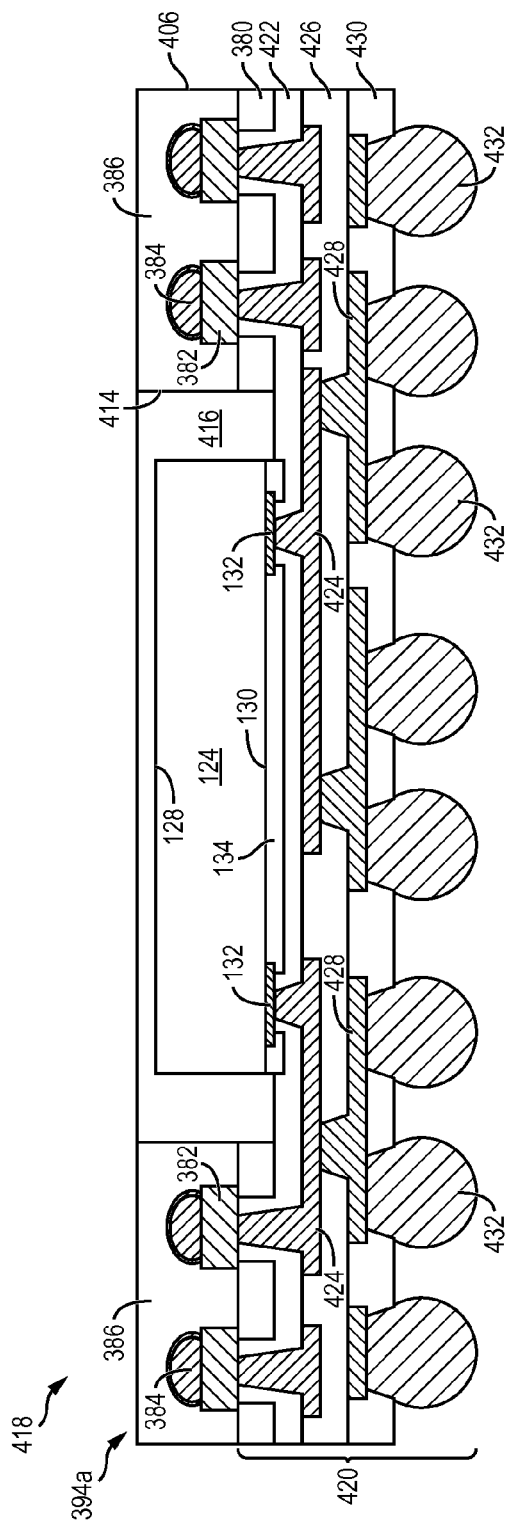
Figure 21M:
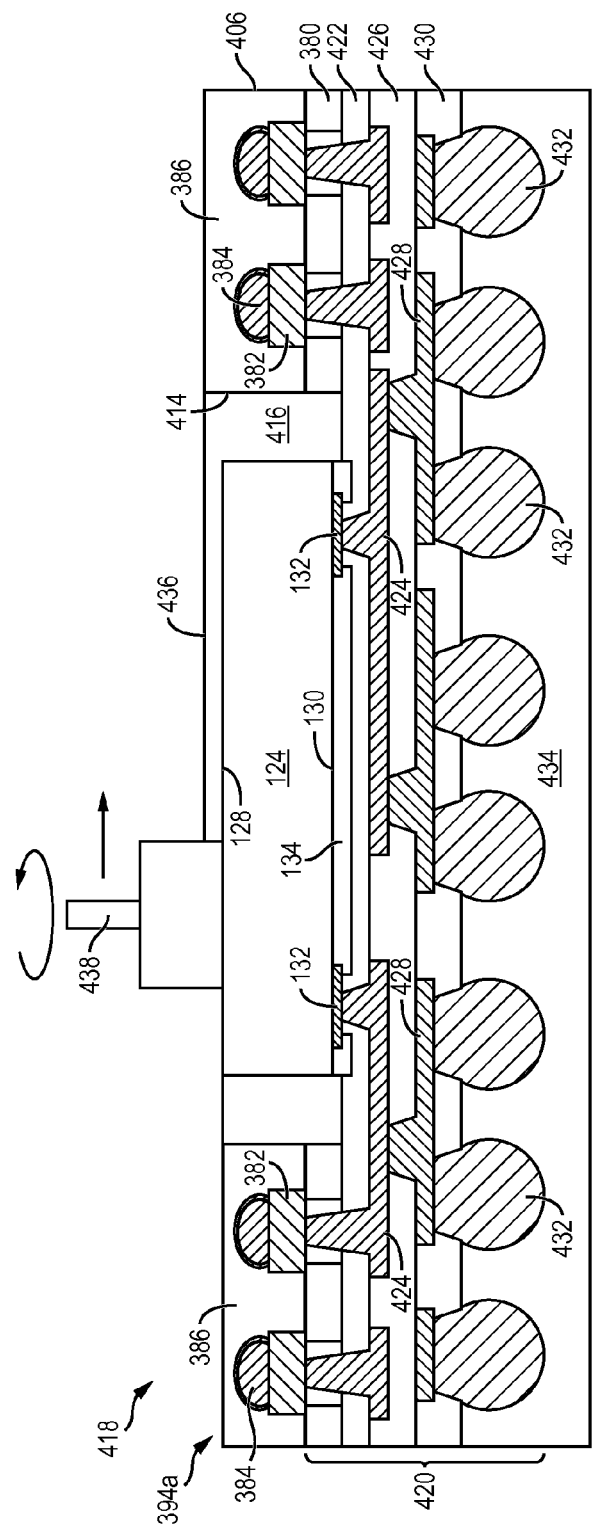
Figure 21N:
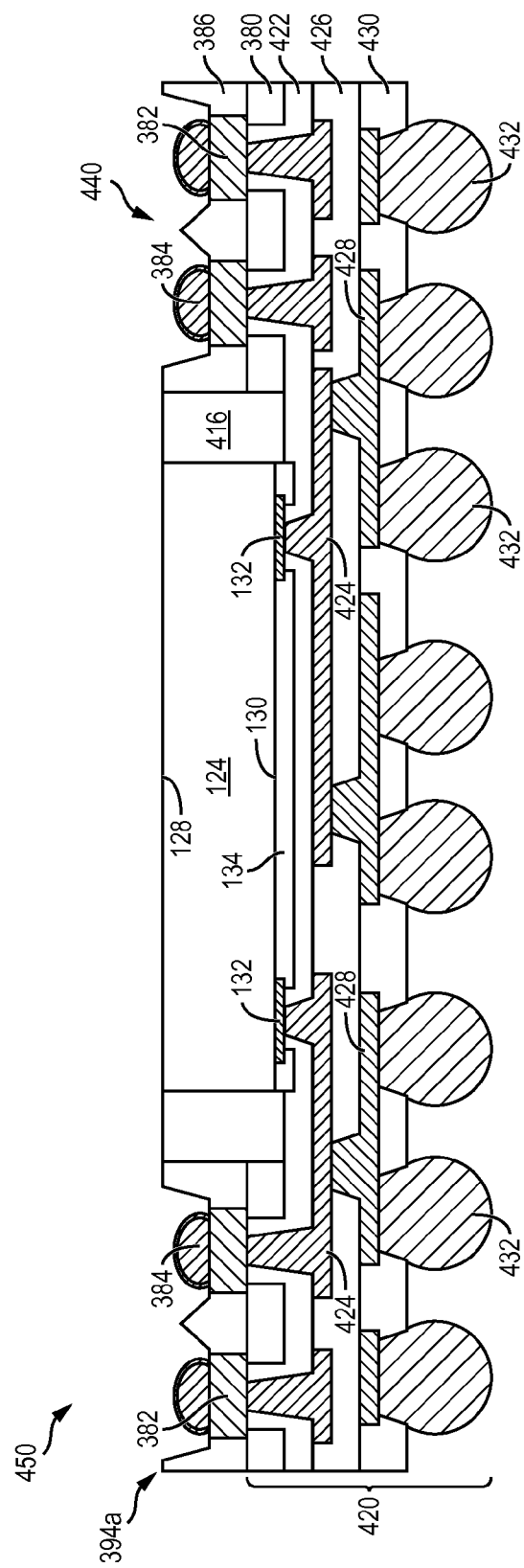

FIGS. 21a-21n illustrate, in relation to FIGS. 1 and 2a-2c, an alternative process of forming a 3D Fo-PoP with an embedded substrate and vertical interconnections. In FIG. 21a, an insulating or passivation layer 380 includes one or more laminated layers of prepreg, FR-4, FR-1, CEM-1, or CEM-3, or other material having similar insulating and structural properties. Insulating layer 380 further includes an epoxy, resin, or polymer with a reinforcement fiber or fabric, such as phenolic cotton paper, epoxy, resin, woven glass, matte glass, polyester, and other reinforcement fibers or fabrics. In an alternative embodiment, insulating layer 380 contains a molding compound, polymer dielectric with or without fillers, one or more layers of $SiO_2$, $Si_3N_4$, SiON, $Ta_2O_5$, $Al_2O_3$, or other material having similar insulating and structural properties. In one embodiment, insulating layer 380 is a prepreg sheet, roll, or tape including a polymer matrix enhanced with woven glass fiber and deposited using vacuum or pressure lamination with or without heat. The material selected for insulating layer 380, such as prepreg, enhances the overall strength of the semiconductor package and improves package warpage, particularly at temperatures of 150° C. to 260° C.

An electrically conductive layer 382 is formed over insulating layer 380 using a metal deposition process such as Cu foil lamination, printing, PVD, CVD, sputtering, electrolytic plating, and electroless plating. Conductive layer 382 can be one or more layers of Cu, Sn, Ni, Au, Ag, Ti, W, or other suitable electrically conductive material. In one embodiment, conductive layer 382 is Cu foil or Cu film.

In FIG. 21b, conductive layer 382 is patterned to form conductive pads or pillars. In one embodiment, conductive layer 382 is Cu and is formed using an etch-back process. Conductive layer 382 has a height of at least 20 μm. In one embodiment, conductive layer 382 has a height of 100 μm or less. A pitch P of conductive pads formed from conductive layer 382 is 0.50 mm or less. Conductive layer 382 may include patterned circuit components formed over insulating layer 380.

In FIG. 21c, an electrically conductive bump material is deposited over conductive layer 382 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 382 using a suitable attachment or bonding process. In one embodiment, the bump material is reflowed by heating the material above its melting point to form spherical balls or bumps 384. In some applications, bumps 384 are reflowed a second time to improve electrical contact to conductive layer 382. A UBM can be formed under bumps 384. Bumps 384 can also be compression bonded to conductive layer 382. Bumps 384 represent one type of interconnect structure that can be formed over conductive layer 382. The interconnect structure can also use stud bump, micro bump, or other electrical interconnect.

In FIG. 21d, an encapsulant, molding compound, or insulating layer 386 is deposited over conductive layer 382, bumps 384, and insulating layer 380 using a paste printing, compressive molding, transfer molding, liquid encapsulant molding, vacuum lamination, spin coating, or other suitable applicator. Encapsulant 386 can be polymer composite material, such as epoxy resin with filler, epoxy acrylate with filler, or polymer with proper filler. In one embodiment, encapsulant 386 includes a material selected to have a CTE similar to a CTE of Cu, i.e., within 10 ppm/° C. of the CTE of Cu.

In FIG. 21e, a portion of insulating layer 380 is removed by an exposure or development process, LDA using laser 390, etching, or other suitable process to form openings 392 over conductive layer 382. Insulating layer 380, encapsulant 386, conductive layer 382, and bumps 384 together constitute PCB panel 394.

In FIG. 21f, a portion of PCB panel 394 is removed by punching, stamping, water jet cutting, mechanical drilling or cutting, LDA using laser 396, etching, or other suitable process to form openings 400. PCB panel 394 forms a pre-prepared fiber enhanced composite sheet that includes openings 400. Openings 400 are formed centrally with respect to conductive layer 382. Openings 400 are formed completely through insulating layer 286 of PCB panel 394 and extend from a first surface 402 of the PCB panel 394 to a second surface 404 of PCB panel 394 opposite the first surface. Openings 400 are square, rectangular, circular, oval, polygon, or any other shape. A size of openings 400 provides a space for subsequently mounting semiconductor die. In one embodiment, openings 400 have a generally square footprint and are formed large enough to accommodate semiconductor die or components 124 from FIG. 3c. Additionally, PCB panel 394 is separated into individual PCB units 394a along edge 406 by a similar process used to form openings 400, such as punching, stamping, water jet cutting, mechanical sawing or cutting, LDA using laser 396, etching, or other suitable process. PCB panel 394 may be separated into individual PCB units 394a in the same process step as forming openings 400. For example, in a punching or stamping process, PCB panel 394 is separated into individual PCB units 394a, while simultaneously, openings 400 are formed. In another embodiment, PCB units formed from PCB panel 394 do not include opening 400, rather, PCB units are configured in a shape appropriate for placement around the sides of semiconductor die 124 from FIG. 3c or to provide an area for placement of semiconductor die 124. PCB units may including an include interlocking footprints having square and rectangular shapes, a cross-shape (+), an angled or "L-shape," a circular or oval shape, a hexagonal shape, an octagonal shape, a star shape, or any other geometric shape.

In FIG. 21g, PCB panel 394 having individual PCB units 394a is aligned with and laminated on temporary carrier 410 and interface layer 412. Temporary carrier or substrate 410 contains temporary or sacrificial base material such as silicon, steel, germanium, gallium arsenide, indium phosphide, silicon carbide, resin, beryllium oxide, glass, or other suitable low-cost, rigid material for structural support. An interface layer or double-sided tape 412 is formed over carrier 410 as a temporary adhesive bonding film, etch-stop layer, or release layer. Alternatively, individual PCB units 394a are mounted and laminated temporary carrier 410 and interface layer 412 using a pick and place operation. Prior to laminating PCB units 394a to carrier 410, alignment or dummy semiconductor die can be placed on the carrier 410 and interface layer 412. In one embodiment, PCB units 394a are held by a transparent vacuum chuck for alignment before placing PCB units 394a on carrier 410 and laminating.

In FIG. 21h, semiconductor die 124 from FIG. 3c are mounted to interface layer 412 and carrier 410 using a pick and place operation with active surface 130 oriented toward the carrier. In one embodiment, semiconductor die 124 is a flipchip type device. In another embodiment, semiconductor die 124 may be a semiconductor package, such as a Fo-WLCSP without bumps, bond wire package, flipchip LGA, flipchip BGA without bumps, or QFN package. FIG. 21i shows semiconductor die 124 are pressed into interface layer 412 such that insulating layer 134 is disposed into the interface layer. The clearance or distance between the inner edge 414 of insulating layer 380 and encapsulant 386 of PCB units 394a and semiconductor die 124 is at least 25 μm.

In FIG. 21j, an encapsulant or molding compound 416 is deposited over semiconductor die 124, PCB units 394a, temporary carrier 410, and interface layer 412 using a paste printing, compressive molding, transfer molding, liquid encapsulant molding, vacuum lamination, spin coating, or other suitable applicator. Encapsulant 416 can be polymer composite material, such as epoxy resin with filler, epoxy acrylate with filler, or polymer with proper filler. Encapsulant 416 is non-conductive and environmentally protects the semiconductor device from external elements and contaminants. Prior to depositing encapsulant, the structure may undergo a high pressure annealing process. Encapsulant 416 and embedded semiconductor die 124 and PCB units 394a form a fan-out composite substrate or reconstituted wafer 418. Alternatively, encapsulant 416 is formed over semiconductor die 124 and around PCB units 394a such that encapsulant 416 is coplanar with encapsulant 386 of PCB units 394a.

In FIG. 21k, carrier 410 and interface layer 412 are removed by chemical etching, mechanical peeling, CMP, mechanical grinding, thermal bake, UV light, laser scanning, or wet stripping to facilitate the formation of an interconnect structure over active surface 130 of semiconductor die 124, PCB units 394a, and encapsulant 416. In an alternative embodiment, openings 392 are formed by LDA or other suitable process after encapsulant 416 is deposited and carrier 410 and interface layer 412 are removed.

In FIG. 21l, a build-up interconnect structure 420 is formed over semiconductor die 124, PCB units 394a, and encapsulant 416. An insulating or passivation layer 422 is formed over semiconductor die 124, PCB units 394a, and encapsulant 416 using PVD, CVD, printing, slit coating, spin coating, spray coating, injection coating, lamination, sintering or thermal oxidation. The insulating layer 422 contains one or more layers of SiO2, Si3N4, SiON, Ta2O5, Al2O3, polymer dielectric resist with or without fillers or fibers, or other material having similar structural and insulating properties. A portion of insulating layer 422 is removed by an exposure or development process, LDA, etching, or other suitable process to form openings over conductive layer 382 of PCB units 394a and over conductive layer 132 of semiconductor die 124.

An electrically conductive layer or RDL 424 formed over insulating layer 422 using a patterning and metal deposition process such as sputtering, electrolytic plating, and electroless plating. Conductive layer 424 can be one or more layers of Al, Ti, TiW, Cu, Sn, Ni, Au, Ag, or other suitable electrically conductive material. One portion of conductive layer 424 is electrically connected to contact pads 132 of semiconductor die 124. Another portion of conductive layer 424 is electrically connected to conductive layer 382 of PWB units 394a. Other portions of conductive layer 424 can be electrically common or electrically isolated depending on the design and function of semiconductor die 124.

An insulating or passivation layer 426 is formed over insulating layer 422 and conductive layer 424 using PVD, CVD, printing, slit coating, spin coating, spray coating, injection coating, lamination, sintering or thermal oxidation. The insulating layer 426 contains one or more layers of SiO2, Si3N4, SiON, Ta2O5, Al2O3, polymer dielectric resist with or without fillers or fibers, or other material having similar structural and insulating properties. A portion of insulating layer 426 can be removed by an exposure or development process, LDA, etching, or other suitable process to expose conductive layer 424.

An electrically conductive layer or RDL 428 formed over conductive layer 424 and insulating layer 426 using a patterning and metal deposition process such as sputtering, electrolytic plating, and electroless plating. Conductive layer 428 can be one or more layers of Al, Ti, TiW, Cu, Sn, Ni, Au, Ag, or other suitable electrically conductive material. One portion of conductive layer 428 is electrically connected to conductive layer 424. Other portions of conductive layer 428 can be electrically common or electrically isolated depending on the design and function of semiconductor die 124.

An insulating or passivation layer 430 is formed over insulating layer 426 and conductive layer 428 using PVD, CVD, printing, slit coating, spin coating, spray coating, injection coating, lamination, sintering or thermal oxidation. The insulating layer 430 contains one or more layers of SiO2, Si3N4, SiON, Ta2O5, Al2O3, polymer dielectric resist with or without fillers or fibers, or other material having similar structural and insulating properties. A portion of insulating layer 430 can be removed by an exposure or development process, LDA, etching, or other suitable process to expose conductive layer 428.

The number of insulating and conductive layers included within build-up interconnect structure 420 depends on, and varies with, the complexity of the circuit routing design. Accordingly, build-up interconnect structure 420 can include any number of insulating and conductive layers to facilitate electrical interconnect with respect to semiconductor die 124.

An electrically conductive bump material is deposited over build-up interconnect structure 420 and electrically connected to the exposed portion of conductive layer 428 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 428 using a suitable attachment or bonding process. In one embodiment, the bump material is reflowed by heating the material above its melting point to form spherical balls or bumps 432. In some applications, bumps 432 are reflowed a second time to improve electrical contact to conductive layer 428. A UBM can be formed under bumps 432. Bumps 432 can also be compression bonded to conductive layer 428. Bumps 432 represent one type of interconnect structure that can be formed over conductive layer 428. The interconnect structure can also use stud bump, micro bump, or other electrical interconnect.

In FIG. 21m, back grinding tape 434 is applied over build-up interconnect structure 420 using lamination or other suitable application process. Back grinding tape 434 contacts insulating layer 430 and bumps 432 of build-up interconnect structure 420. Back grinding tape 434 follows the contours of a surface of bumps 432. Back grinding tape 434 includes tapes with thermal resistance up to 270° C. Back grinding tape 434 also includes tapes with a thermal release function. Examples of back grinding tape 434 include UV tape HT 440 and non-UV tape MY-595. Back grinding tape 434 provides structural support for subsequent back grinding and removal of a portion of encapsulant 416 from a backside surface 436 of encapsulant 416, opposite build-up interconnect structure 420.

Backside surface 436 of encapsulant 416 undergoes a grinding operation with grinder 438 to planarize and reduce a thickness of encapsulant 416, encapsulant 386, and semiconductor die 124. The grinding operation removes a portion of encapsulant material down to back surface 128 of semiconductor die 124. A chemical etch can also be used to planarize and remove a portion of encapsulant 416 and semiconductor die 124. A chemical etch, CMP, or plasma dry etch can also be used to remove back grinding damage and residue stress on semiconductor die 124 and encapsulant 416 to enhance the package strength. In one embodiment, insulating layer 380 and encapsulant 386 together are thinner than semiconductor die 124 and encapsulant 416 remains over encapsulant 386 after back grinding. In an alternative embodiment, insulating layer 380 and encapsulant 386 together are the same thickness as the thickness of semiconductor die 124 after back grinding.

In FIG. 21n, a portion of encapsulant 386 is removed from PCB units 394a to form openings 440 to expose bumps 384. Openings 440 include a vertical or sloped sidewall and extend from a back surface of encapsulant 386 and partially through PCB units 394a to expose bumps 384. Openings 440 are formed by drilling, LDA, high energy water jetting, etching, or other suitable process. After forming openings 440, openings 440 undergo a desmearing or cleaning process. Openings 440 are formed and subsequently cleaned while back grinding or supporting tape 434 is attached over interconnect structure 420. By forming openings 440 partially through PCB units 394a in a peripheral region of semiconductor die 124, bumps 384 are exposed from a backside of PCB units 394a. Backgrinding tape 434 is removed after openings 440 are formed.

Reconstituted wafer 418 is singulated using a saw blade or laser cutting tool to form Fo-PoP 450. Fo-PoP 450 provides 3D electrical interconnection with a fan-out, embedded PCB with vertical interconnects formed outside a footprint of semiconductor die 124. Conductive layer 382 and bumps 384 form vertical interconnects and electrically connect to interconnect structure 420. Accordingly, a 3D interconnection for next level interconnection is formed through bumps 384, conductive layer 382, build-up interconnect structure 420, and semiconductor die 124. The 3D interconnection provides horizontal and vertical electrical interconnection for semiconductor die 124 without a backside interconnect or RDL over a footprint of semiconductor die 124. Fo-PoP 450 includes fine pitch interconnections, where a pitch between bumps 384 is 0.50 mm or less. In one embodiment, conductive pads 382 have a height of at least 20 μm and less than 100 μm. In another embodiment, the height of conductive pads 382 is at least one half the height of semiconductor die 124. In one embodiment, insulating layer 380 and encapsulant 386 together have a height of at least 30 μm. In another embodiment, insulating layer 380 and encapsulant 386 together have a height of at least one and a half times height of conductive pads 382. In yet another embodiment, insulating layer 380 and encapsulant 386 together have a height which is equal to the height of semiconductor die 124. The smaller package profile of Fo-PoP 450 improves the thermal performance, electrical performance, and warpage behavior of the semiconductor device by creating a thin, 3D PoP device.

Figure 22A:
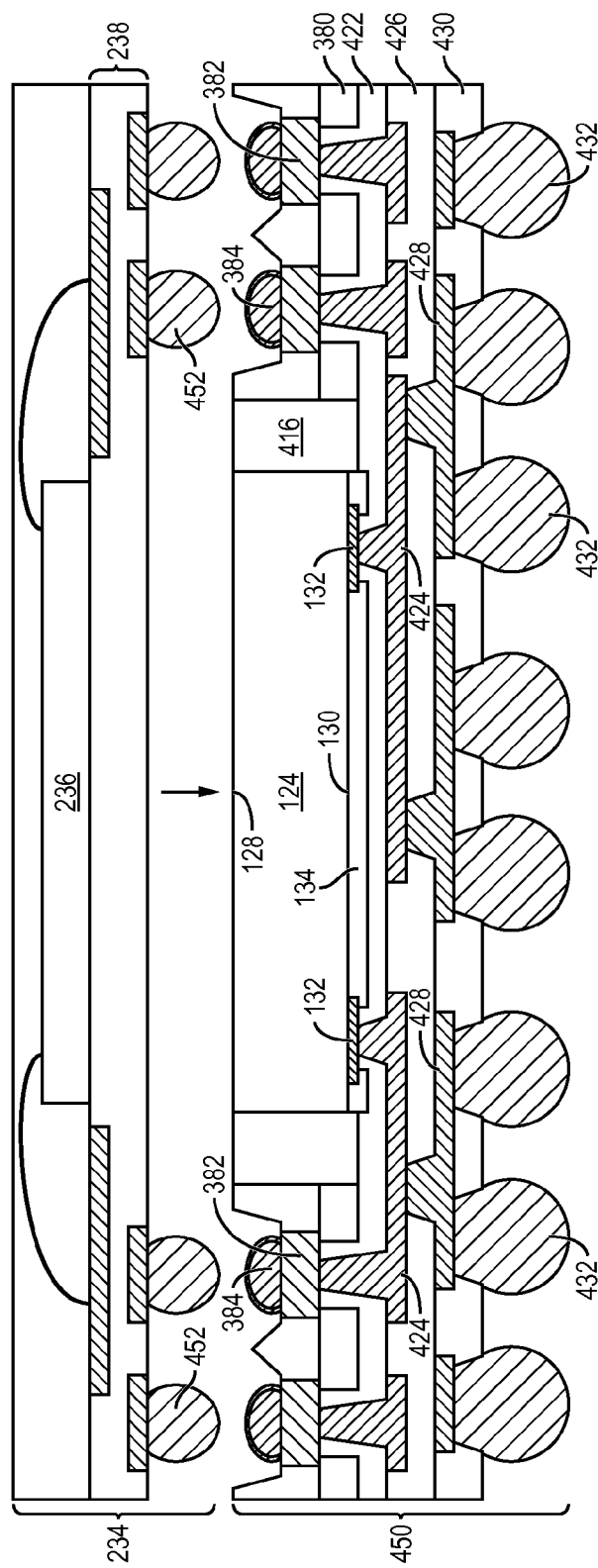
FIGS. 22a-22b illustrate a process of forming a stacked 3D Fo-PoP with an embedded substrate and vertical interconnections.
Figure 22B:
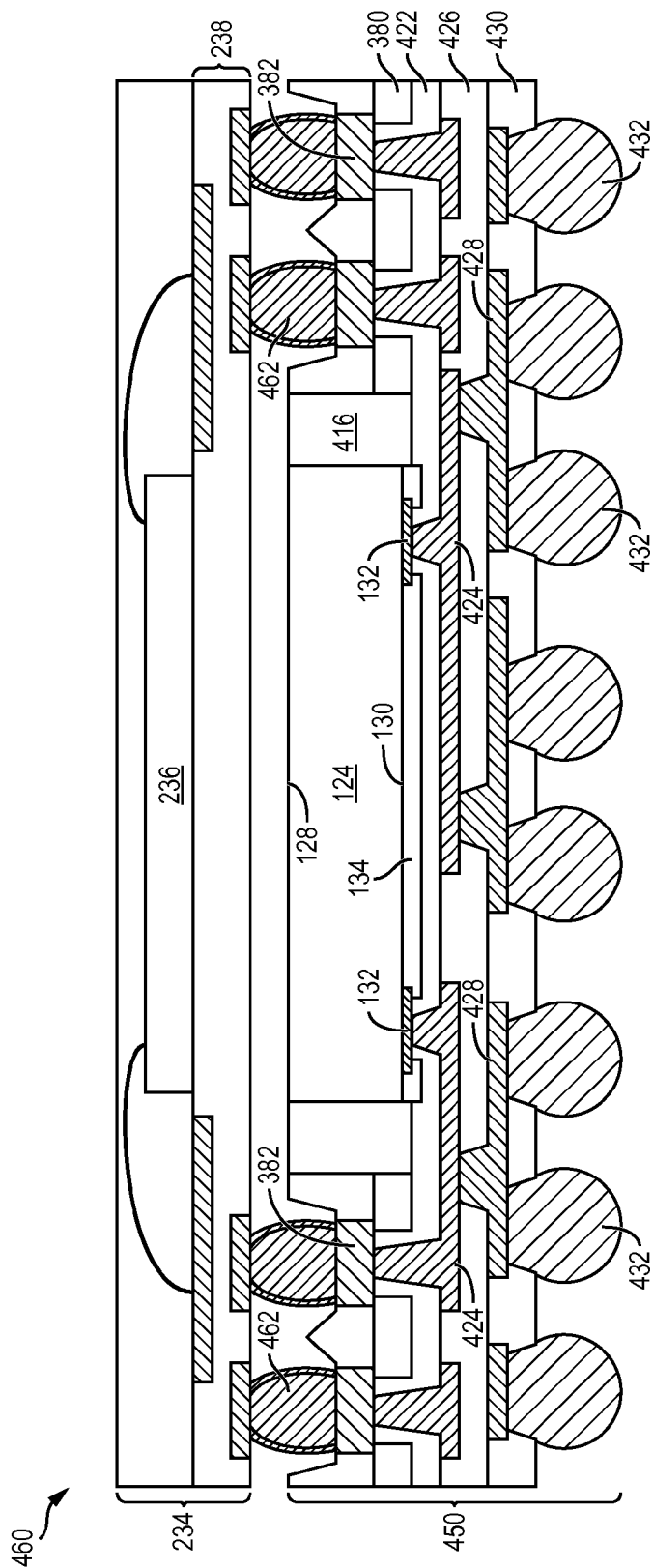

FIGS. 22a-22b show a process of forming a stacked 3D Fo-PoP with an embedded substrate and vertical interconnections. In FIG. 22a, semiconductor device 234 includes semiconductor die 236 mounted over interposer 238 with bumps 452 disposed on interposer 238. Semiconductor device 234 is mounted over Fo-PoP 450.

FIG. 22b shows stacked semiconductor device 460 includes semiconductor device 234 stacked over Fo-PoP 450. In one embodiment, bumps 452 of semiconductor device 234 are mounted over bumps 384 of Fo-PoP 450 and are reflowed to merge and form bumps 462 and to electrically connect semiconductor device 234 to Fo-PoP 450. Fo-PoP 450 provides 3D electrical interconnection with a fan-out, embedded PCB with vertical interconnects formed outside a footprint of semiconductor die 124. Conductive layer 382 and bumps 384 form vertical interconnects and electrically connect to interconnect structure 420 and semiconductor die 124 to semiconductor device 234.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a substrate including a first insulating layer and a conductive layer embedded in the first insulating layer and a first opening extending completely through the substrate;
   disposing a first semiconductor die within the first opening of the substrate;
   depositing an encapsulant over the first semiconductor die and substrate; and
   forming a second opening through the encapsulant and substrate extending to the conductive layer.

2. The method of claim 1, further including forming an interconnect structure over the first semiconductor die and substrate.

3. The method of claim 1, further including forming a bump within the second opening over the conductive layer.

4. The method of claim 1, further including removing a portion of the first semiconductor die and encapsulant.

5. The method of claim 1, wherein providing the substrate further includes:
   forming a bump over the conductive layer; and
   forming the first insulating layer over the conductive layer and the bump.

6. The method of claim 1, further including disposing a second semiconductor die over the first semiconductor die.

7. A method of making a semiconductor device, comprising:
   providing a substrate including a first insulating layer and a conductive layer;
   forming a first opening through the substrate;
   disposing a first semiconductor die within the first opening of the substrate; and
   forming a second opening partially through the substrate extending to the conductive layer.

8. The method of claim 7, further including forming an interconnect structure over the first semiconductor die and substrate.

9. The method of claim 7, further including:
   depositing an encapsulant over the first semiconductor die and substrate; and
   forming the second opening through the encapsulant and substrate extending to the conductive layer.

10. The method of claim 7, further including forming a bump within the second opening over the conductive layer.

11. The method of claim 7, further including forming the first opening or second opening by stamping or laser direct ablation.

12. A semiconductor device, comprising:
   a substrate including a first opening extending through the substrate;
   a first semiconductor die disposed in the first opening of the substrate;
   an encapsulant deposited over the first semiconductor die and substrate; and
   a second opening formed through the encapsulant and partially through the substrate.

13. The semiconductor device of claim 12, wherein the substrate further includes:
   an insulating layer; and
   a conductive layer embedded within the insulating layer.

14. The semiconductor device of claim 13, wherein the conductive layer includes conductive pads or pillars having a pitch of 0.50 millimeters or less.

15. The semiconductor device of claim 12, further including an interconnect structure formed over the first semiconductor die and substrate.

16. The semiconductor device of claim 12, further including a bump formed in the second opening.

17. A semiconductor device, comprising:
   a substrate including a first insulating layer and a conductive layer, wherein a first surface of the conductive layer and a second surface of the conductive layer opposite the first surface are devoid of the first insulating layer and a height of the conductive layer is less than a height of the first insulating layer; and
   a first semiconductor die disposed adjacent to the substrate.

18. The semiconductor device of claim 17, further including an interconnect structure formed over the first semiconductor die and substrate.

19. The semiconductor device of claim 17, further including a bump formed in the second opening over the conductive layer.

20. The semiconductor device of claim 17, further including an encapsulant deposited over the first semiconductor die and substrate.

21. The semiconductor device of claim 17, further including a second semiconductor die disposed over the first semiconductor die.

22. The semiconductor device of claim 20, wherein the second opening extends through the encapsulant and partially through the substrate.

23. The semiconductor device of claim 17, further including a heat sink disposed over the first semiconductor die.

24. The semiconductor device of claim 17, further including a second insulating layer formed over the first insulating layer.

25. The method of claim 1, further including forming the first opening or second opening by stamping or laser direct ablation.

26. The method of claim 1, further including forming a second insulating layer over the first insulating layer.

27. The method of claim 7, further including forming a second insulating layer over the first insulating layer.

28. The method of claim 7, further including disposing a second semiconductor die over the first semiconductor die.

29. The semiconductor device of claim 12, further including a second semiconductor die disposed over the first semiconductor die.

30. A method of making a semiconductor device, comprising:
   providing a plurality of substrate units each including an insulating layer and a conductive layer embedded in the insulating layer;
   arranging the substrate units to form a space between the substrate units;
   disposing a first semiconductor die in the space between the substrate units; and
   forming an opening in the substrate units extending to the conductive layer.

31. The method of claim 30, further including forming an interconnect structure over the first semiconductor die and substrate units.

32. The method of claim 30, further including depositing an encapsulant over the first semiconductor die and substrate units.

33. The method of claim 32, further including forming the opening through the encapsulant and substrate units extending to the conductive layer.

34. The method of claim 30, further including forming a bump within the opening over the conductive layer.

35. The method of claim 30, further including disposing a second semiconductor die over the first semiconductor die.

* * * * *